US012185548B2

United States Patent
Chung et al.

(10) Patent No.: US 12,185,548 B2
(45) Date of Patent: Dec. 31, 2024

(54) SEMICONDUCTOR DEVICE HAVING DUMMY STRUCTURES IN A PERIPHERAL REGION AND DATA STORAGE SYSTEM INCLUDING THE SAME

(71) Applicant: Samsung Electronics Co., Ltd., Suwon-si (KR)

(72) Inventors: Giyong Chung, Seoul (KR); Jaeryong Sim, Suwon-si (KR); Kwangyoung Jung, Hwaseong-si (KR); Jeehoon Han, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 350 days.

(21) Appl. No.: 17/318,306

(22) Filed: May 12, 2021

(65) Prior Publication Data

US 2022/0102369 A1  Mar. 31, 2022

(30) Foreign Application Priority Data

Sep. 25, 2020  (KR) .......................... 10-2020-0124633

(51) Int. Cl.
*H10B 43/50*  (2023.01)
*H01L 23/535*  (2006.01)
(Continued)

(52) U.S. Cl.
CPC ........... *H10B 43/50* (2023.02); *H01L 23/535* (2013.01); *H10B 41/27* (2023.02); *H10B 41/41* (2023.02);
(Continued)

(58) Field of Classification Search
CPC ........ H10B 43/50; H10B 41/50; H10B 43/40; H10B 41/27; H10B 43/27; H10B 41/41; H10B 41/43; H01L 23/535; H01L 29/792
See application file for complete search history.

(56) References Cited

U.S. PATENT DOCUMENTS 6,253,362 B1  6/2001  Anand et al.
9,449,987 B1  9/2016  Miyata et al.
(Continued)

FOREIGN PATENT DOCUMENTS

JP  5253875 B2  7/2013
JP  2018-046167 A  3/2018
(Continued)

OTHER PUBLICATIONS

DE Office Action for corresponding German Application No. 102021119273.0 issued on Nov. 24, 2022 and English translation thereof.
(Continued)

*Primary Examiner* — Lex H Malsawma
*Assistant Examiner* — Bruce R. Smith
(74) *Attorney, Agent, or Firm* — Harness, Dickey & Pierce, P.L.C.

(57) ABSTRACT

A semiconductor device includes a memory cell region. The memory cell region includes a memory stack structure including a first stack structure and a second stack structure; a plurality of channel structures vertically penetrating through the memory stack structure and connected to the second substrate; at least one first dummy structure; and at least one second dummy structure. At least a portion of the first dummy structure does not overlap the second dummy structure in a vertical direction.

20 Claims, 34 Drawing Sheets

(51) Int. Cl.
*H10B 41/27* (2023.01)
*H10B 41/41* (2023.01)
*H10B 41/50* (2023.01)
*H10B 43/27* (2023.01)
*H10B 43/40* (2023.01)

(52) U.S. Cl.
CPC ............. *H10B 41/50* (2023.02); *H10B 43/27* (2023.02); *H10B 43/40* (2023.02)

(56) References Cited

U.S. PATENT DOCUMENTS

| | | | |
|---|---|---|---|
| 10,347,654 B1* | 7/2019 | Iwai | ........................ H10B 43/10 |
| 10,490,498 B2 | 11/2019 | Yeh et al. | |
| 10,559,592 B1 | 2/2020 | Liu et al. | |
| 10,622,369 B2 | 4/2020 | Zhou et al. | |
| 10,665,607 B1 | 5/2020 | Sugiura et al. | |
| 2009/0267135 A1 | 10/2009 | Tanaka et al. | |
| 2010/0090286 A1 | 4/2010 | Lee et al. | |
| 2012/0068255 A1 | 3/2012 | Lee et al. | |
| 2013/0161821 A1* | 6/2013 | Hwang | ................... H10B 43/27 257/E21.585 |
| 2014/0061748 A1 | 3/2014 | Lee | |
| 2017/0236746 A1 | 8/2017 | Yu et al. | |
| 2019/0378857 A1 | 12/2019 | Lee | |

FOREIGN PATENT DOCUMENTS

| | | |
|---|---|---|
| KR | 10-2012-0029194 A | 3/2012 |
| KR | 10-2013-0072522 A | 7/2013 |
| KR | 10-1985936 B1 | 6/2019 |
| KR | 10-2019-0140253 A | 12/2019 |

OTHER PUBLICATIONS

KR Office Action for corresponding Korean Patent Application No. 10-2020-0124633 issued on Aug. 30, 2024.

* cited by examiner

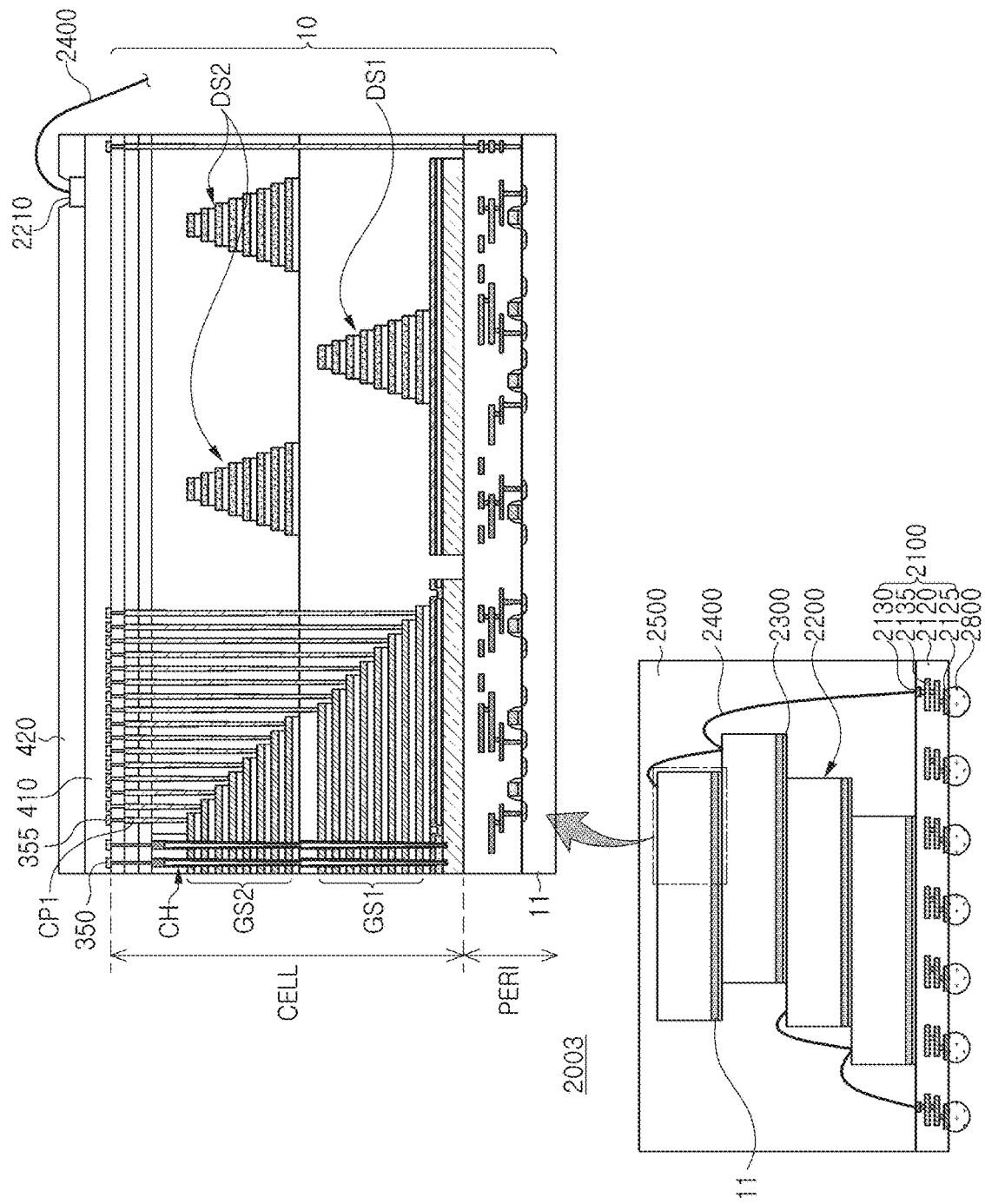

SEMICONDUCTOR DEVICE HAVING DUMMY STRUCTURES IN A PERIPHERAL REGION AND DATA STORAGE SYSTEM INCLUDING THE SAME

CROSS-REFERENCE TO RELATED APPLICATION(S)

This U.S non-provisional application claims the benefit of priority under 35 USC 119(a) to Korean Patent Application No. 10-2020-0124633, filed on Sep. 25, 2020 in the Korean Intellectual Property Office, the entire disclosure of which is incorporated herein by reference for all purposes.

BACKGROUND

Various example embodiments of the inventive concepts relate to a semiconductor device, a data storage system including the semiconductor device, and/or methods of operating the semiconductor device.

In data storage systems, semiconductor devices capable of storing high-capacity data are desired and/or required. Accordingly, a method of increasing the data storage capacity of a semiconductor device is being researched. For example, as the method for increasing the data storage capacity of a semiconductor device, a semiconductor device including memory cells arranged three-dimensionally instead of two-dimensionally, has been proposed.

SUMMARY

Various example embodiments provide for a semiconductor device having improved integration and reliability.

Various example embodiments provide for a data storage system including a semiconductor device having improved integration and reliability.

According to at least one example embodiment, a semiconductor device includes a peripheral circuit region including a first substrate and a plurality of circuit elements on the first substrate; and, at least one memory cell region on the peripheral circuit region, wherein the at least one memory cell region includes: a second substrate on the peripheral circuit region; a memory stack structure including a first stack structure and a second stack structure, the first stack structure including a plurality of first gate electrodes and a plurality of first interlayer insulating layers alternately stacked on the second substrate, and the second stack structure including a plurality of second gate electrodes and a plurality of second interlayer insulating layers alternately stacked on the first stack structure; a plurality of channel structures vertically penetrating through the memory stack structure and connected to the second substrate, the plurality of channel structures each including a respective channel layer; at least one first dummy structure on the second substrate, the at least one first dummy structure spaced apart from at least one side of the first stack structure, and the at least one first dummy structure including a plurality of first insulating layers and a plurality of second insulating layers alternately stacked; at least one second dummy structure on the at least one first dummy structure, the at least one second dummy structure spaced apart from at least one side of the second stack structure, the at least one second dummy structure including a plurality of third insulating layers and a plurality of fourth insulating layers alternately stacked; and at least a portion of the at least one first dummy structure does not overlap the at least one second dummy structure in a vertical direction.

According to at least one example embodiment, a semiconductor device includes a peripheral circuit region including a first substrate and a plurality of circuit elements provided on the first substrate; a second substrate on the peripheral circuit region; a memory cell structure on the second substrate; and a dummy structure on at least one side of the memory cell structure, the dummy structure on the second substrate, wherein the memory cell structure includes: a first stack structure including a plurality of first gate electrodes and a plurality of first interlayer insulating layers alternately stacked on the second substrate; a second stack structure including a plurality of second gate electrodes and a plurality of second interlayer insulating layers alternately stacked on the first stack structure; and a plurality of channel structures penetrating through the first stack structure and the second stack structure, the plurality of channel structures connected to the second substrate, and wherein the dummy structure includes: a first dummy structure on the second substrate, the first dummy structure spaced apart from the first stack structure, and the first dummy structure including a plurality of first insulating layers and a plurality of second insulating layers alternately stacked; and a second dummy structure on the second substrate, the second dummy structure spaced apart from the second stack structure and the first dummy structure, the second dummy structure including a plurality of third insulating layers and a plurality of fourth insulating layers alternately stacked, and wherein a central axis between side surfaces of the second dummy structure is shifted from a central axis between side surfaces of the first dummy structure in at least one direction parallel to an upper surface of the second substrate.

According to at least one example embodiment, a data storage system includes a semiconductor storage device including a peripheral circuit region including a first substrate and circuit elements provided on the first substrate, a second substrate on the peripheral circuit region, a memory cell structure on the second substrate, a dummy structure on at least one side of the memory cell structure and on the second substrate; and a controller electrically connected to the semiconductor storage device through the input/output pad and controlling the semiconductor storage device, wherein the memory cell structure includes: a first stack structure including a plurality of first gate electrodes and a plurality of first interlayer insulating layers alternately stacked on the second substrate; a second stack structure including a plurality of second gate electrodes and a plurality of second interlayer insulating layers alternately stacked on the first stack structure; and a plurality of channel structures penetrating through the first stack structure and the second stack structure, the plurality of channel structures connected to the second substrate, wherein the dummy structure includes: a first dummy structure spaced apart from the first stack structure and on the second substrate; and a second dummy structure on the second substrate, the second dummy structure spaced apart from the second stack structure and the first dummy structure, and wherein a central axis between side surfaces of the second dummy structure is shifted from a central axis between side surfaces of the first dummy structure in at least one direction parallel to an upper surface of the second substrate.

BRIEF DESCRIPTION OF DRAWINGS

The above and other aspects, features, and advantages of the example embodiments of the inventive concepts will be

FIG. 17 is a schematic cross-sectional view illustrating semiconductor packages according to at least one example embodiment.

DETAILED DESCRIPTION

Hereinafter, various example embodiments will be described with reference to the accompanying drawings.

Figure 1:
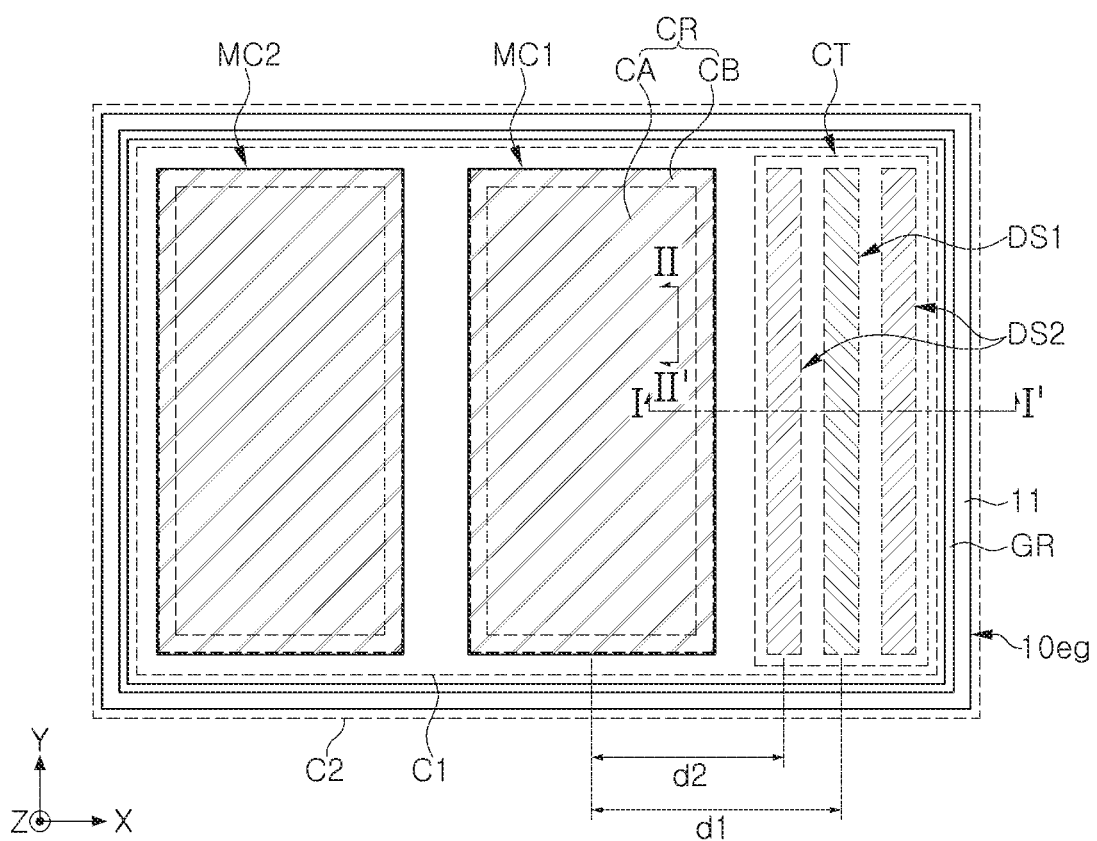
FIG. 1 is a schematic plan view of a semiconductor device according to at least one example embodiment.

FIG. 1 is a schematic plan view of a semiconductor device according to at least one example embodiment.

Figure 2A:
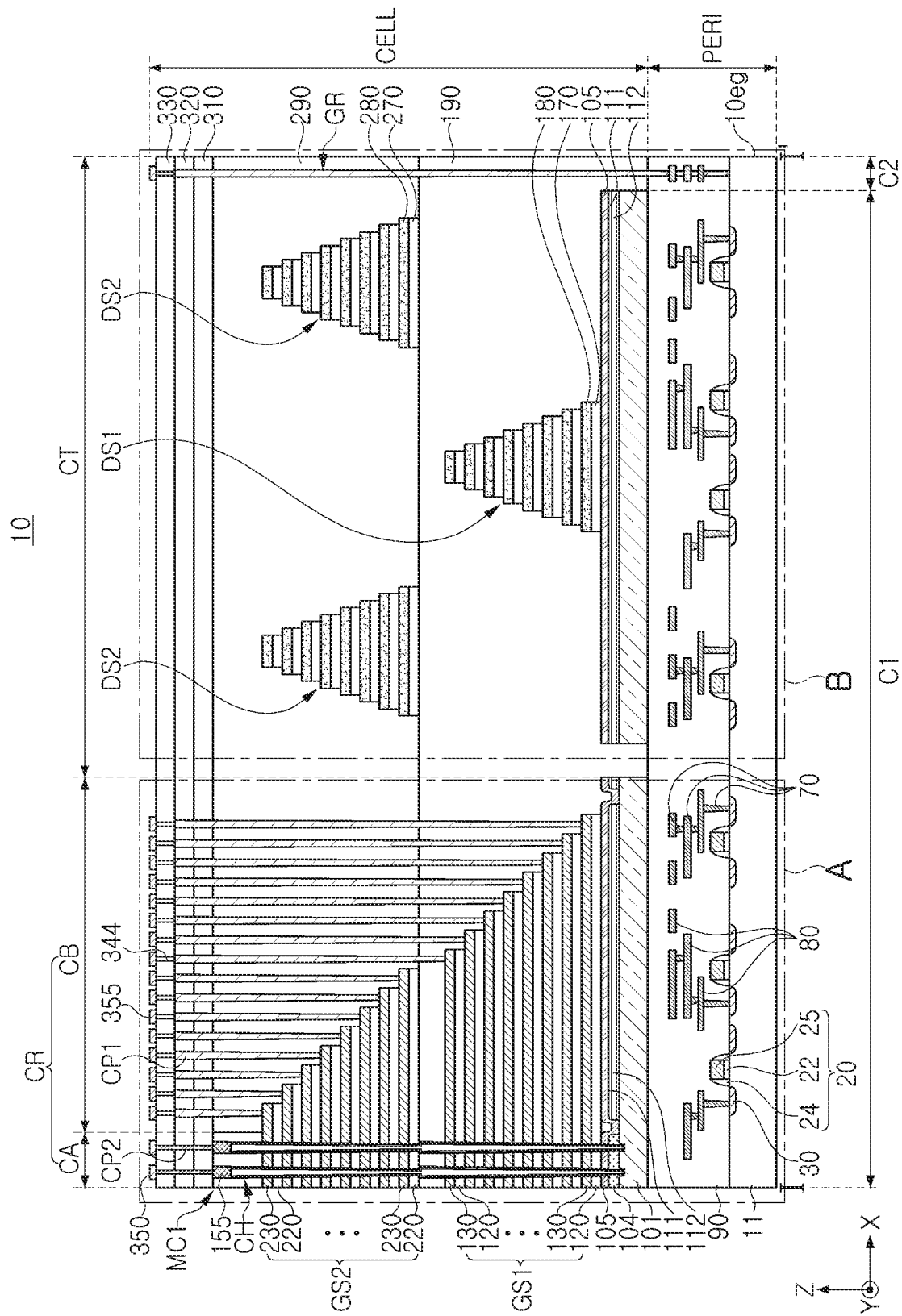
FIGS. 2A and 2B are schematic cross-sectional views of a semiconductor device according to at least one example embodiment.
Figure 2B:
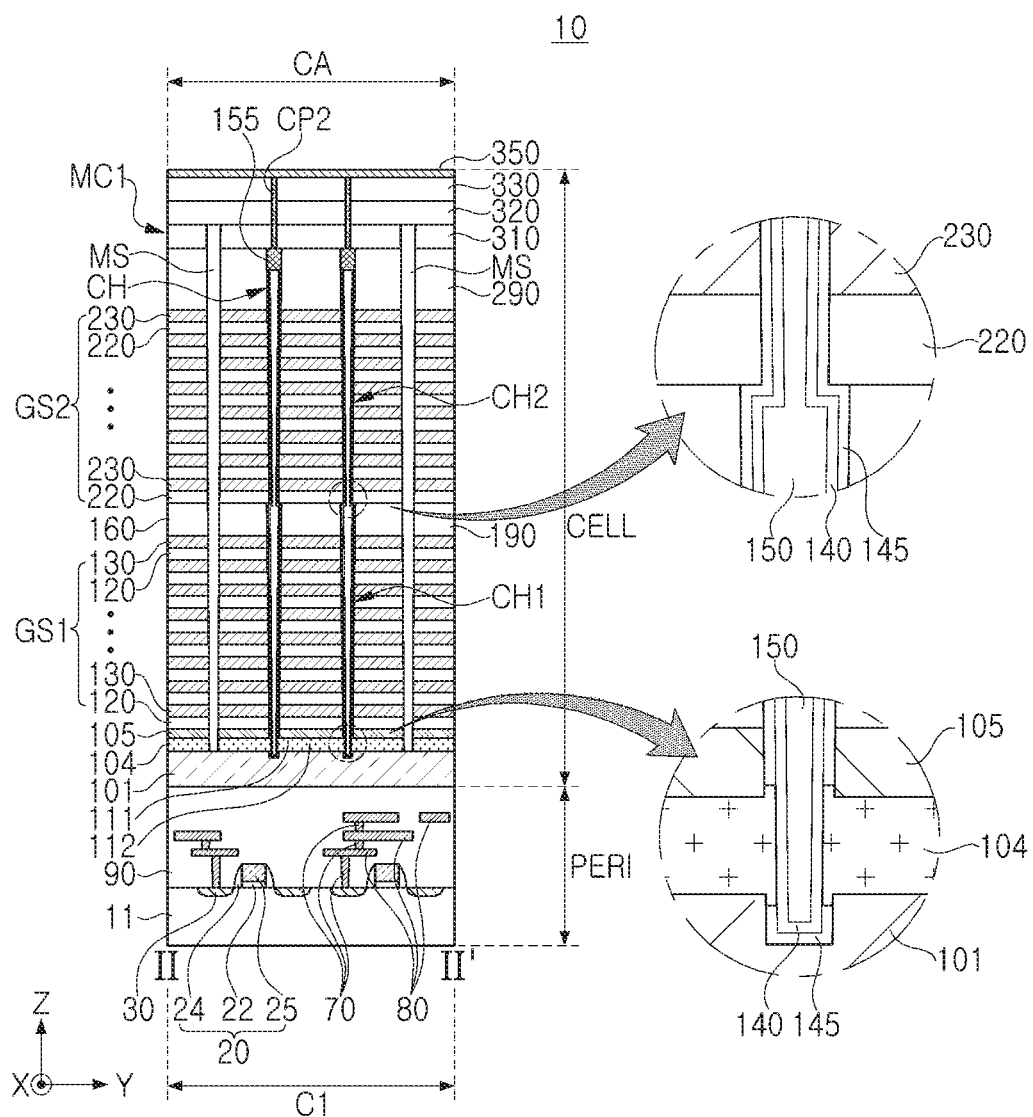

FIGS. 2A and 2B are schematic cross-sectional views of a semiconductor device according to some example embodiments. FIGS. 2A and 2B are schematic cross-sectional views illustrating cross-sections taken along lines I-I' and II-II' of FIG. 1, respectively.

Referring to FIGS. 1, 2A, and 2B, a semiconductor device 10 may include at least one memory cell region CELL and/or at least one peripheral circuit region PERI, etc., but is not limited thereto. The memory cell region CELL may be on the peripheral circuit region PERI. Conversely, in at least one example embodiment, the memory cell region CELL may be below the peripheral circuit region PERI, but the example embodiments are not limited thereto.

The peripheral circuit region PERI may include a first substrate 11, circuit elements 20 on the first substrate 11, circuit contact plugs 70, and/or circuit wiring lines 80, etc., but is not limited thereto, and for example, may include a greater or lesser number of constituent components.

The first substrate 11 may have an upper surface extending in the X and Y directions. The first substrate 11 may include a semiconductor material, such as a group IV semiconductor, a group III-V compound semiconductor, or a group II-VI compound semiconductor, or in other words, the first substrate 11 may be a semiconductor substrate.

The first substrate 11 may have a central region C1 and a guard ring region C2 surrounding the central region C1, but the example embodiments are not limited thereto. The guard ring region C2 may include an edge region 10eg of the semiconductor device 10. The edge region 10eg may be formed during a process of separating a plurality of semiconductor devices on a semiconductor wafer. According to at least one example embodiment, the same structure as the structure in a scribe lane area may be further in the edge region 10eg. A guard ring structure GR included in a moisture oxidation barrier structure and/or a crack stop structure may be on the guard ring region C2, but the example embodiments are not limited thereto.

In the first substrate 11, separate device isolation layers may be formed to define an active region. One or more source/drain regions 30 including impurities may be in a portion of the active region.

The circuit elements 20 may include planar transistors, but are not limited thereto. Each of the circuit elements 20 may include a circuit gate dielectric layer 22, a spacer layer 24, and/or a circuit gate electrode 25, etc. Source/drain regions 30 may be in the first substrate 11 on both sides of the circuit gate electrode 25, but the example embodiments are not limited thereto.

A peripheral region insulating layer 90 may be on the circuit elements 20 and/or on the first substrate 11. The circuit contact plugs 70 may penetrate through the peripheral insulating layer 90 and be connected to the source/drain regions 30. An electric signal may be applied to the circuit element 20 using the circuit contact plugs 70. In a region not illustrated, the circuit contact plugs 70 may also be connected to the circuit gate electrode 25. The circuit wiring lines 80 may be connected to the circuit contact plugs 70 and may be in a plurality of layers, but are not limited thereto.

The memory cell region CELL may include a second substrate 101, memory cell structures MC1 and MC2, and/or dummy structures DS1 and DS2, etc., but the example embodiments are not limited thereto. The dummy structures DS1 and DS2 may be spaced apart from the memory cell structures MC1 and MC2 on at least one side of the memory cell structures MC1 and MC2, or in other words, a plurality of dummy structures may be located in a different area then an area including a plurality of memory cell structures in the memory cell region CELL, and the plurality of dummy structures and/or the plurality of memory cell structures may be spaced apart from each other. The memory cell region CELL may further include a plurality of capping insulating layers, such as capping insulating layers 190 and 290, a plurality of upper insulating layers, such as upper insulating layers 310, 320 and 330, a plurality of contact plugs, such as gate contact plugs CP1, channel contact plugs CP2, and a bit line 350, and/or upper wirings 355, etc., but the example embodiments are not limited thereto.

The second substrate 101 may have a cell region CR and a peripheral region CT, but is not limited thereto. The cell region CR may include a cell array region CA in which memory cells are formed, and a connection region CB for connecting gate electrodes of the memory cells to upper wirings, etc. The peripheral region CT may be a region for connecting the circuit elements 20 of the peripheral circuit region PERI with the upper wirings on at least one side of the cell region CR, etc. The connection region CB may be on at least one end of the cell array region CA in at least one direction, for example, in the X direction, or may be along the edge of the cell array region CA, but the example embodiments are not limited thereto.

The second substrate 101 may have an upper surface extending in the X and Y directions. The second substrate 101 (e.g., second semiconductor substrate) may include a semiconductor material, such as a group IV semiconductor, a group III-V compound semiconductor, or a group II-VI compound semiconductor. For example, the group IV semiconductor may include silicon, germanium, or silicon-germanium. The second substrate 101 may be formed of, for example, polycrystalline silicon, etc., and may or may not contain impurities.

The memory cell structures MC1 and MC2 may be spaced apart from each other and may be in parallel on the second substrate 101. However, in at least one example embodiment, the number and arrangement form of the memory cell structures MC1 and MC2 in the cell region CR may be variously changed, and may be lesser or greater in number than shown in FIGS. 1, 2A, and 2B. Hereinafter, one memory cell structure MC1 will be described.

The memory cell structure MC1 may include a plurality of memory stack structures, such as memory stack structures GS1 and GS2, etc., a plurality of channel structures CH, a plurality of conductive layers, such as first and second conductive layers 104 and 105, etc., and a plurality of separation structures MS, but is not limited thereto. The memory stack structures GS1 and GS2 may include a first stack structure GS1 on the second substrate 101 and a second stack structure GS2 on the first stack structure GS1, but is not limited thereto.

The first stack structure GS1 may include first gate electrodes 130 and first interlayer insulating layers 120 alternately stacked on the second substrate 101, but is not limited thereto. The second stack structure GS2 may include second gate electrodes 230 and second interlayer insulating layers 220 alternately stacked on the first stack structure GS1, but is not limited thereto.

The first and second gate electrodes 130 and 230 may be vertically spaced apart on the second substrate 101. The first and second gate electrodes 130 and 230 may include one or a plurality of lower gate electrodes, a plurality of intermediate gate electrodes, and one or a plurality of upper gate electrodes, but the example embodiments are not limited thereto.

The one or plurality of lower gate electrodes may include a gate electrode of a ground selection transistor and/or a gate electrode of a lower erase control transistor, but is not limited thereto. The one or plurality of upper gate electrodes may include a gate electrode of a string selection transistor and/or a gate electrode of an upper erase control transistor, but is not limited thereto. The lower erase control transistor and the upper erase control transistor may be transistors using an erase operation using a gate induced drain leakage (GIDL) phenomenon, etc.

The plurality of intermediate gate electrodes may be gate electrodes of memory cell transistors, etc. Some of the upper or lower gate electrodes among the plurality of intermediate gate electrodes may be dummy gate electrodes. The number of first and second gate electrodes 130 and 230 included in the memory cells may be determined according to the memory capacity of the semiconductor device 10, but the example embodiments are not limited thereto.

The first and second gate electrodes 130 and 230 are stacked to be vertically spaced apart from each other on the cell region CR, and extend from the cell array region CA to the connection region CB to have different lengths and to form steps having a stepped structure (e.g., a staircase shape, etc.). The first and second gate electrodes 130 and 230 form a step shape in which the lower gate electrode extends further than the upper gate electrode by the stepped structure, and may provide ends that are exposed upwardly from the first and second interlayer insulating layers 120 and 220, etc.

In at least one example embodiment, a desired and/or predetermined number of the first and second gate electrodes 130 and 230, for example, two, four or six gate electrodes, etc., form one gate group, and a stepped structure may be formed between the gate groups, but the example embodiments are not limited thereto. Gate electrodes included in one gate group may also have a stepped structure in the Y direction, but is not limited thereto.

As illustrated in FIG. 2B, the first and second gate electrodes 130 and 230 may be separated from the first and second gate electrodes 130 and 230 adjacent to each other in the Y direction, by a pair of separation structures MS extending in the X direction. In other words, a first pair of gate electrodes 130 and 230 may be next to a pair of separation structures MS, which is next to a second pair of gate electrodes 130 and 230, etc. The first and second gate electrodes 130 and 230 between the pair of separation structures MS may form one memory block, but the range of the memory block is not limited thereto. Some of the first and second gate electrodes 130 and 230, for example, the first and second gate electrodes 130 and 230 included in memory cells, may form one layer within one memory block, etc.

The first and second gate electrodes 130 and 230 may include a metal material such as tungsten (W), but is not limited thereto. According to at least one example embodiment, the first and second gate electrodes 130 and 230 may include polycrystalline silicon or a metal silicide material. In at least one example embodiment, the first and second gate electrodes 130 and 230 may further include a diffusion barrier. For example, the diffusion barrier may include tungsten nitride (WN), tantalum nitride (TaN), titanium nitride (TiN), etc., or any combinations thereof.

The first and second interlayer insulating layers 120 and 220 may be between the gate electrodes 130 and 230, respectively. Similarly to the case of the first and second gate electrodes 130 and 230, the first and second interlayer insulating layers 120 and 230 may also be spaced apart from each other in a direction perpendicular to the upper surface of the second substrate 101 and may extend in at least one direction. The first and second interlayer insulating layers 120 and 220 may include an insulating material such as silicon oxide or silicon nitride, etc.

Each of the channel structures CH forms one memory cell string, and may be spaced apart from each other while forming rows and columns on the cell array region CA of the second substrate 101, but is not limited thereto. The channel structures CH may form a grid pattern and/or may be in a zigzag shape in one direction, but the example embodiments are not limited thereto and the channel structures CH may be arranged in other desired patterns. The channel structures CH have a columnar shape, and may have inclined side surfaces that become narrower as they are closer to the second substrate 101 according to a desired aspect ratio, but are not limited thereto. In at least one example embodiment, dummy channels that do not substantially form a memory cell string may be on an end of the cell array region CA adjacent to the connection region CB and in the connection region CB, but the example embodiments are not limited thereto.

A channel layer 140 may be in the channel structures CH. In the channel structures CH, the channel layer 140 may be formed in an annular shape surrounding the channel insulating layer 150, but according to some example embodiments, may have a columnar shape such as a cylinder or a prismatic column without the channel insulating layer 150, etc. A lower portion of the channel layer 140 may be connected to the first conductive layer 104. The channel layer 140 may be connected to the second substrate 101. The channel layer 140 may include a semiconductor material such as polycrystalline silicon and/or single crystal silicon, etc., but are not limited thereto.

Channel pads 155 may be on the channel layer 140 in the channel structures CH. The channel pads 155 may cover the upper surface of the channel insulating layer 150 and be electrically connected to the channel layer 140. The channel pads 155 may include, for example, doped polycrystalline silicon, etc.

A gate dielectric layer 145 may be between the first and second gate electrodes 130 and 230 and the channel layer 140. The gate dielectric layer 145 extends upwardly longer than the channel layer 140 (e.g., the gate dielectric layer 145 extends past the channel layer 140) in such a manner that a portion of the inner side surface may contact the channel pad 155. Although not illustrated, the gate dielectric layer 145 may include a tunneling layer, an information storage layer, and/or a blocking layer, etc., sequentially stacked from the channel layer 140, but the example embodiments are not limited thereto. The tunneling layer may tunnel electric charges to the information storage layer, and may include, for example, silicon oxide ($SiO_2$), silicon nitride ($Si_3N_4$), silicon oxynitride (SiON), etc., or any combinations thereof. The information storage layer may be a charge trap layer or a floating gate conductive layer, but is not limited thereto. The blocking layer may include silicon oxide ($SiO_2$), silicon nitride ($Si_3N_4$), silicon oxynitride (SiON), a high-k dielectric material, etc., or any combinations thereof.

The channel structures CH may vertically penetrate through the memory stack structures GS1 and GS2 to be connected to the second substrate 101. The channel structures CH may include first and second channel structures CH1 and CH2 vertically stacked, as illustrated in FIG. 2B, but the example embodiments are not limited thereto.

The channel structures CH may have a form in which the first channel structures CH1 penetrating through the first stack structure GS1 and the second channel structure CH2 penetrating through the second stack structure GS2 are connected, and as illustrated in the enlarged view of FIG. 2B, may have a bent portion due to a difference in width in a connection region, but the example embodiments are not limited thereto. The channel layer 140, the gate dielectric layer 145, and the channel insulating layer 150 may be connected to each other between the first channel structure CH1 and the second channel structure CH2. The channel pad 155 may be only on the upper end of the upper second channel structure CH2, but is not limited thereto. However, in at least one example embodiment, the first channel structure CH1 and the second channel structure CH2 may each include a channel pad 155, in this case, the channel pad 155 of the first channel structure CH1 may be connected to the channel layer 140 of the second channel structure CH2, etc.

In at least one example embodiment, the channel structures CH may include an epitaxial layer connected to the second substrate 101 at the bottom, but is not limited thereto. According to some example embodiments, the epitaxial layer may be connected to the channel layer 140. In this case, the semiconductor device 10 may not include the first and second conductive layers 104 and 105.

The first and second conductive layers 104 and 105 may be stacked on the upper surface of the second substrate 101. At least a portion of the first and second conductive layers 104 and 105 may function as a part of a common source line of the semiconductor device 10 and may function as a common source line together with the second substrate 101. As shown in the enlarged view of FIG. 2B, the first conductive layer 104 may be connected and/or directly connected to the channel layer 140 around the channel layer 140. The first and second conductive layers 104 and 105 may include a semiconductor material, for example, polycrystalline silicon, but are not limited thereto, and according to some example embodiments, the first and second conductive layers 104 and 105 may be made of different semiconductor materials, etc. In this case, at least the first conductive layer 104 may be a doped layer, and the second conductive layer 105 may be a doped layer or a layer containing impurities diffused from the first conductive layer 104, etc.

As shown in FIG. 2A, the plurality of source sacrificial layers, e.g., first and second source sacrificial layers 111 and 112, etc., are not replaced with the first conductive layer 104 and partially remain on the second substrate 101 in the connection region CB, or in other words, the source sacrificial layers are not completely removed from the second substrate 101, etc., but the example embodiments are not limited thereto. The first and second source sacrificial layers 111 and 112 may not perform and/or substantially perform a function in the semiconductor device 10. The first and second source sacrificial layers 111 and 112 and the second conductive layer 105 may also be stacked on the second substrate 101 in the peripheral region CT, but are not limited thereto.

As shown in FIG. 2B, the separation structures MS may penetrate the memory stacked structures GS1 and GS2 along a vertical direction, for example, a Z direction, but is not limited thereto. The separation structures MS may separate the memory stacked structures GS1 and GS2 in the Y direction, but are not limited thereto. The separation structures MS may extend along the X direction from the cell array region CA to the connection region CB, but are not limited thereto. The separation structures MS may penetrate the first and second gate electrodes 130 and 230 along the Z-direction to contact the second substrate 101. The separation structures MS may fill a partially recess in the upper portion of the second substrate 101 (e.g., may penetrate the upper surface of the second substrate 101) or may be contact the second substrate 101 so as to contact the upper surface of the second substrate 101. The separation structures MS may include an insulating material, for example, silicon oxide, silicon nitride, etc., or any combinations thereof.

In at least one example embodiment, the separation structures MS may include auxiliary separation regions that are intermittently extended or only in some areas. The auxiliary separation regions may be separated by desired and/or predetermined intervals in the X direction in the connection region CB and in plurality, but are not limited thereto.

The dummy structures DS1 and DS2 may be on the second substrate 101 to be spaced apart from the memory cell structure MC1. In some example embodiments, the number, size, and arrangement form of the dummy structures DS1 and DS2 in the peripheral region CT may be variously changed.

The dummy structures DS1 and DS2 may include a first dummy structure DS1 on the second substrate 101 that is spaced apart from the first stack structure GS1, and a second dummy structure DS2 on the second substrate 101 that is spaced apart from the second stack structure GS2. The first dummy structure DS1 may be referred to as a 'first insulating structure', and the second dummy structure DS2 may be referred to as a 'second insulating structure'.

The first dummy structure DS1 may include first insulating layers 170 and second insulating layers 180 alternately stacked on the second substrate 101, but is not limited thereto. The first dummy structure DS1 may have steps having a staircase shape, but is not limited thereto. For example, the second insulating layers 180 may extend to different lengths to form a stepped structure in the form of a step, etc. The second insulating layers 180 may form a step shape in which the lower second insulating layer 180 extends further than the upper second insulating layer 180 due to the stepped structure, etc. Similar to the second insulating layers 180, the first insulating layers 170 may form a stepped structure in the form of a step, but is not limited thereto. The first dummy structure DS1 may have a shape in which an upper width is smaller than a lower width due to the step shape, etc.

The first dummy structure DS1 may be spaced apart from at least one side of the first stack structure GS1. The first dummy structure DS1 may overlap the first stack structure GS1, for example, in the X direction. The first dummy structure DS1 may be covered by the first capping insulating layer 190 together with the first stack structure GS1, but is not limited thereto. The first dummy structure DS1 may be a single dummy structure or may be a plurality of dummy structures on the second substrate 101.

First and second source sacrificial layers 111 and 112 and the second conductive layer 105 may be between the first dummy structure DS1 and the second substrate 101, but the configuration of the example embodiments are not limited thereto.

The second dummy structure DS2 may include third insulating layers 270 and fourth insulating layers 280 alternately stacked on the first dummy structure DS1, but is not limited thereto. The second dummy structure DS2 may have steps having a staircase shape, but is not limited thereto. For example, the fourth insulating layers 280 may extend to different lengths to form a stepped structure in the form of a step, etc. The fourth insulating layers 280 may form a step shape in which the lower fourth insulating layer 280 extends further than the upper fourth insulating layer 280 due to the stepped structure, but is not limited thereto. Like the fourth insulating layers 280, the third insulating layers 270 may have a stepped structure in the form of a step. The second dummy structure DS2 may have an upper width smaller than a lower width due to the step shape, but is not limited thereto.

The second dummy structure DS2 may be spaced apart from at least one side of the second stack structure GS2. The second dummy structure DS2 may be spaced apart from the first dummy structure DS1. The second dummy structure DS2 may overlap the second stack structure GS2, for example, in the X direction. The second dummy structure DS2 may be covered by the second capping insulating layer 290 together with the first stack structure GS1. One or a plurality of second dummy structures DS2 may be on the first dummy structure DS1.

The first insulating layers 170 may be positioned at a height level corresponding to the first interlayer insulating layers 120, but is not limited thereto. The first insulating layers 170 may have the same and/or substantially the same thickness as the first interlayer insulating layers 120 (e.g., within +/−10%, etc.). The first insulating layers 170 may be formed of the same material as the first interlayer insulating layers 120.

The second insulating layers 180 may be positioned at a height level corresponding to the first gate electrodes 130. The second insulating layers 180 may have the same and/or substantially the same thickness as the first gate electrodes 130 (e.g., within +/−10%, etc.). The second insulating layers 180 may be formed of a material different from that of the first gate electrodes 130, but is not limited thereto.

The third insulating layers 170 may be positioned at a height level corresponding to the second interlayer insulating layers 220. The third insulating layers 170 may have the same and/or substantially the same thickness as the second interlayer insulating layers 220 (e.g., within +/−10%, etc.). The third insulating layers 170 may be formed of the same material as the second interlayer insulating layers 220, but is not limited thereto.

The fourth insulating layers 280 may be positioned at a height level corresponding to the second gate electrodes 230. The fourth insulating layers 280 may have the same and/or substantially the same thickness as the second gate electrodes 230 (e.g., within +/−10%, etc.). The fourth insulating layers 280 may be formed of a material different from that of the second gate electrodes 230, but is not limited thereto.

The first dummy structure DS1 may not overlap the second dummy structure DS2 in a vertical direction (e.g., Z direction). The second dummy structure DS2 may not overlap the first dummy structure DS1 in the vertical direction.

An uppermost second insulating layer 180 among the second insulating layers 180 of the first dummy structure DS1 may not overlap the second dummy structure DS2 in the vertical direction.

The upper surface of the first dummy structure DS1 may not overlap with the second dummy structure DS2 in the vertical direction. The upper surface of the second dummy structure DS2 may not overlap the first dummy structure DS1 in the vertical direction. In this case, the upper surface of the first dummy structure DS1 and the upper surface of the second dummy structure DS2 may indicate the upper surface of the uppermost second insulating layer 180 and the upper surface of an uppermost fourth insulating layer 280, respectively. The upper surface of the first dummy structure DS1 may not face the bottom surface of the second dummy structure DS2.

Side surfaces of the first dummy structure DS1 may not overlap with the second dummy structure DS2 in the vertical direction. In this case, the side surfaces of the first dummy structure DS1 may refer to side surfaces (e.g., surfaces in the X or Y directions) of the first insulating layers 170 and the second insulating layers 180. In at least one example embodiment, side surfaces of the first dummy structure DS1 and side surfaces of the second dummy structure DS2 may be inclined with respect to the upper surface of the second substrate 101, respectively, but are not limited thereto.

An uppermost step of the first dummy structure DS1 may not overlap with the second dummy structure DS2 in the vertical direction. In at least one example embodiment, an uppermost step of the first dummy structure DS1 may not overlap with a lowermost step of the second dummy structure DS2 in the vertical direction.

A lowermost step of the first dummy structure DS1 may not overlap with the second dummy structure DS2 in the vertical direction. In at least one example embodiment, the lowermost step of the first dummy structure DS1 may not overlap with the lowermost step of the second dummy structure DS2 in the vertical direction.

A central axis between the side surfaces of the second dummy structure DS2 may be shifted (e.g., not aligned, etc.) from a central axis between the side surfaces of the first dummy structure DS1, in at least one direction parallel to the upper surface of the second substrate 101, for example, in the X direction, etc.

The central axis of the first dummy structure DS1 and the central axis of the second dummy structure DS2 may be spaced apart from a central axis of the memory cell structure MC1 by different and/or the same desired distances. For example, as illustrated in FIG. 1, a first distance d1 between the central axis of the memory cell structure MC1 and the central axis of the first dummy structure DS1 may be different from a second distance d2 between the central axis of the memory cell structure MC1 and the central axis of the second dummy structure DS2, but are not limited thereto.

Due to the arrangement of the first and second dummy structures DS1 and DS2, the process (e.g., manufacturing) distribution of the step structure in the connection regions CB on both sides of the first and second stack structures GS1 and GS2 in the X direction may be reduced and/or significantly reduced. During the planarization process of the second capping insulating layer 290, a dishing phenomenon in which an upper portion of the second capping insulating layer 290 is locally recessed downwardly toward the second substrate 101 may be reduced and/or significantly reduced.

The spread of the planarization process of the second capping insulating layer 290 occurring by transferring the dished portion of the second substrate 101 to the upper structure may be reduced and/or significantly reduced by having the first and second dummy structures DS1 and DS2 not overlap in the vertical direction. In addition, during the process of manufacturing a semiconductor device according to at least one of the example embodiments in the unit of a semiconductor wafer, the upper curved portions of first and second outer insulating layers 275 and 285 (see FIG. 15B) serving as alignment keys may be prevented from being broken and/or there may be a reduced probability of breaking the alignment keys, etc.

The capping insulating layers 190 and 290 may include a first capping insulating layer 190 covering the first stack structure GS1 and the first dummy structure DS1, and a second capping insulating layer 290 covering the second stack structure GS2 and the second dummy structure DS2. The first capping insulating layer 190 and the second capping insulating layer 290 may include an insulating material, for example, silicon oxide, but is not limited thereto.

The first dummy structure DS1 may overlap the second capping insulating layer 290 in the vertical direction. The upper surface of the first dummy structure DS1 may overlap the second capping insulating layer 290 in the vertical direction.

The second dummy structure DS2 may overlap the first capping insulating layer 190 in the vertical direction.

The upper insulating layers 310, 320, and 330 may include the first upper insulating layer 310, the second upper insulating layer 320, and the third upper insulating layer 330 sequentially stacked on the second capping insulating layer 290, but the example embodiments are not limited thereto. The upper insulating layers 310, 320 and 330 may include an insulating material, for example, silicon oxide, etc., but are not limited thereto. Additionally, one or more of the insulating layers may include a different insulating material than the other insulating layers, etc.

The gate contact plugs CP1 may be electrically connected to the first and second gate electrodes 130 and 230 in the connection region CB, respectively. The gate contact plugs CP1 may penetrate through the first and second capping insulating layers 190 and 290 and the first and second upper insulating layers 310 and 320 in the connection region CB, to be connected to the upwardly exposed first and second gate electrodes 130 and 230, respectively, but are not limited thereto. The gate contact plugs CP1 may partially penetrate a recess in the first and second gate electrodes 130 and 230 and may be connected to the first and second gate electrodes 130 and 230, but the example embodiments are not limited thereto. Upper portions of the gate contact plugs CP1 may be connected to separate contact plugs 344 to be connected to the upper wirings 355. The gate contact plugs CP1 may include a conductive material, and may include, for example, tungsten (W), copper (Cu), aluminum (Al), or the like, but are not limited thereto. The gate contact plugs CP1 may further include a diffusion barrier layer, etc.

The channel contact plugs CP2 may be electrically connected to the channel structures CH in the cell array region CA. The channel contact plugs CP2 may penetrate through a plurality of upper insulating layers, such as the first to third upper insulating layers 310, 320 and 330, in the cell array region CA to be connected to the channel pads 155 of the channel structures CH. A bit line 350 electrically connected to the channel contact plugs CP2 may be on the channel contact plugs CP2. The channel contact plugs CP2 may include the conductive material.

The upper wirings 355 may form a wiring structure electrically connected to the memory cells in the memory cell region CELL. The upper wirings 355 may be electrically connected to, for example, the first and second gate electrodes 130 and 230. The number of contact plugs and wiring lines included in the wiring structure may be variously changed as desired according to at least one example embodiment. The upper wirings 355 may include the conductive material.

The guard ring structure GR may be adjacent to the edge region 10eg of the semiconductor device 10. The guard ring structure GR may be on the guard ring region C2 of the first substrate 11. The guard ring structure GR may include a plurality of contact plugs and a plurality of wiring lines connected to the first substrate 11 by penetrating through the first and second capping insulating layers 190 and 290, but the example embodiments are not limited thereto. The guard ring structure GR may surround circuit elements 20 on the central region C1 of the first substrate 11, and the memory cell structures MC1 and the dummy structures DS1 and DS2 MC2 on the second substrate 101, but the example embodiments are not limited thereto.

Figure 3A:
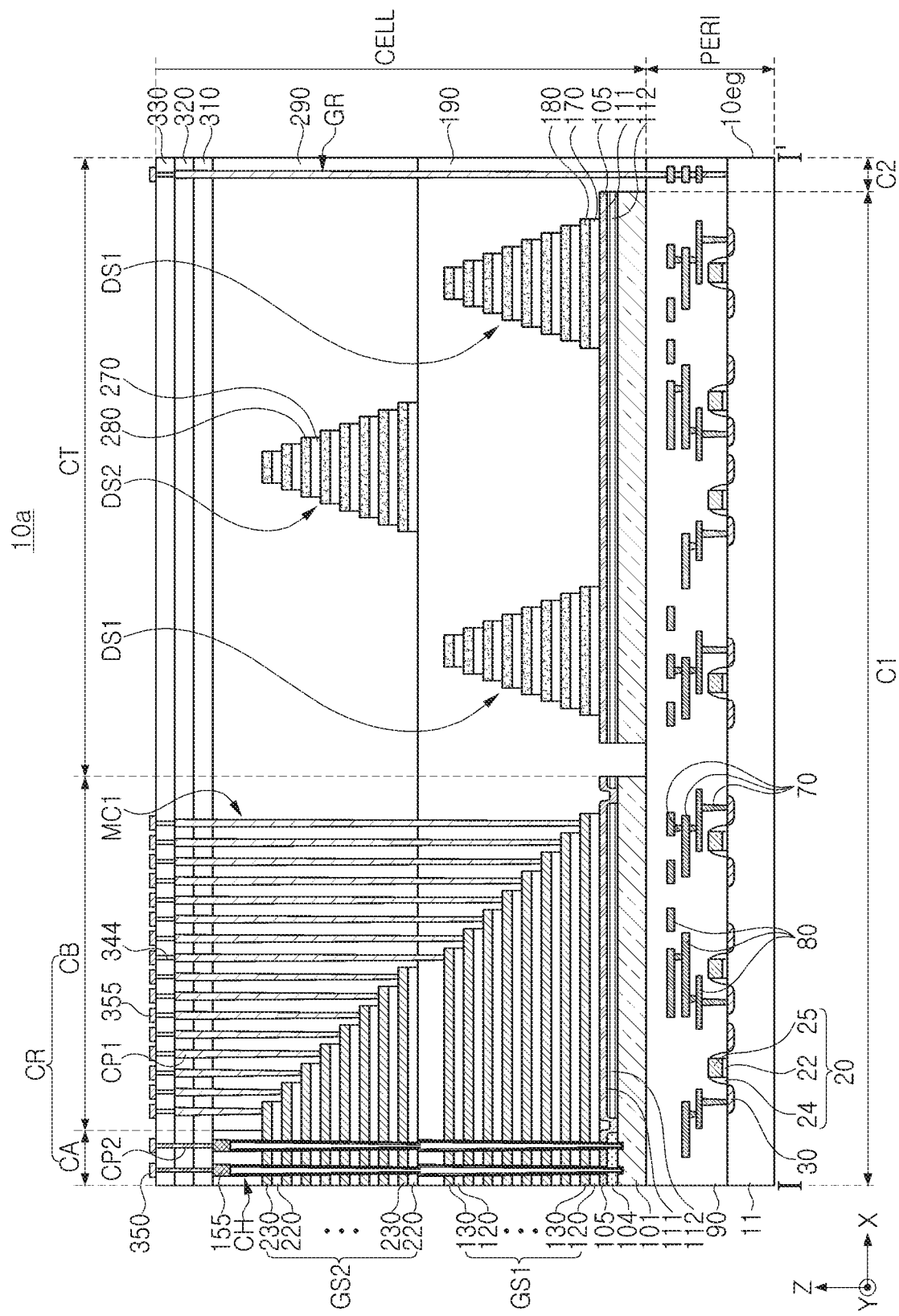
FIGS. 3A, 3B and 3C are schematic cross-sectional views of semiconductor devices according to at least one example embodiment.
Figure 3B:
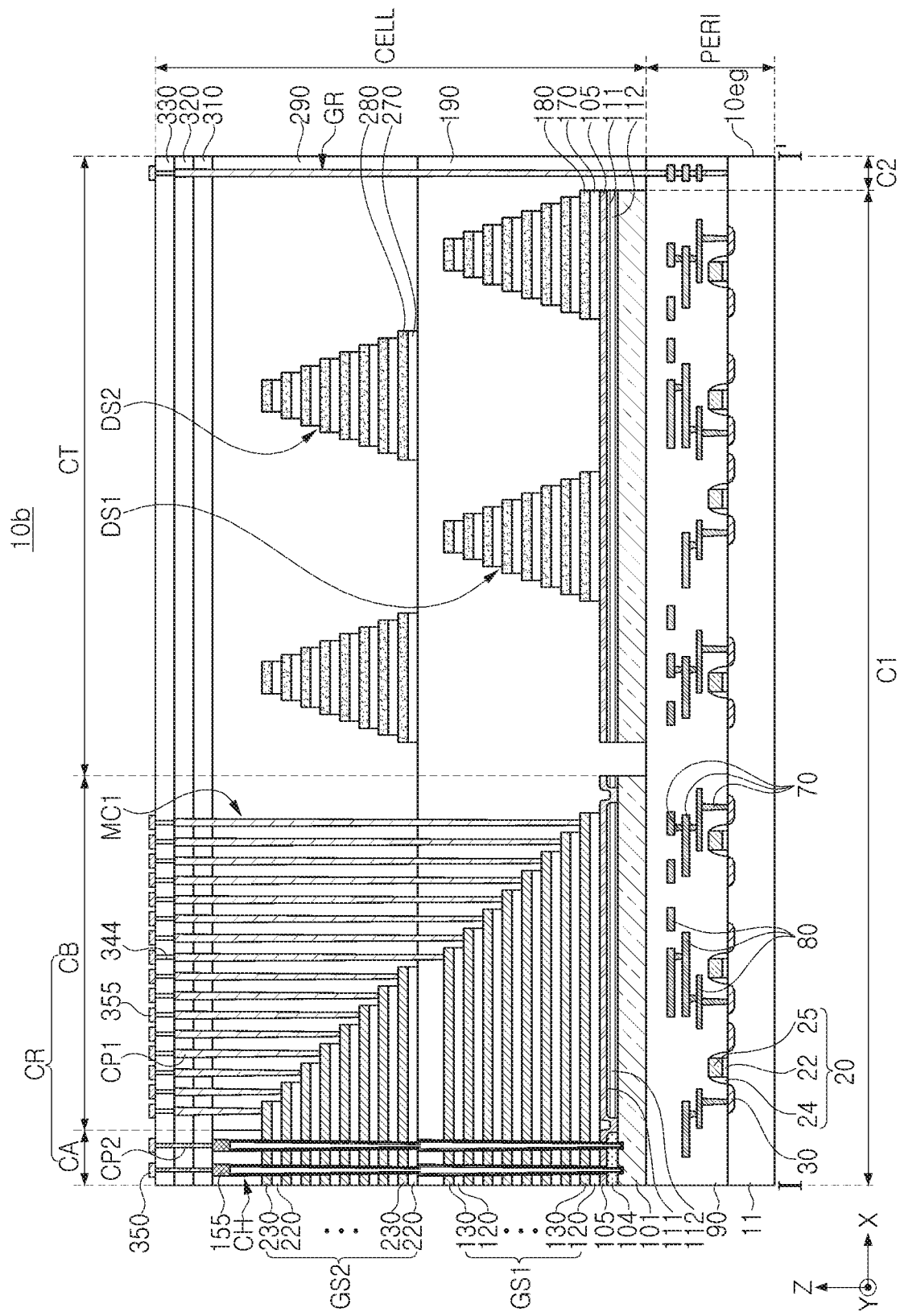
Figure 3C:
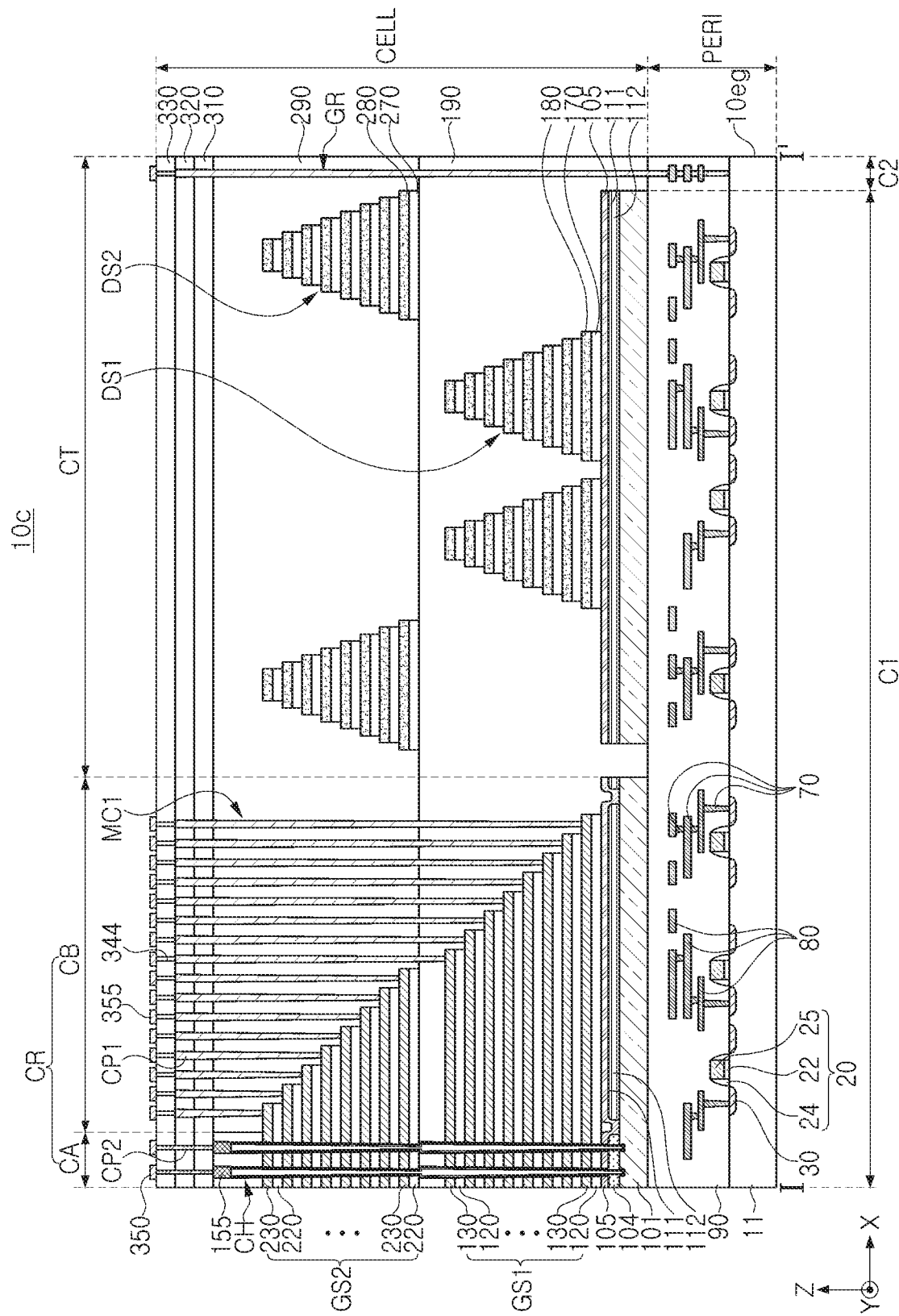

FIGS. 3A, 3B, and 3C are schematic cross-sectional views of semiconductor devices according to some example embodiments. FIGS. 3A to 3C illustrate cross sections corresponding to FIG. 2A. In FIGS. 3A to 3C, the arrangement and number of the first dummy structure DS1 and the second dummy structure DS2 may be different from the at least one example embodiment of FIG. 2A.

Referring to FIG. 3A, in a semiconductor device 10a, at least two first dummy structures DS1 may be on the second substrate 101. The second dummy structure DS2 may be on the first dummy structure DS1 so as not to overlap with the first dummy structure DS1 in the vertical direction.

In FIG. 2A, the first dummy structure DS1 may be one or a plurality of first dummy structures, and the second dummy structure DS2 may be one or a plurality of second dummy structures, and the number of second dummy structures DS2 may be more than the number of the first dummy structures DS1.

In FIG. 3A, there may be one or a plurality of first dummy structures DS1, one or a plurality of second dummy structures DS2, and the number of first dummy structures DS1 may be more than the number of the second dummy structures DS2.

Referring to FIG. 3B, in a semiconductor device 10b, at least two of the first dummy structures DS1 may be on the second substrate 101, and at least two of the second dummy structure DS2 may also be on the first dummy structures DS1. The first dummy structures DS1 may not overlap the second dummy structures DS2 in the vertical direction, respectively.

Referring to FIG. 3C, in a semiconductor device 10c, at least two first dummy structures DS1 may be closer to each other than at least two second dummy structures DS2. The at least two first dummy structures DS1 may not overlap with the at least two second dummy structures DS2 in the vertical direction.

Figure 4A:
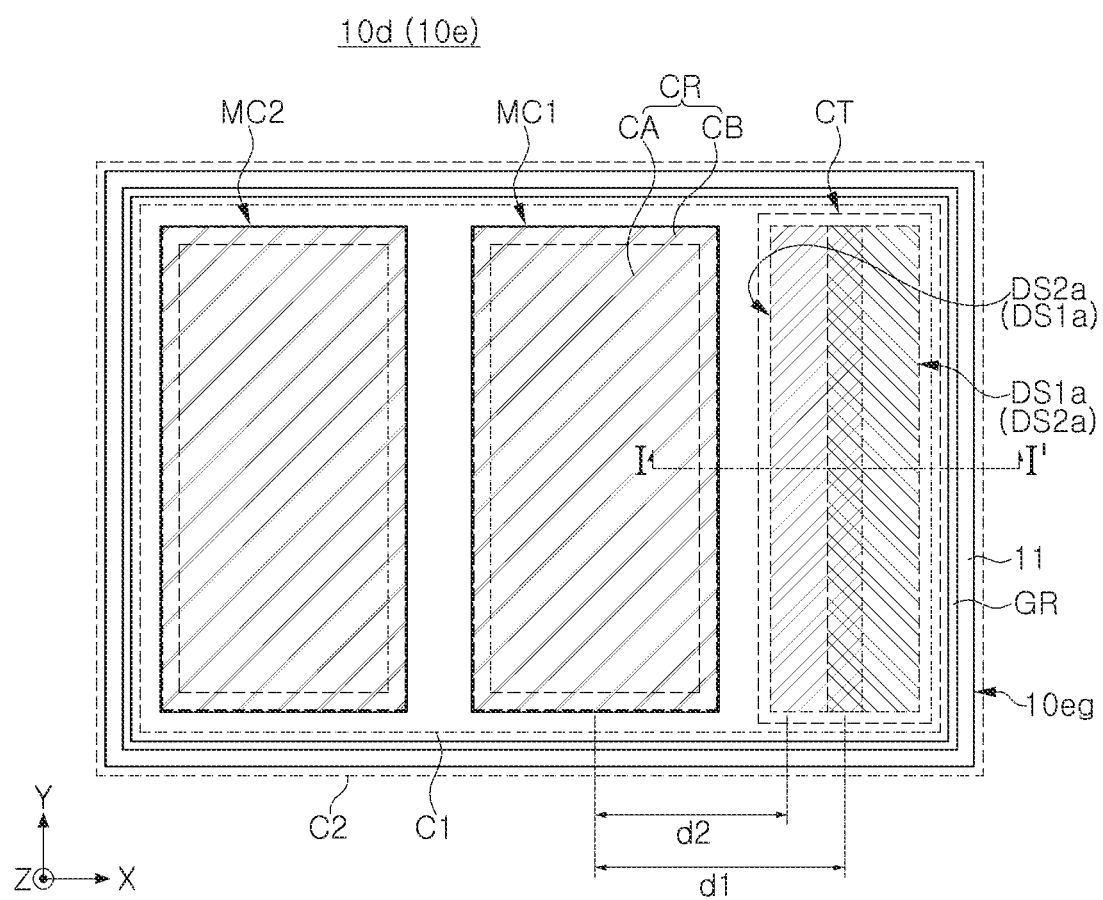
FIG. 4A is a schematic plan view of a semiconductor device according to at least one example embodiment.
Figure 4B:
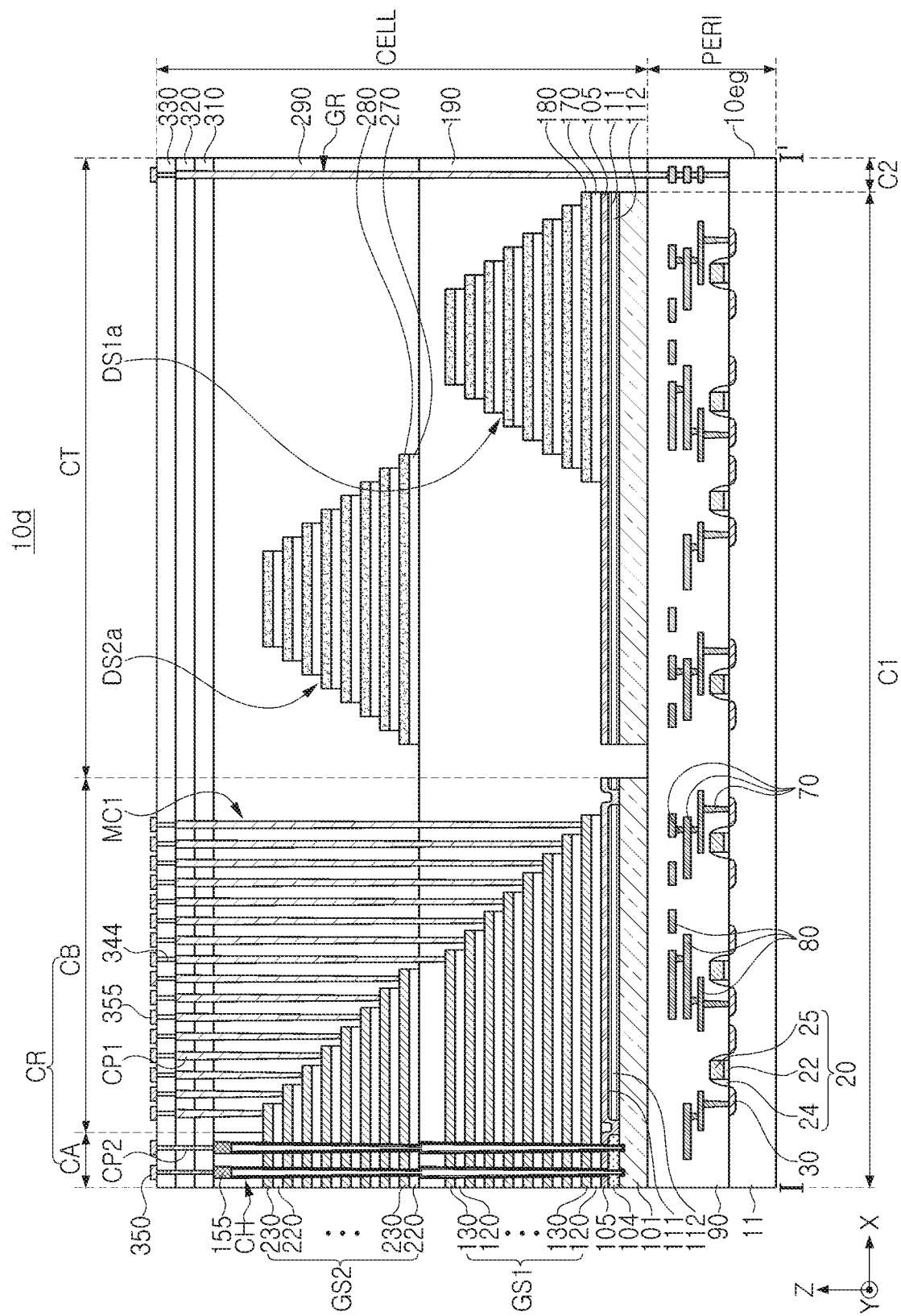
FIGS. 4B and 4C are schematic cross-sectional views of a semiconductor device according to at least one example embodiment.
Figure 4C:
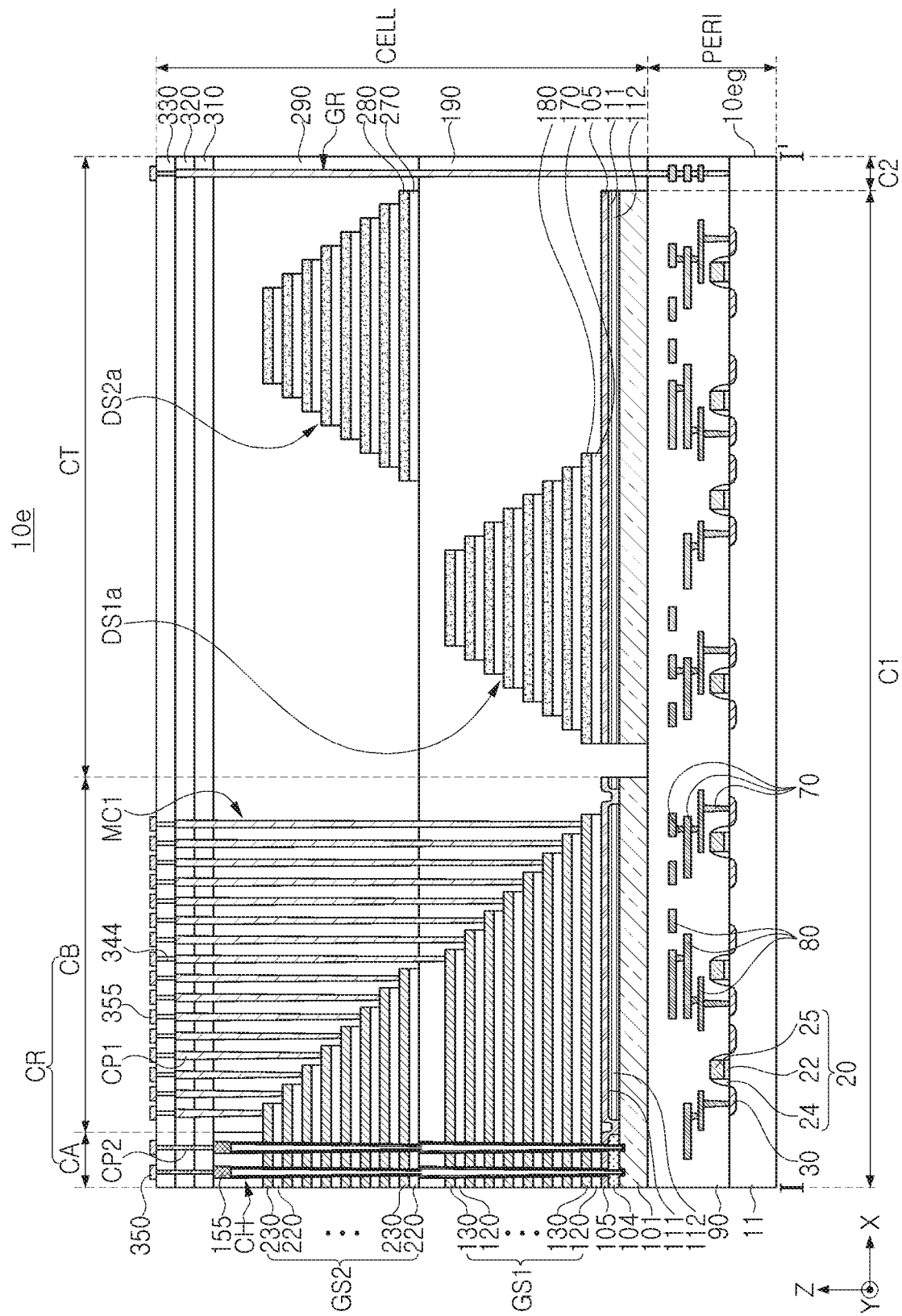

FIG. 4A is a schematic plan view of a semiconductor device according to at least one example embodiment. FIGS. 4B and 4C are schematic cross-sectional views of semiconductor devices according to some example embodiments. FIGS. 4B and 4C illustrate cross sections corresponding to FIG. 2A.

Referring to FIGS. 4A and 4B, in a semiconductor device 10d, the slope of the step structure of a first dummy structure DS1a and the slope of the step structure of a second dummy structure DS2a may be different from that of the at least one example embodiment of FIG. 2A. Each of the first dummy structure DS1a and the second dummy structure DS2a may be the same and/or substantially the same (e.g., +/−10%, etc.) as the slope of the steps in the connection region CB of the memory cell structure MC1.

In at least one example embodiment, a portion (e.g., a first portion) of the first dummy structure DS1a may overlap the second dummy structure DS2a in the vertical direction. Another part (e.g., a second portion) of the first dummy structure DS1a may not overlap the second dummy structure DS2a in the vertical direction. An uppermost second insulating layer 180 of the first dummy structure DS1a may not overlap the second dummy structure DS2a in the vertical direction.

In at least one example embodiment, a portion (e.g., a first portion) of side surfaces of the first dummy structure DS1a may overlap the second dummy structure DS2 in the vertical direction, and another part (e.g., a second portion) of the side surfaces of the first dummy structure DS1a may not overlap the second dummy structure DS2 in the vertical direction.

In at least one example embodiment, at least a portion (e.g., a first portion) of one-side steps of the first dummy structure DS1a may overlap the second dummy structure DS2a in the vertical direction, but the other-side steps (e.g., a second portion) of the first dummy structure DS1a may not completely overlap the second dummy structure DS2a in the vertical direction.

However, according to at least one example embodiment, the first dummy structure DS1a and the second dummy structure DS2a may not completely overlap in the vertical direction, but the example embodiments are not limited thereto.

Referring to FIGS. 4A and 4C, in a semiconductor device 10e, the first dummy structure DS1a may be closer to the cell region CR than the second dummy structure DS2a, but is not limited thereto. The first dummy structure DS1a may be closer to the memory cell structure MC1 than the second dummy structure DS2a, but is not limited thereto. A description of the non-overlapping portions of the first dummy structure DS1a and the second dummy structure DS2a is the same as described with reference to FIG. 4B.

Figure 5A:
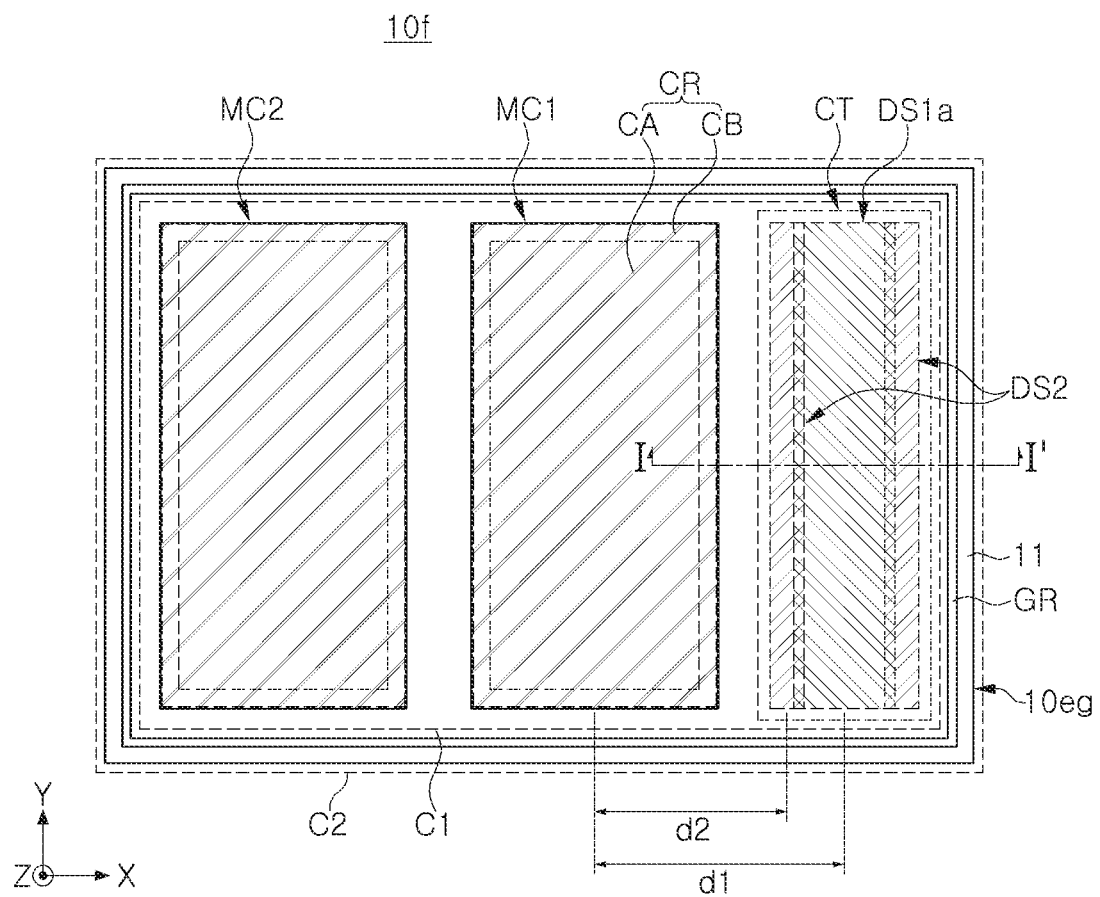
FIG. 5A is a schematic plan view of a semiconductor device according to at least one example embodiment.
Figure 5B:
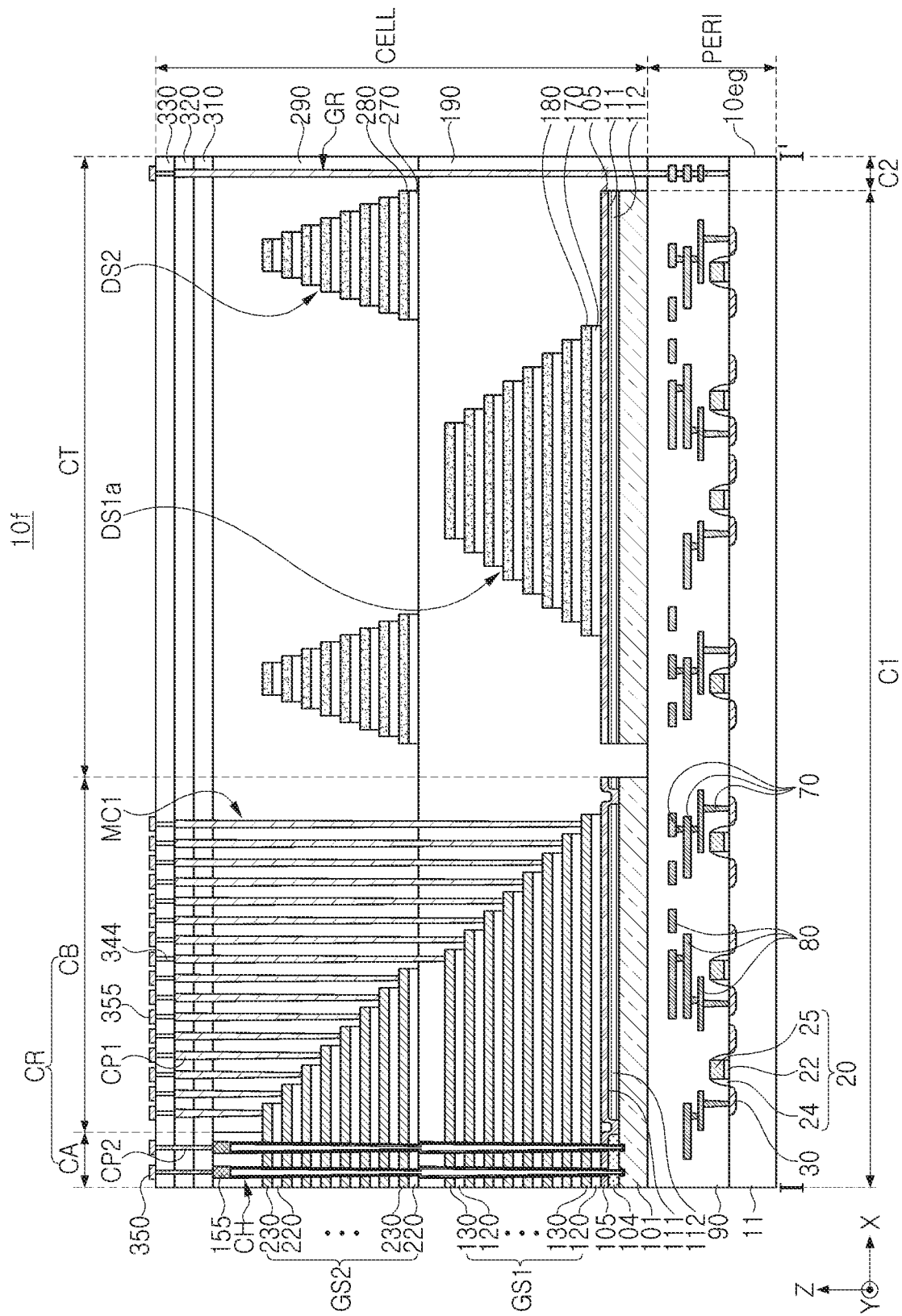
FIG. 5B is a schematic cross-sectional view of a semiconductor device according to at least one example embodiment.

FIG. 5A is a schematic plan view of a semiconductor device according to at least one example embodiment. FIG. 5B is a schematic cross-sectional view of a semiconductor device according to at least one example embodiment. FIG. 5B illustrates a cross section corresponding to FIG. 2A.

Referring to FIGS. 5A and 5B, in a semiconductor device 10f, a first dummy structure DS1a may include a first portion respectively overlapping at least two second dummy structures DS2 in the vertical direction. In this case, also, a second portion of the first dummy structure DS1a may not overlap the second dummy structures DS2 in the vertical direction.

However, according to at least one example embodiment, the first dummy structure DS1a has a size larger (e.g., a width larger) than that of the second dummy structures DS2 and/or has a more gentle or slight stair inclination (e.g., a less steep angle) than the stair inclination (e.g., stair angle) of the second dummy structures DS2 and may not completely overlap the second dummy structures DS2 in the vertical direction, but the example embodiments are not limited thereto.

Figure 6:
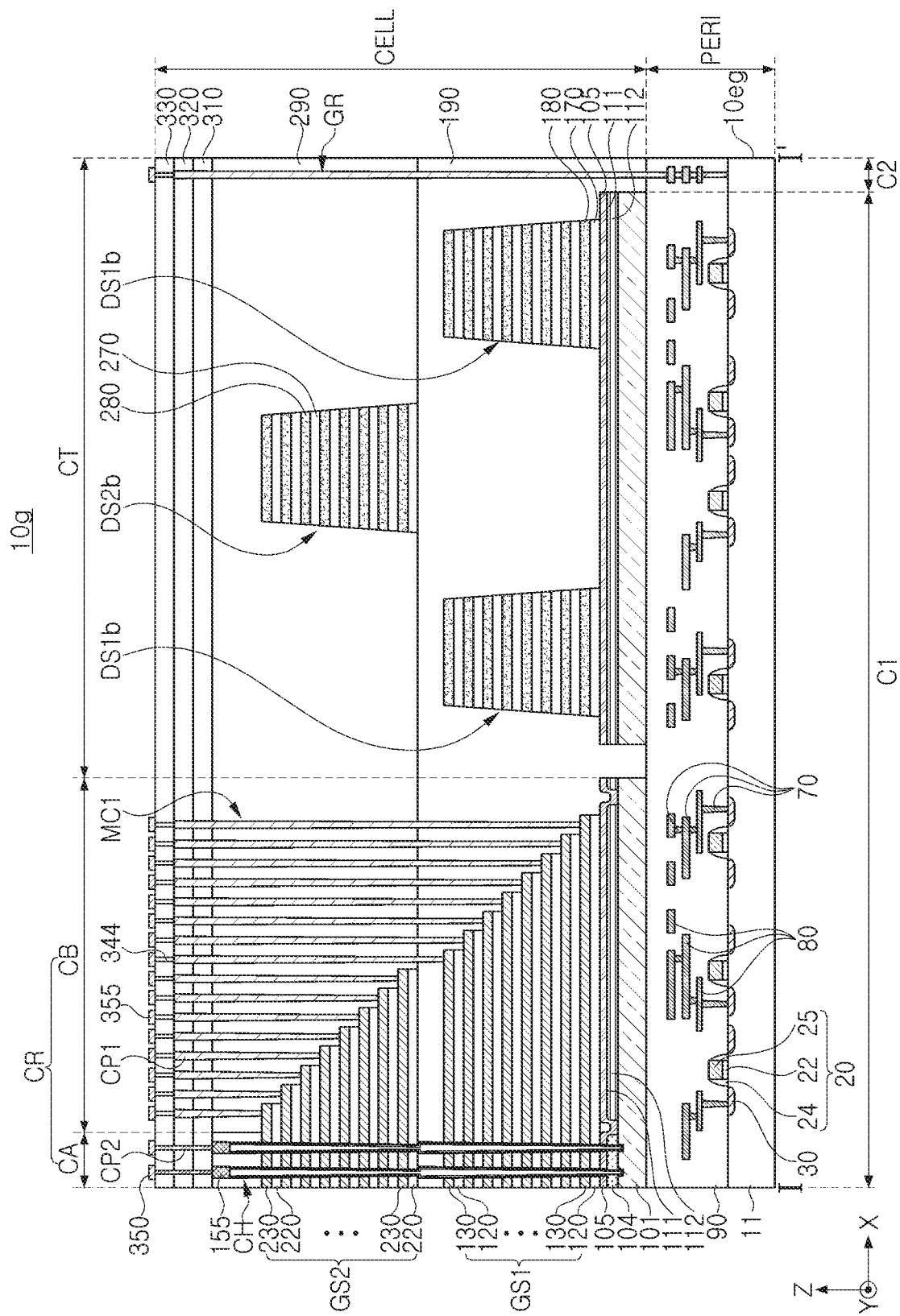
FIG. 6 is a schematic cross-sectional view of a semiconductor device according to at least one example embodiment.

FIG. 6 is a schematic cross-sectional view of a semiconductor device according to at least one example embodiment. FIG. 6 illustrates a cross section corresponding to FIG. 2A.

Referring to FIG. 6, in a semiconductor device 10g, the first dummy structure DS1b and the second dummy structure DS2b may each have side surfaces inclined with respect to the upper surface of the second substrate 101. The inclined side surfaces may be formed in a process of etching the first dummy structure DSb1 and the second dummy structure DS2b. Each of the first dummy structure DS1b and the second dummy structure DS2b may have a shape in which an upper width is smaller than a lower width. Each of the first dummy structure DS1b and the second dummy structure DS2b may have a shape of which the width decreases toward the top, but are not limited thereto. According to at least one example embodiment, the first dummy structure DS1b and the second dummy structure DS2b may have side surfaces perpendicular to the upper surface of the second substrate 101, but are not limited thereto.

The shapes of the inclined side surfaces of the first dummy structure DS1b and the second dummy structure DS2b may be equally applied to one or more of the other example embodiments of the inventive concepts.

Figure 7A:
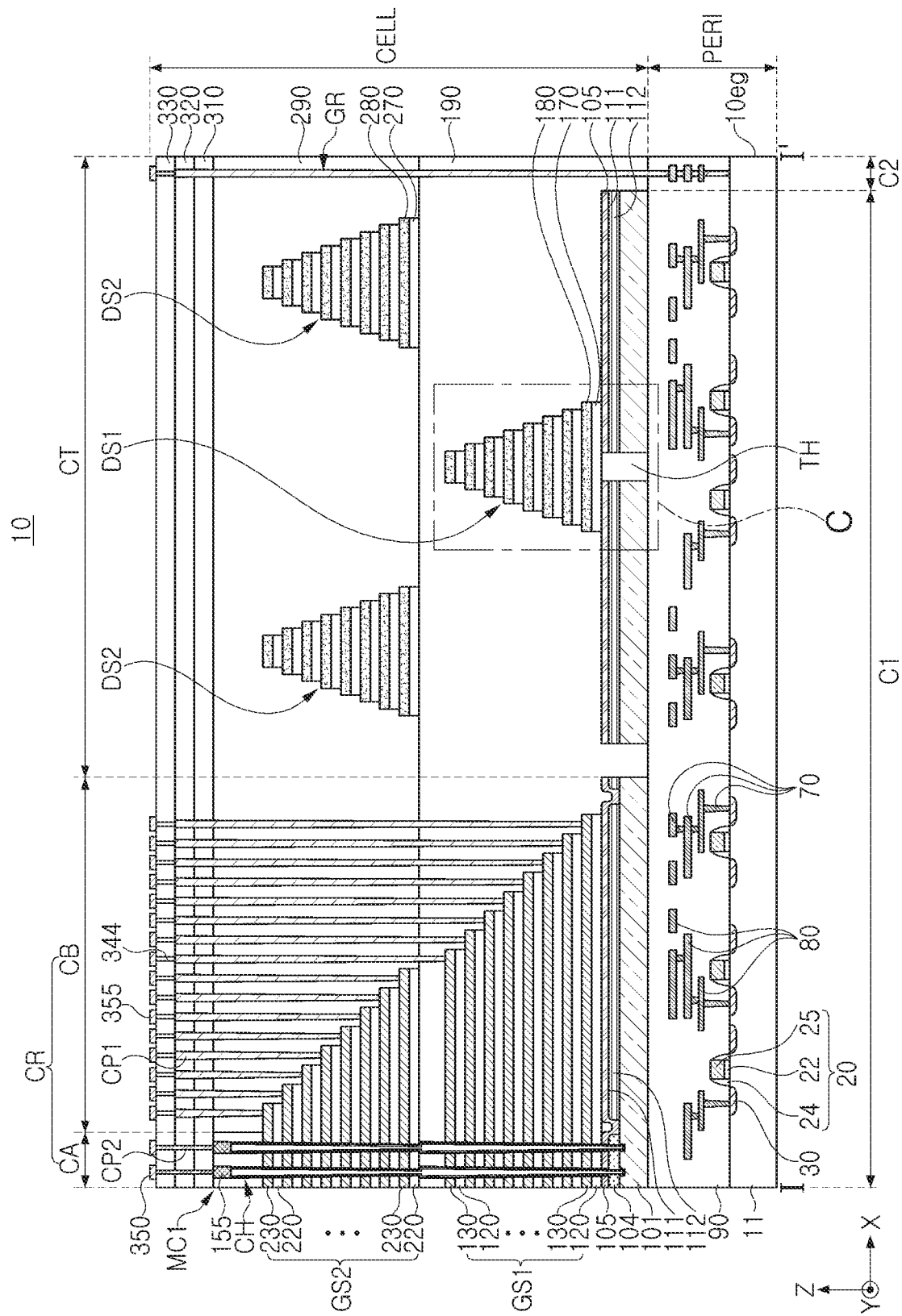
FIGS. 7A, 7B and 7C are schematic cross-sectional views of a semiconductor device according to some example embodiments.

FIG. 7A is a schematic cross-sectional view of a semiconductor device according to at least one example embodiment. A cross section of the semiconductor device is illustrated in a region different from that of FIG. 2A.

Referring to FIG. 7A, the semiconductor device 10 may include a through-region TH penetrating through the second substrate 101 and the first and second source sacrificial layers 111 and 112 in the peripheral region CT. A through-insulating layer may be in the through-region TH. At least a portion of the first dummy structure DS may be on the through-region TH, but is not limited thereto. The through-region TH may be formed by forming an insulating layer in a region in which portions of the second substrate 101 and the first and second source sacrificial layers 111 and 112 have been removed (e.g., etched), and then performing a planarization process. The through-insulating layer of the through-region TH may be formed by filling the region with the same material as that of the interlayer insulating layer 120, but is not limited thereto. The arrangement of the through-region TH may be variously changed according to one or more of the example embodiments.

Figure 7B:
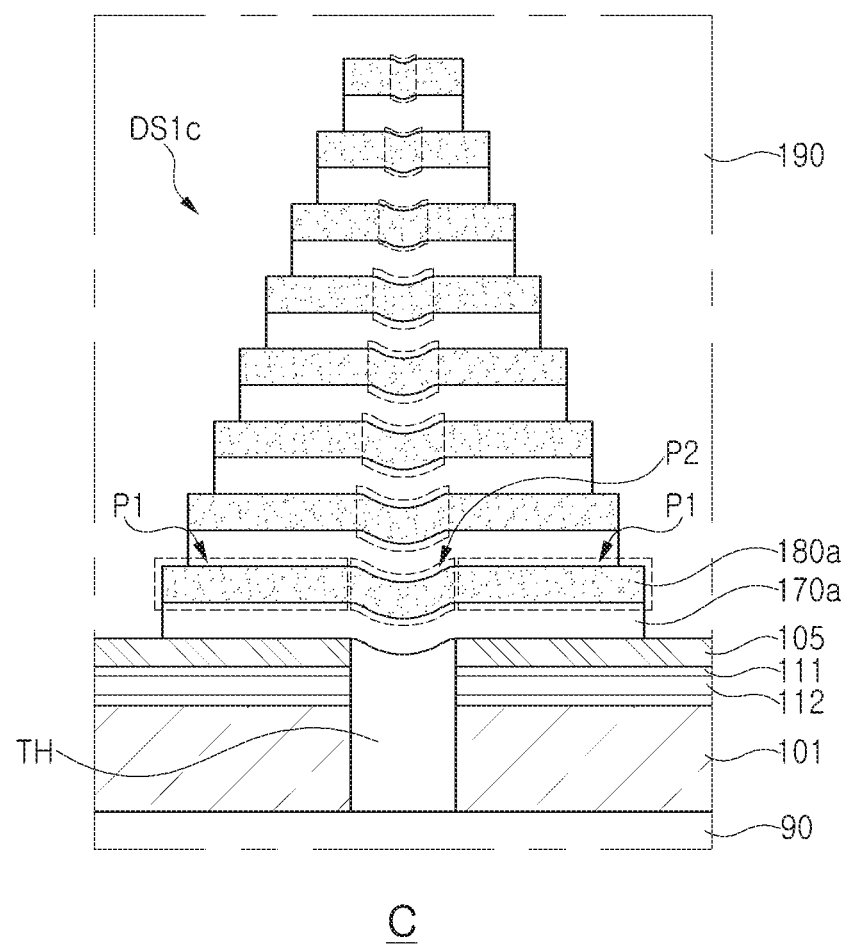

FIG. 7B is a schematic cross-sectional view of a semiconductor device according to at least one example embodiment. FIG. 7B is an enlarged view of a region corresponding to "C" of FIG. 7A.

Referring to FIG. 7B, the shape of the first dummy structure DS1c may be different from that of the previous example embodiments. A portion of the first insulating layers 170a and a portion of the second insulating layers 180a of the first dummy structure DS1c may be bent downwardly (e.g., bent down/depressed in the vertical direction). For example, each of the second insulating layers 180a may include a first portion P1 on the second substrate 101 and a second portion P2 on the through-region TH, and the second portion P2 may extend from the first portion P1 and may include a downwardly curved portion, but are not limited thereto. The second portion P2 may protrude downwardly toward the first substrate 11 than the first portion P1. The second portion P2 may include a curved portion. For example, the lower surface of the second portion P2 may be convex downward, and the upper surface of the second portion P2 may be concave downwardly, but the example embodiments are not limited thereto.

In the case of the second portions P2 of the second insulating layers 180a, the lengths of the curved portions of the second portions P2 may vary (e.g., change) toward an upper portion. The radius of curvature of the curved portions of the second portions P2 may vary (e.g., change) as the second portions P2 of the second insulating layers 180a approach an upper portion. For example, in the case of the second portions P2 of the second insulating layers 180a, the radius of curvature of the curved portions of the second portions P2 may increase toward an upper portion, but the example embodiments are not limited thereto.

Similar to the second insulating layers 180a, the first insulating layers 170a may also include portions that bend downwardly or protrude downwardly, but the example embodiments are not limited thereto. In the at least one example embodiment of FIG. 7B, the structure of the first dummy structure DS1c may appear in the case in which the through-region TH is below the first dummy structure DS1c. The structure of the first dummy structure DS1c may be formed due to stress caused by an upper structure on the first dummy structure DS1c. The shape of the first dummy structure DS1c of this example embodiment may be equally applied to one or more of the other example embodiments of the inventive concepts.

Figure 7C:
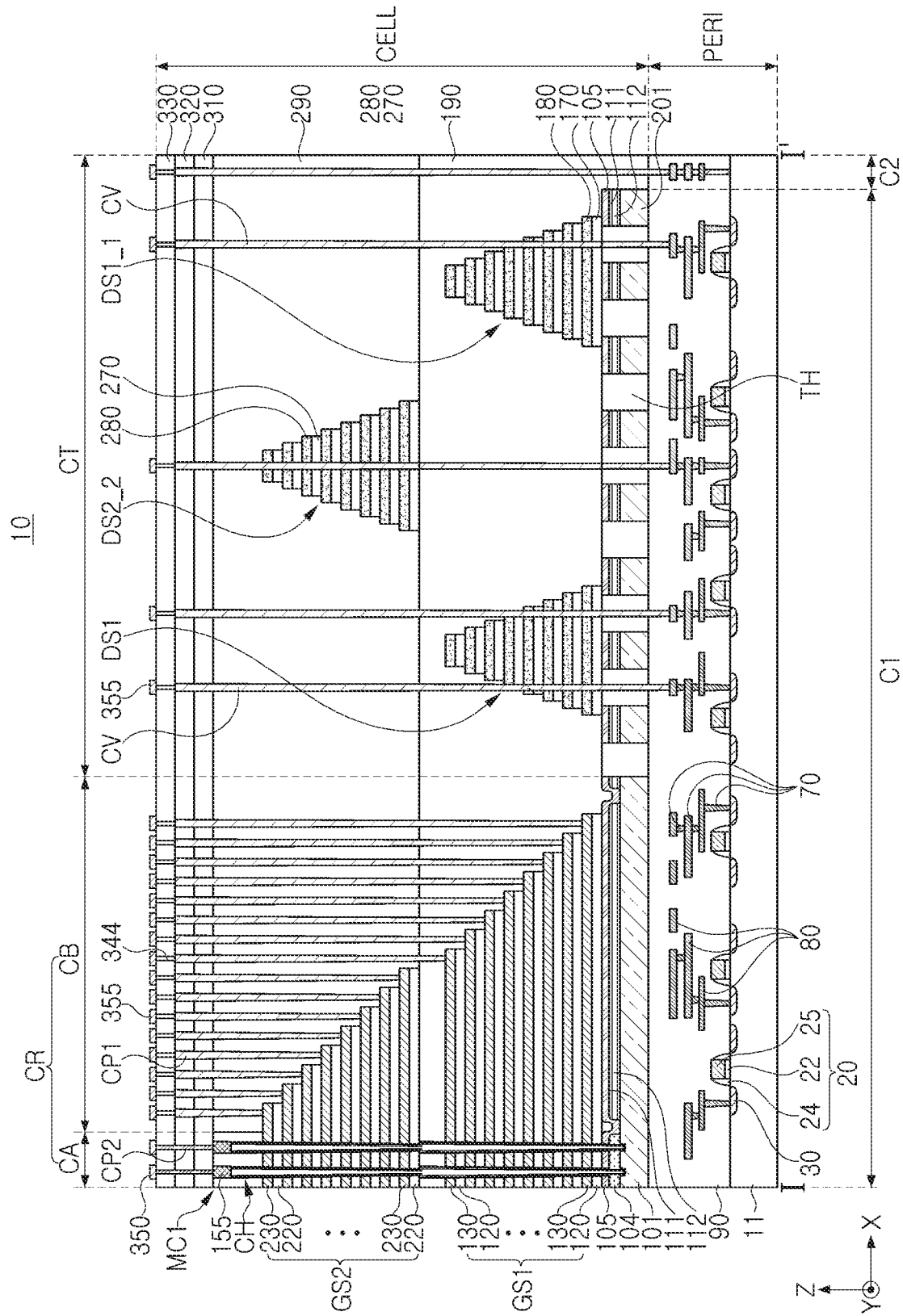

FIG. 7C is a schematic cross-sectional view of a semiconductor device according to at least one example embodiment. FIG. 7C illustrates a cross-section of the semiconductor device in a region different from that of FIG. 2A.

Referring to FIG. 7C, the semiconductor device 10 may further include through-contact plugs CV. A plurality of through-regions TH penetrating through the second substrate 101 may be further included. Through-insulating layers penetrating through the second substrate 101 may be in the plurality of through-regions TH. The through-contact plugs CV may penetrate through the first and second capping insulating layers 190 and 290 and the through-insulating layers and extend to the peripheral circuit region PERI, but are not limited thereto. The through-contact plugs CV may penetrate through at least one of the first dummy structure DS1 and the second dummy structure DS2 in the vertical direction, and may penetrate through the second substrate 101 in the vertical direction, but are not limited thereto. The through-contact plugs CV may be electrically connected to the circuit elements 20 of the peripheral circuit region PERI, etc. For example, the through-contact plugs CV may be connected to a portion of the circuit wiring lines 80, but is not limited thereto.

Figure 8A:
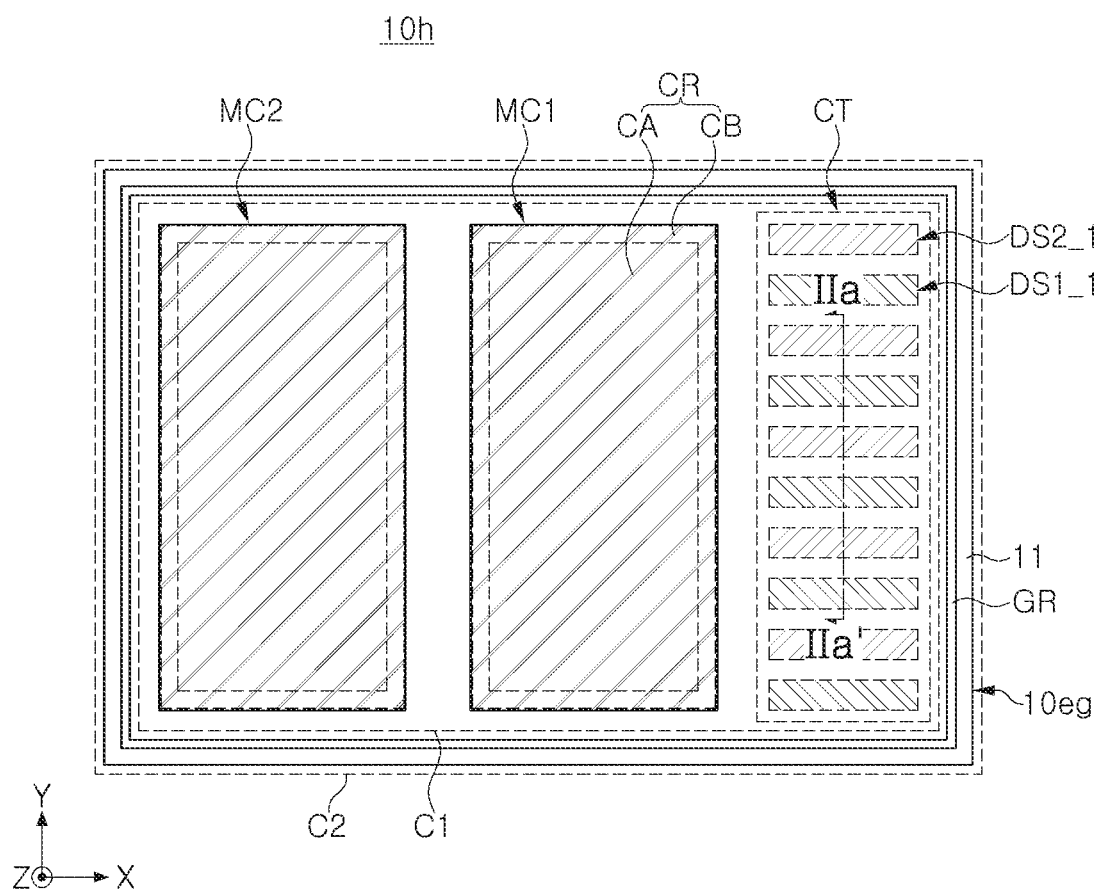
FIG. 8A is a schematic plan view of a semiconductor device according to at least one example embodiment.

FIG. 8A is a schematic plan view of a semiconductor device according to at least one example embodiment. FIG. 8A illustrates a region corresponding to FIG. 1.

Figure 8B:
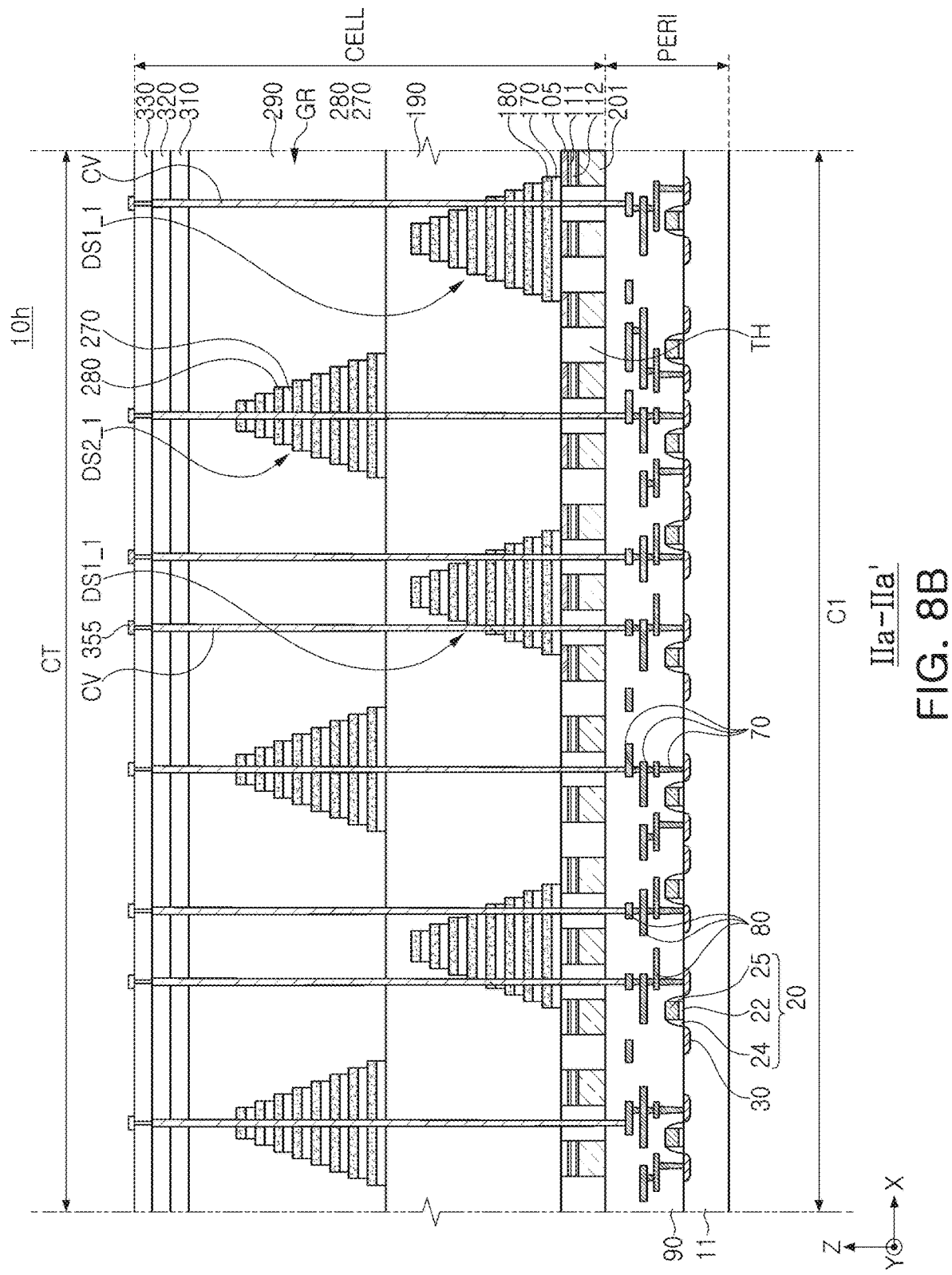
FIG. 8B is a schematic cross-sectional view of a semiconductor device according to at least one example embodiment.

FIG. 8B is a schematic cross-sectional view of a semiconductor device according to at least one example embodiment. FIG. 8B illustrates a cross-section taken along line IIa-IIa' of FIG. 8A.

Referring to FIGS. 8A and 8B, in the case of a semiconductor device 10h, the arrangement of the first dummy structures DS1_1 and the second dummy structures DS2_1 in a plane may be different from that of the at least one example embodiment of FIG. 1. In the at least one example embodiment of FIG. 1, in a plan view, the first and second dummy structures DS1 and DS2 each have a shape in which a length in the Y direction is greater than a length in the X direction, and are spaced apart from each other in the X direction so as to not overlap each other in the vertical direction. In the at least one example embodiment of FIG. 8A, in a plan view, the first and second dummy structures DS1_1 and DS2_1 each have a shape in which a length in the X direction is greater than a length in the Y direction, and may be spaced apart from each other in the Y direction so as to not overlap each other in the vertical direction. In the at least one example embodiment of FIG. 1, the first and second dummy structures DS1 and DS2 are alternately arranged in the X direction in the plan view, but in the at least one example embodiment of FIG. 8A, the first and second dummy structures DS1_1 and DS2_1 may be alternately arranged in the Y direction in the plane. The first and second dummy structures DS1_1 and DS2_1 may be in a greater number than in the at least one example embodiment of FIG. 1, but are not limited thereto.

Figure 9A:
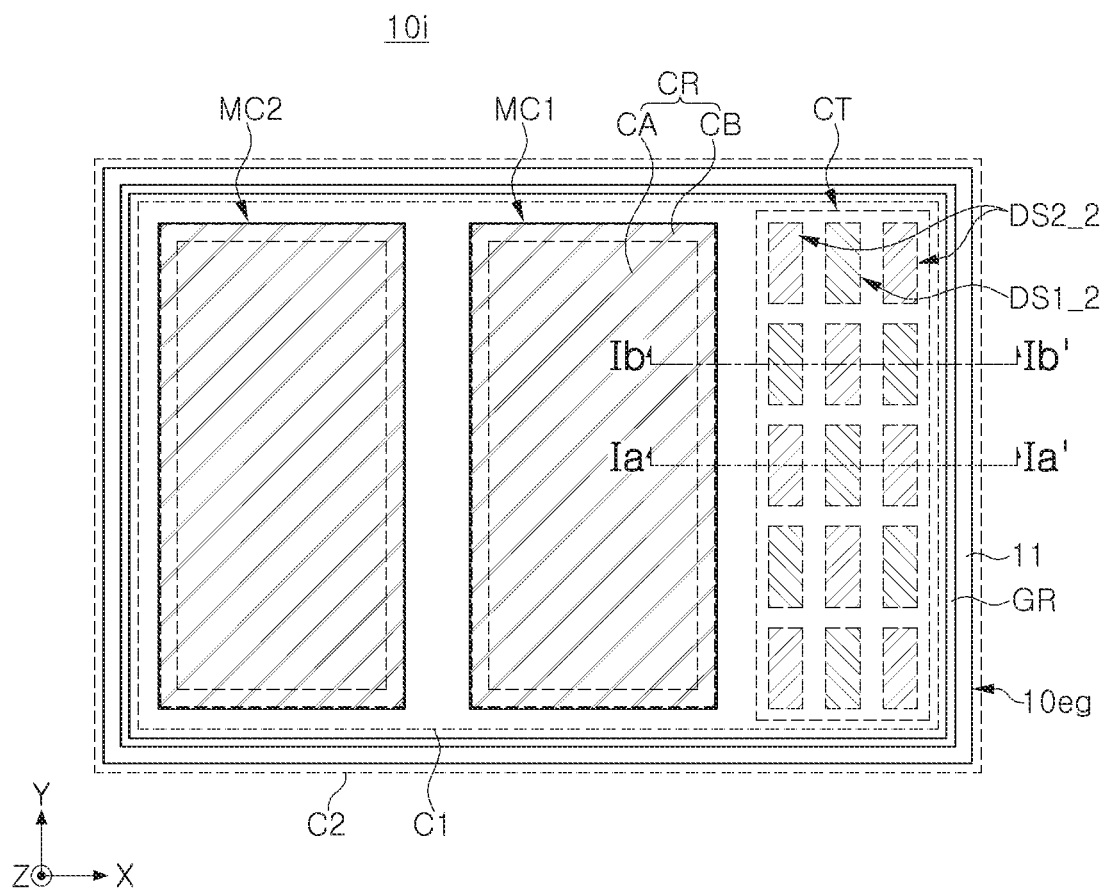
FIGS. 9A and 9B are schematic plan views of a semiconductor device according to some example embodiments.

FIG. 9A is a schematic plan view of a semiconductor device according to at least one example embodiment. FIG. 9A illustrates a region corresponding to FIG. 1.

Referring to FIG. 9A, in a semiconductor device 10i, arrangements of a first dummy structures DS1_2 and a second dummy structures DS2_2 may be different from that of the at least one example embodiment of FIG. 1. In the at least one example embodiment of FIG. 9A, in a plan view, the first and second dummy structures DS1_2 and DS2_2 are arranged in a zigzag manner (e.g., an alternating manner, etc.), and may not overlap each other in a vertical direction. For example, in a plane, the first and second dummy structures DS1_2 and DS2_2 may be alternately arranged in the X direction, and may be alternately arranged in the Y direction. In a plan view, the first and second dummy structures DS1_2 and DS2_2 may be spaced apart from each other in the X direction and may be spaced apart from each other in the Y direction, but the example embodiments are not limited thereto.

Cross-sections cut along lines Ia-Ia' and Ib-Ib' illustrated in FIG. 9A may correspond to FIGS. 2A and 3A, respectively.

Figure 9B:
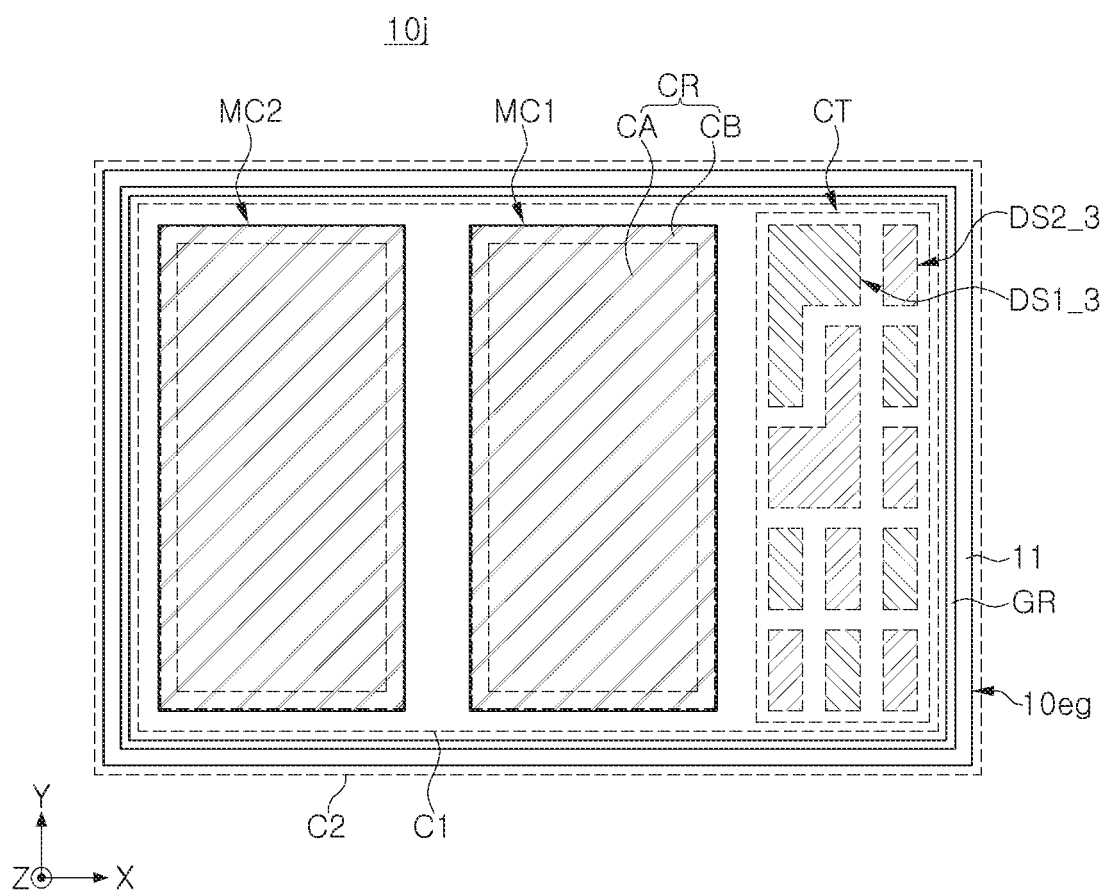

FIG. 9B is a schematic plan view of a semiconductor device according to at least one example embodiment. FIG. 9B illustrates a region corresponding to FIG. 1.

Referring to FIG. 9B, the arrangement of a first dummy structure DS1_3 and a second dummy structure DS2_3 in a plan view of a semiconductor device 10j may be different from that of the at least one example embodiment of FIG. 1. In the at least one example embodiment of FIG. 9B, in a plan view, the first and second dummy structures DS1_3 and DS2_3 may not overlap each other in the vertical direction and may be arranged without having a certain rule (e.g., a desired arrangement) in the X direction and/or the Y direction. Some of the first dummy structures DS1_3 may have a pattern having a different shape from that of the other first dummy structures DS1_3. For example, some of the first dummy structures DS1_3 may have a shape that is bent in one direction in a plan view, etc. The shape of the pattern of the first and second dummy structures DS1_3 and DS2_3 in the plan view may be variously changed from the illustrated one, and are not limited thereto.

Figure 10A:
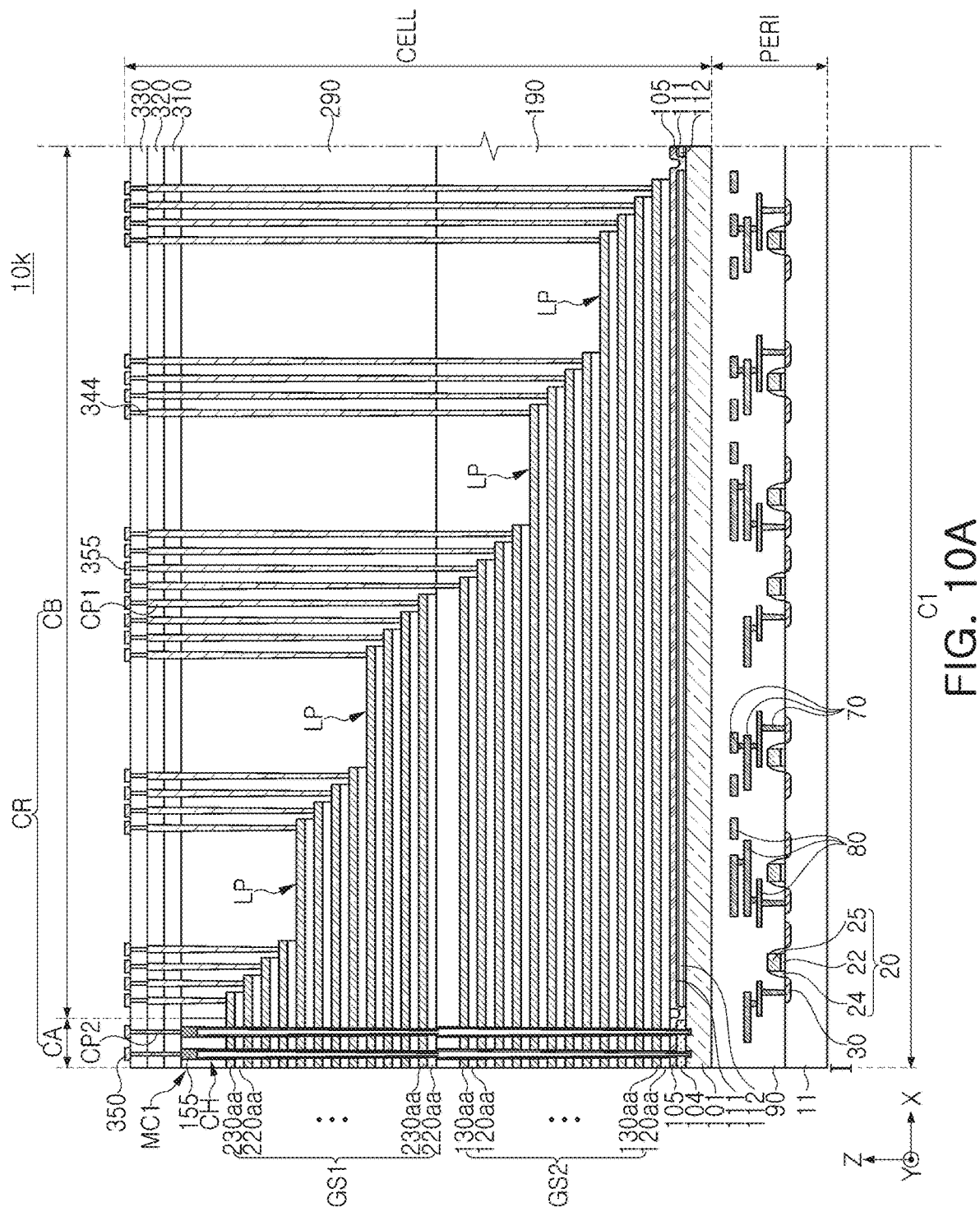
FIGS. 10A and 10B are schematic cross-sectional views of a semiconductor device according to some example embodiments.

FIG. 10A is a schematic cross-sectional view of a semiconductor device according to at least one example embodiment. FIG. 10A illustrates a region corresponding to a portion indicated by "A" in FIG. 2A.

Figure 10B:
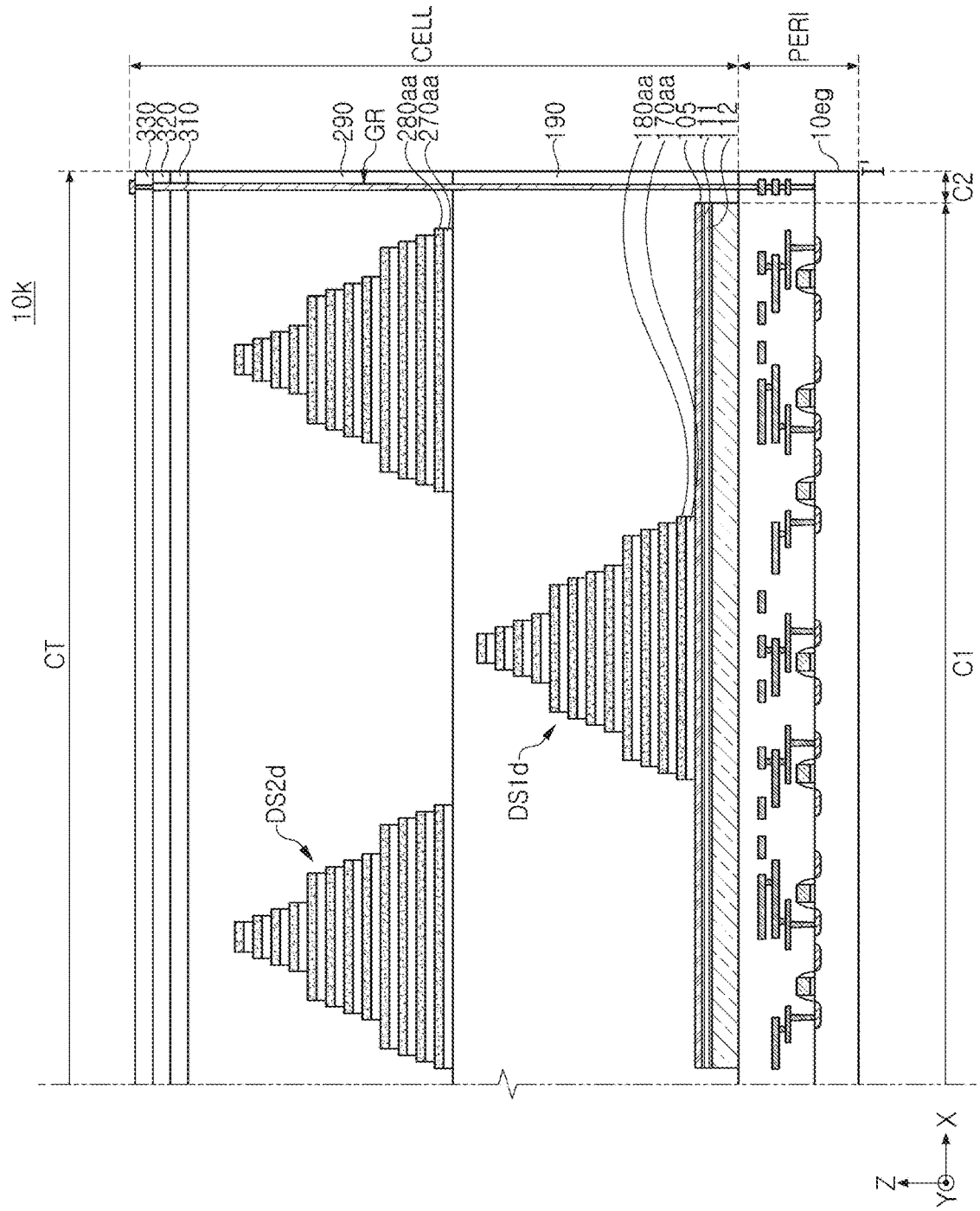

FIG. 10B is a schematic cross-sectional view of a semiconductor device according to at least one example embodiment. FIG. 10B illustrates a region corresponding to a portion marked by "B" in FIG. 2A.

Referring to FIGS. 10A and 10B, in a semiconductor device 10k, cross-sectional shapes of memory stack structures GS1 and GS2 and dummy structures DS1d and DS2d may be different from those of the at least one example embodiment of FIG. 2A.

First, referring to FIG. 10A, in first gate electrodes 130aa of the first stack structure GS1, for example, a plurality of gate electrodes, e.g., four gate electrodes, form one gate group to form a stepped structure between the gate groups in the X direction. The four gate electrodes comprising a single gate group may each form a stepped structure in the X direction. Similar to the first gate electrodes 130aa, the second gate electrodes 230aa of the second stack structure GS2 may form a single gate group while forming a stepped structure in the X direction. A first interlayer insulating layers 120aa and a second interlayer insulating layers 220aa may also have similar structures, but are not limited thereto. In the first stack structure GS1 and the second stack structure GS2, respective uppermost gate electrodes of the gate groups may have a pad region LP extending relatively long. However, the example embodiments, are not limited thereto, and different numbers of gate electrodes may comprise a single gate group, etc.

Next, referring to FIG. 10B, second and fourth insulating layers 180aa and 280aa of the dummy structures DS1d and DS2d may have a stepped structure similar to the first and second gate electrodes 130aa and 230aa. For example, in the second insulating layers 180aa, a plurality of insulating layers, e.g., four insulating layers, may form one dummy insulating structure while forming a stepped structure between the dummy insulating structures in the X direction, but the example embodiments are not limited thereto. Four insulating layers included in a single dummy insulating structure may respectively form a stepped structure in the X direction, but the example embodiments are not limited thereto. Similar to the second insulating layers 270aa, a plurality of fourth insulating layers, e.g., the fourth insulating layers 280aa, of the second dummy structure DS2d may form a single dummy insulating structure to form a stepped structure in the X direction, but the example embodiments are not limited thereto. First insulating layers 170aa and third insulating layers 270aa may also have a structure similar thereto, but are not limited thereto.

Figure 11A:
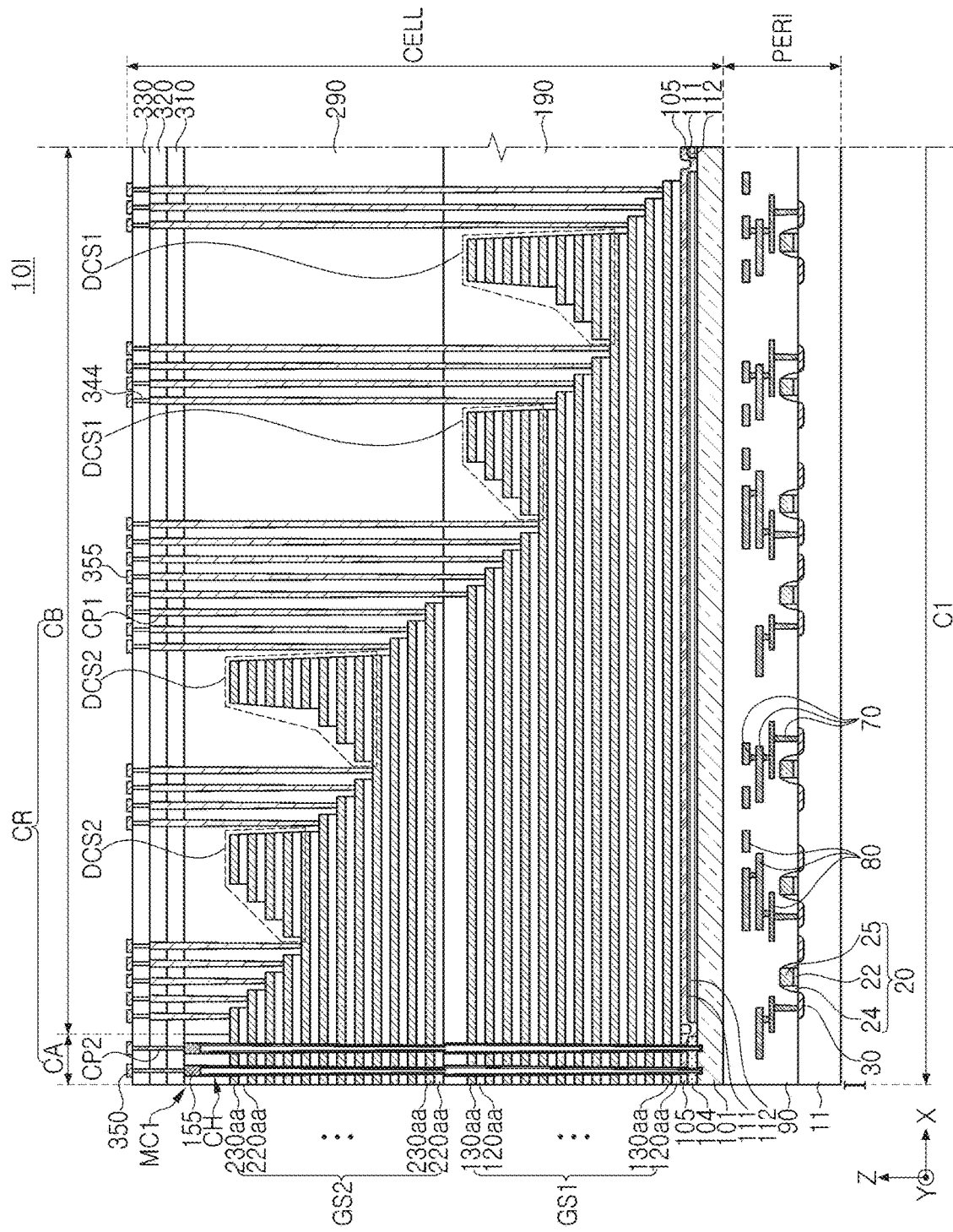
FIGS. 11A and 11B are schematic cross-sectional views of a semiconductor device according to some example embodiments.

FIG. 11A is a schematic cross-sectional view of a semiconductor device according to at least one example embodiment. FIG. 11A illustrates a region corresponding to a portion indicated by "A" in FIG. 2A.

Figure 11B:
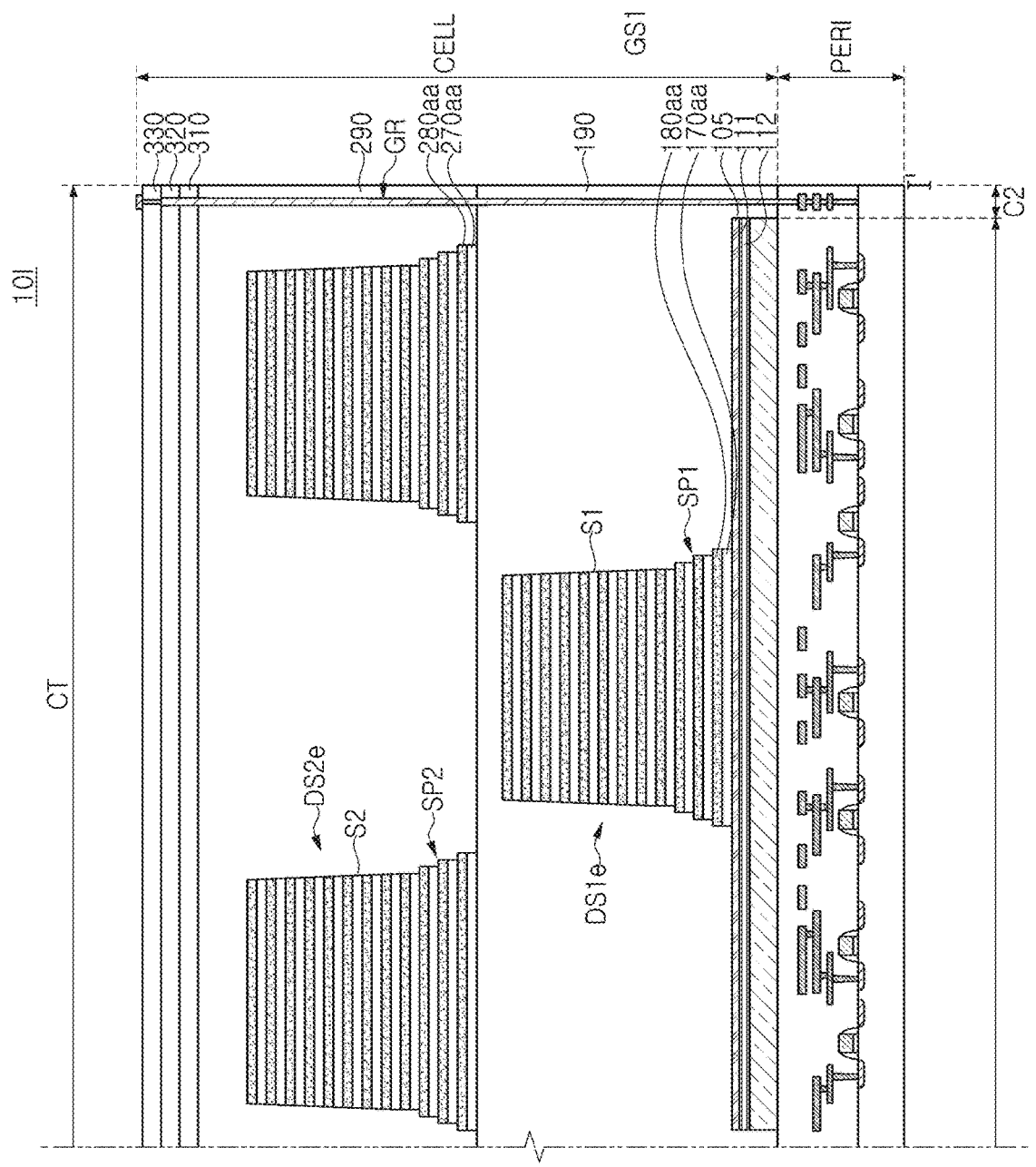

FIG. 11B is a schematic cross-sectional view of a semiconductor device according to at least one example embodiment. FIG. 11B illustrates a region corresponding to a portion marked by "B" in FIG. 2A.

Referring to FIGS. 11A and 11B, in a semiconductor device 10l, the cross-sectional shapes of the memory stack structures GS1 and GS2 and the dummy structures DS1e and DS2e may be different from those of the at least one example embodiment of FIG. 2A.

First, referring to FIG. 11A, compared to the at least one example embodiment of FIG. 10A, the first stack structure GS1 may further include a first dummy cell structure DCS1, and the second stack structure GS2 may further include a second dummy cell DCS2, but the example embodiments are not limited thereto.

This example embodiment may be the same as the structure in which the first dummy cell structures DCS1 are on the pad regions LP of the uppermost gate electrodes in the at least one example embodiment of FIG. 10A. Each of the first dummy cell structures DCS1 may be formed of first interlayer insulating layers 120aa and first gate electrodes 130aa, etc. At least one of the first dummy cell structures DCS1 may have one side inclined with respect to the upper surface of the first substrate 101, and the other side having a stepped structure, etc. At least one of the first dummy cell structures DCS1 may have one side inclined with respect to the upper surface of the first substrate 101, and the other side having a stepped structure together with the inclined side. The second dummy cell structures DCS2 of the second stack structure GS2 may also have a structure similar to the first dummy cell structures DCS1.

Next, referring to FIG. 11B, compared to the at least one example embodiment of FIG. 10B, at least one side of the first dummy structure DS1e may include an inclined (e.g., angled) portion 51 and a step portion SP1 together. For example, the side surfaces 51 of the upper region of the first dummy structure DS1 may be inclined (e.g., angled), and the lower region of the first dummy structure DS1e may have the step portion SP1 in which steps of the first and second insulating layers 170aa and 180aa are lowered in one direction. At least a portion of the first dummy structure DS1e is formed in the same process operation as the first dummy cell structure DCS1, to have an inclined side the same and/or substantially the same as the inclined side of the first dummy cell structure DCS1. The second dummy structures DS2e may have a structure similar to the first dummy structure DS1e, and the second dummy structures DS2e may include a portion S2 provided as at least one side of the second dummy structures are inclined (e.g., angled), and a stepped portion SP2. The first and second dummy structures DS1e and DS2e may not overlap in the vertical direction.

Figure 12:
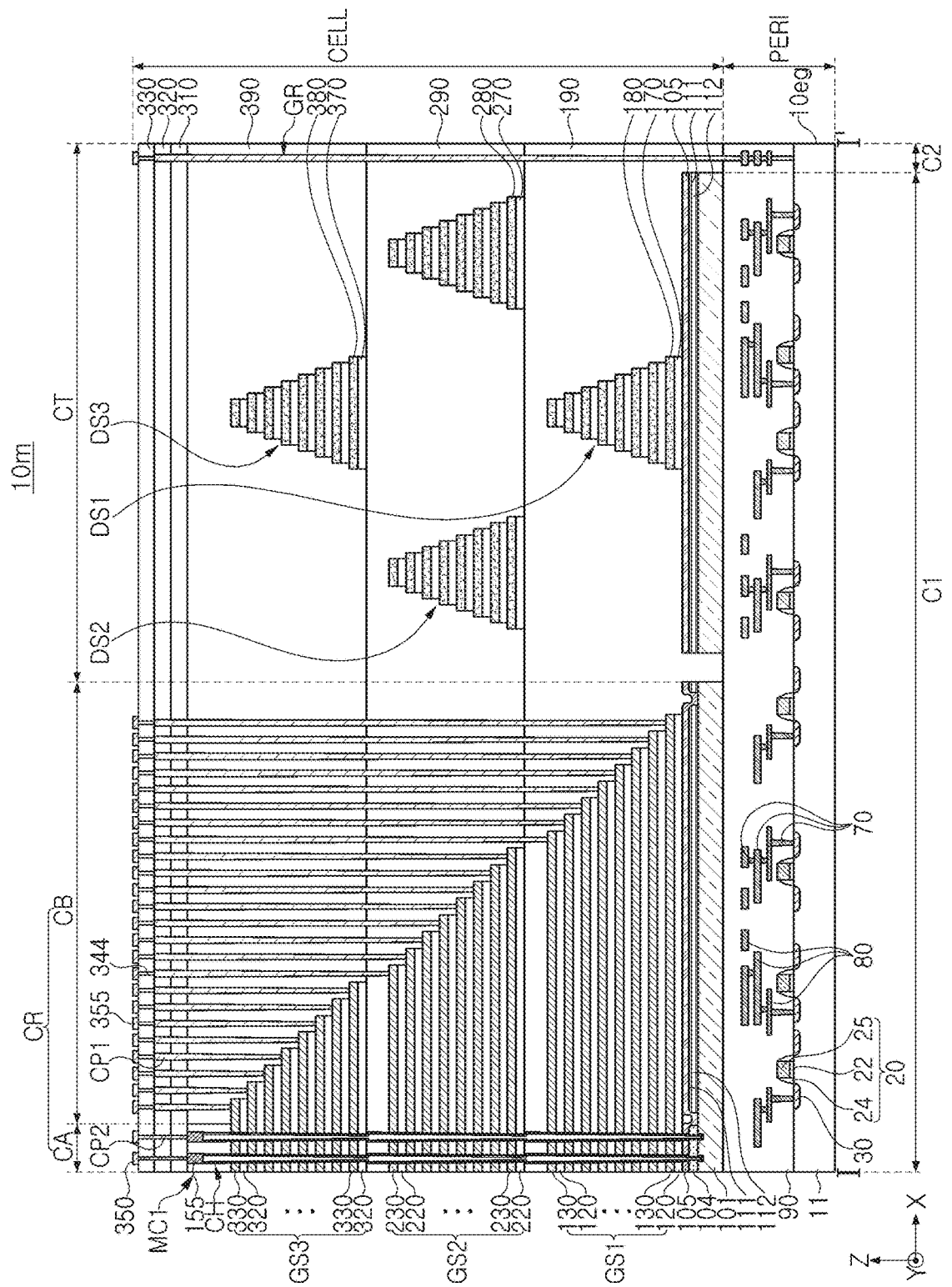
FIG. 12 is a schematic cross-sectional view of a semiconductor device according to at least one example embodiment.

FIG. 12 is a schematic cross-sectional view of a semiconductor device according to at least one example embodiment. FIG. 12 illustrates a region corresponding to FIG. 2A.

Referring to FIG. 12, a memory cell region CELL of a semiconductor device 10m may further include a third stack structure GS3 and a third dummy structure DS3. In at least some of the foregoing example embodiments, the stack structures of the memory cell structure have a two-tiered structure, but the at least one example embodiment of FIG. 12 illustrates a case in which the stack structures of the memory cell structure have a three-tiered structure. The semiconductor device 10m may further include a third capping insulating layer 390, but is not limited thereto.

A third stack structure MC3 may include third interlayer insulating layers 320 and third gate electrodes 330 that are alternately stacked. The description of the third interlayer insulating layers 320 may be similar to the descriptions of the first and second interlayer insulating layers 120 and 220, and the description of the third gate electrodes 330 may be similar to the descriptions of the first and second gate electrodes 120. However, in the description of the first and second gate electrodes 130 and 230, the description of the gate electrode of the upper erase control transistor and the gate electrode of the upper string selection transistor may be applied to upper third gate electrodes 330 among the third gate electrodes 330, etc.

The third dummy structure DS3 may be on the first and second dummy structures DS1 and DS2. The third dummy structure DS3 may be spaced apart from the third stack structure MC3 of the memory cell structure MC1. The third dummy structure DS3 may be referred to as a 'third insulating structure'. The third dummy structure DS3 may include fifth insulating layers 370 and sixth insulating layers 380 alternately stacked on the second substrate 101, but the example embodiments are not limited thereto. The third dummy structure DS3 may have stepped steps, but is not limited thereto. The structure of the third dummy structure DS3 may be similar to the description of the structure of the first and second dummy structures DS1 and DS2, but is not limited thereto.

In at least one example embodiment, the first dummy structure DS1 does not overlap the second dummy structure DS2 in the vertical direction, and the third dummy structure DS3 does not overlap the second dummy structure DS2 in the vertical direction. The first dummy structure DS1 and the third dummy structure DS3 may partially overlap in the vertical direction, but the example embodiments are not limited thereto.

The channel structures CH and the separation structures MS may penetrate through the plurality of memory cell structures, e.g., the first to third memory cell structures MC1, MC2 and MC3, etc. The plurality of upper insulating layers, e.g., upper insulating layers 310, 320 and 330, etc., the bit line 350, and the upper wirings 355 may be on the third memory cell structure MC3 and the third capping insulating layer 390. The gate contact plugs CP1 and the channel contact plugs CP2 may be on the third memory cell structure MC3 to be connected to the third gate electrodes 130 and the channel structures CH.

The structure of FIG. 12 may also be applied to example embodiments in which stack structures of a memory cell structure have a multi-stack structure of three or more stages. In this case, dummy structures adjacent to each other in the upper/lower part may also be so as not to overlap in the vertical direction, etc.

Figure 13:
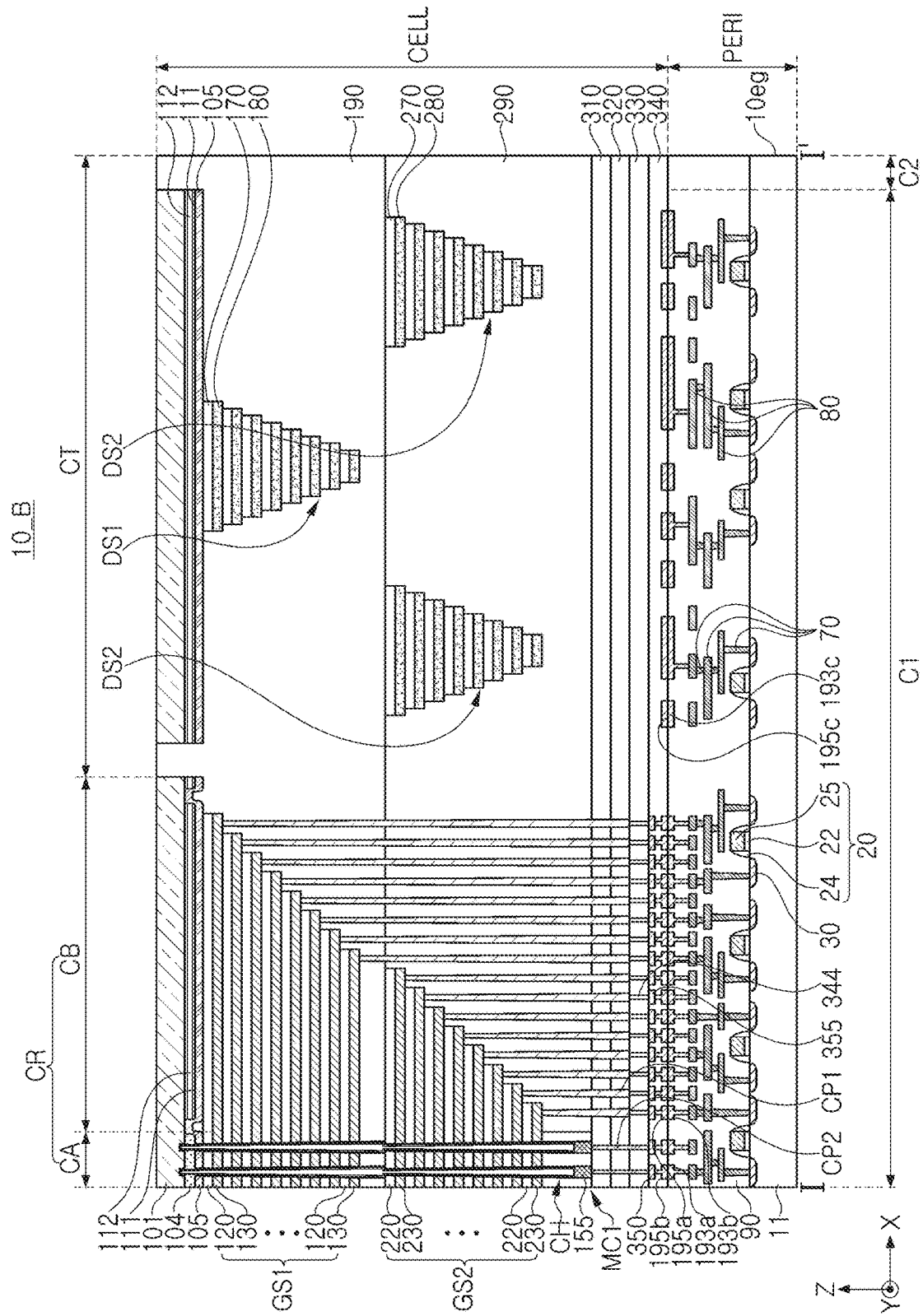
FIG. 13 is a schematic cross-sectional view of a semiconductor device according to at least one example embodiment.

FIG. 13 is a schematic cross-sectional view of a semiconductor device according to at least one example embodiment. FIG. 13 illustrates a region corresponding to FIG. 2A.

Referring to FIG. 13, a semiconductor device 10_B may have a chip to chip (C2C) structure. The C2C structure may indicate a structure in which an upper chip including a cell region CELL is fabricated on a first wafer, a lower chip including a peripheral circuit region PERI is fabricated on a second wafer different from the first wafer, and then the upper chip and the lower chip are connected to each other by a bonding method. For example, the bonding method may refer to a method of electrically connecting a bonding metal formed on an uppermost metal layer of an upper chip to a bonding metal formed on an uppermost metal layer of a lower chip, but is not limited thereto. For example, when the bonding metal is formed of copper (Cu), the bonding method may be a Cu—Cu bonding method, and the bonding metal may also be formed of aluminum or tungsten, but the example embodiments are not limited thereto.

The semiconductor device 10_B may further include a first lower bonding structure 193a and a first upper bonding structure 195a in a cell array region CA, a second lower bonding structure 195b and a second upper bonding structure 195b in a connection region CB, and a third lower bonding structure 193c and a third upper bonding structure 195c in a peripheral region CT.

In the cell array region CA, the bit line 350 may be electrically connected to the circuit elements 20 providing a page buffer in the peripheral circuit region PERI, but the example embodiments are not limited thereto. In at least one example embodiment, the bit line 350 may be connected to the first upper bonding structure 195a in the peripheral circuit region PERI, and the first upper bonding structure 195a may be connected to the first lower bonding structure 193a connected to the circuit elements 20 of the page buffer through circuit wires 80, but is not limited thereto.

In the connection region CB, the gate contact plugs CP2 may be connected to the peripheral circuit region PERI through the second upper bonding structure 195b of the cell region CELL and the second lower bonding structure 193b of the peripheral circuit region PERI. For example, the gate contact plugs CP2 may be electrically connected to the circuit elements 20 providing a row decoder in the peripheral circuit region PERI, but the example embodiments are not limited thereto. In at least one example embodiment, the operating voltage of the circuit elements 20 providing the row decoder may be different from the operating voltage of the circuit elements 20 providing the page buffer. For example, the operating voltage of the circuit elements 20 providing the page buffer may be greater than the operating voltage of the circuit elements 20 providing the row decoder, but are not limited thereto.

Figure 14:
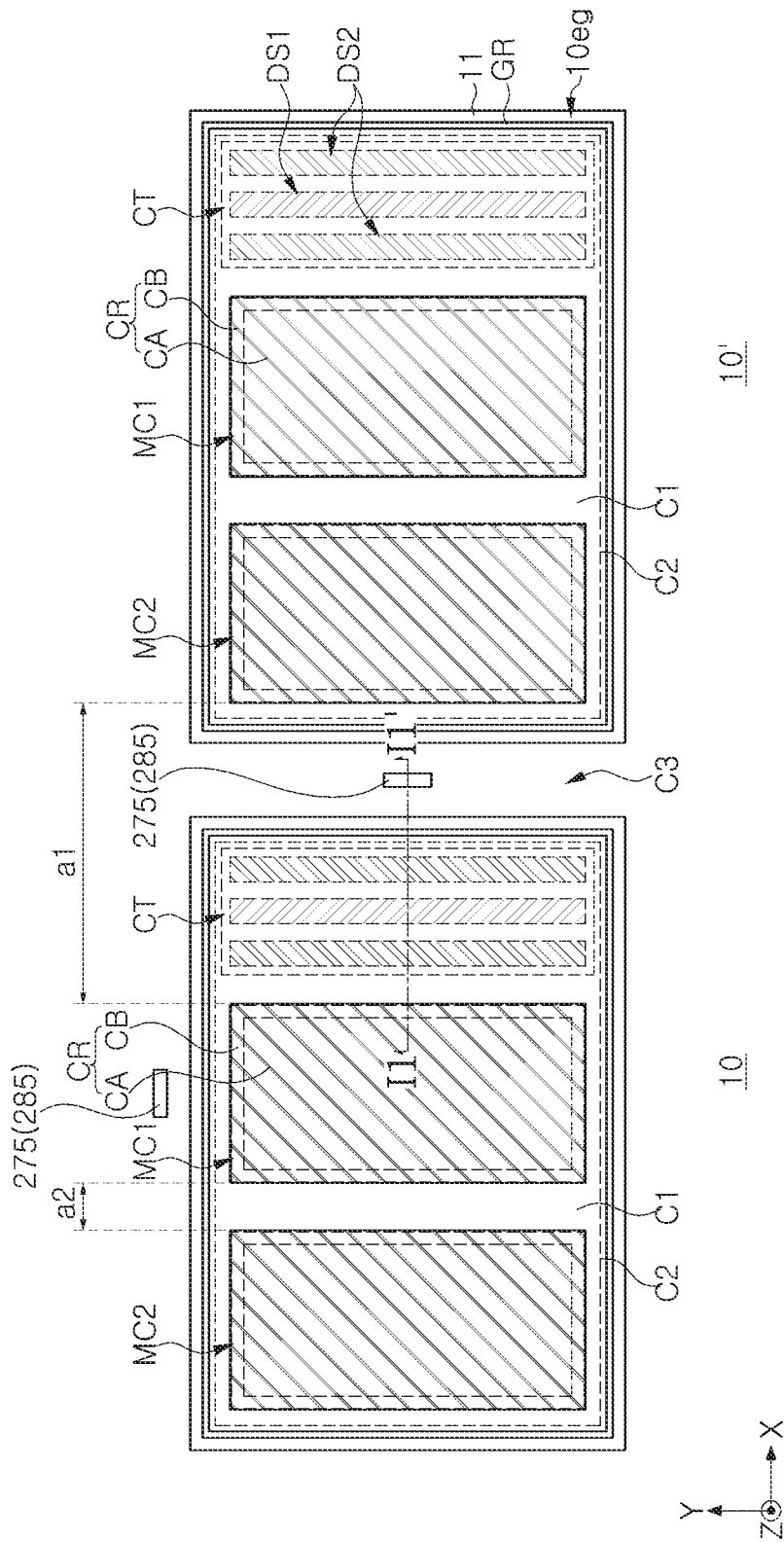
FIG. 14 is a schematic plan view illustrating a method of manufacturing a semiconductor device according to at least one example embodiment.

FIG. 14 is a schematic plan view illustrating a method of manufacturing a semiconductor device according to at least one example embodiment.

Referring to FIG. 14, by the first and second dummy structures DS1 and DS2, a gap between stack structures included in a memory cell, between adjacent semiconductor devices, may be uniform and/or substantially uniform (e.g., +/−10%). For example, the first memory cell structure MC1 of the semiconductor device 10 and the second memory cell structure MC2 of the semiconductor device 10' adjacent thereto may have a desired first interval a1 therebetween. In the semiconductor device 10, the first and second memory cell structures MC1 and MC2 may be at a second interval a2 smaller than the first interval a1. According to at least one example embodiment of the inventive concepts, the first and second dummy structures DS1 and DS2 may be on at least one side of a stack structure included in a memory cell of one semiconductor device, thereby obtaining an effect of reducing the first gap a1.

By disposing the first dummy structure DS1, in one memory stack structure (GS1, GS2), the process spread of the stepped structure of the first gate electrodes 130 and 230 in both side connection regions CB in the X direction may be significantly reduced due to the reduction of the first gap a1.

FIGS. 15A, 15B, 15C and 15D are schematic cross-sectional views illustrating a method of manufacturing a semiconductor device according to some example embodiments. FIGS. 9A to 9D illustrate regions corresponding to a cross section taken along line I1-I1' of FIG. 14, respectively, to illustrate a method of manufacturing a semiconductor device.

Figure 15A:
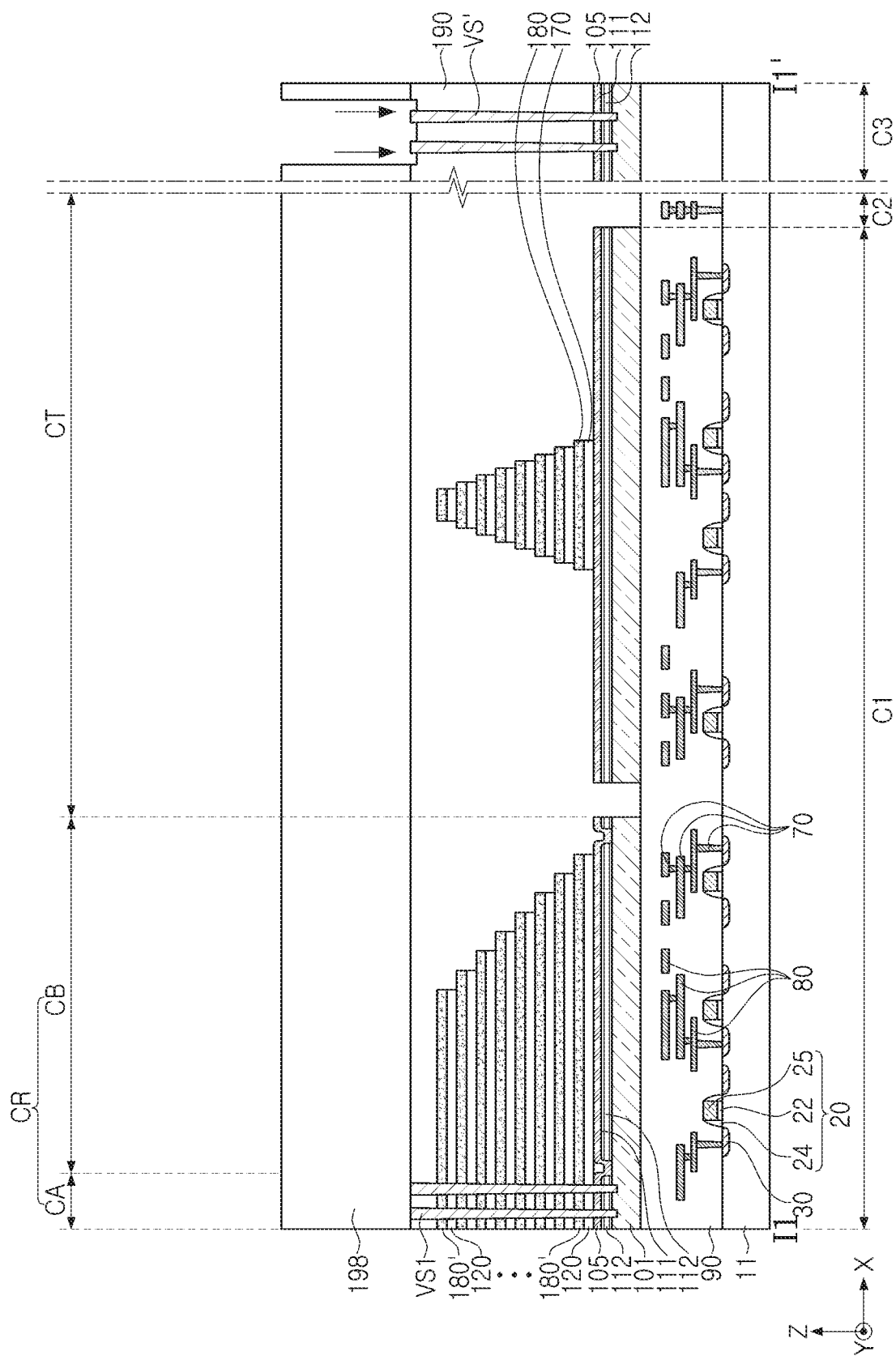
FIGS. 15A, 15B, 15C and 15D are schematic cross-sectional views illustrating a method of manufacturing a semiconductor device according to some example embodiments.

Referring to FIG. 15A, a peripheral circuit region PERI (see FIG. 2A) including circuit elements 20, circuit contact plugs 70, and/or circuit wiring lines 80, etc., may be formed on a first substrate 11. A second substrate 101 is formed, first and second source sacrificial layers 111 and 112, and a second conductive layer 105 are formed, first sacrificial insulating layers 180' and first interlayer insulating layers 120 are alternately stacked, and first insulating layers 170 and second insulating layers 180 may be alternately stacked, but the example embodiments are not limited thereto. A first capping insulating layer 190 may be formed, and a first vertical structure VS1 may be formed to penetrate through the first sacrificial insulating layers 180' and the first interlayer insulating layers 120. A sacrificial vertical structure VS' penetrating through the first capping insulating layer 190 is formed on an outer region C3 of the first substrate 11, a mask layer 198 may be formed on a central region C1 and a guard ring region C2 of the first substrate 11, and a wet etching process may be performed, but the example embodiments are not limited thereto.

First, a circuit gate dielectric layer 22 and a circuit gate electrode 25 may be sequentially formed on the first substrate 11. The circuit gate dielectric layer 22 and the circuit gate electrode 25 may be formed using atomic layer deposition (ALD) or chemical vapor deposition (CVD), etc. The circuit gate dielectric layer 22 may be formed of silicon oxide, and the circuit gate electrode 25 may be formed of at least one of polysilicon or a metal silicide layer, but the example embodiments are not limited thereto. Next, spacer layers 24 and source/drain regions 30 may be formed on both sidewalls of the circuit gate dielectric layer 22 and the circuit gate electrode 25. According to at least one example embodiment, the spacer layer 24 may be formed of a plurality of layers. Next, the source/drain regions 30 may be formed by performing an ion implantation process.

Among the lower wiring structures, the circuit contact plugs 70 may be formed by partially forming the peripheral region insulating layer 90 and then removing a portion through partial etching, and by filling the resulting area with a conductive material. The circuit wiring lines 80 may be formed by depositing, for example, a conductive material and then patterning the conductive material.

The peripheral region insulating layer 90 may be formed of a plurality of insulating layers, but is not limited thereto. The peripheral region insulating layer 90 may be formed to cover the circuit elements and the lower wiring structures finally, by being partially formed in respective operations of forming the lower wiring structures and being partially formed on the uppermost circuit wiring line 80, but the example embodiments are not limited thereto.

Next, the second substrate 101 may be formed on the peripheral region insulating layer 90. The second substrate 101 may be formed of, for example, polycrystalline silicon, and may be formed by a CVD process, but the example embodiments are not limited thereto. The polycrystalline silicon forming the second substrate 101 may include impurities, but is not limited thereto. The second substrate 101 may be formed to have a size smaller than or equal to the first substrate 11, but is not limited thereto.

The first and second source sacrificial layers 111 and 112 and the second conductive layer 105 may be formed. The first source sacrificial layers 111 may be formed on and below the second source sacrificial layer 112. The first source sacrificial layer 111 may be formed of a material having etch selectivity with respect to the second source sacrificial layer 112. For example, the first source sacrificial layer 111 may be formed of silicon oxide, and the second source sacrificial layer 112 may be formed of silicon nitride, but the example embodiments are not limited thereto. The second conductive layer 105 may be formed of a semiconductor material, but is not limited thereto.

After removing a portion of the second substrate 101, portions of the first and second source sacrificial layers 111 and 112 and a portion of the second conductive layer 105, an insulating material may be formed in the resulting cell region CR and/or the peripheral region CT to form a lower insulating layer. Thereafter, a planarization process may be further performed using a chemical mechanical polishing (CMP) process, etc.

The first sacrificial insulating layers 180' may be partially replaced with the first gate electrodes 130 (see FIG. 2A) through a subsequent process. The first sacrificial insulating layers 180' may be formed of a material different from the first interlayer insulating layers 120, but is not limited thereto, and may be formed of a material that may be etched with etch selectivity for the first interlayer insulating layers 120 under specific etching conditions, etc. For example, the first interlayer insulating layers 120 may be formed of at least one of silicon oxide and silicon nitride, and the first sacrificial insulating layers 180' may be formed of a material which is selected from silicon, silicon oxide, silicon carbide and silicon nitride and which is a material different from that of the first interlayer insulating layers 120, but the example embodiments are not limited thereto. In at least one example embodiment, the first interlayer insulating layers 120 may not all have the same thickness, but is not limited thereto. The thickness of the first interlayer insulating layers 120 and the first sacrificial insulating layers 180' and the number of configured layers thereof may be variously changed from the illustrated thicknesses, etc.

The first insulating layers 170 may be formed of the same material as a material of the first interlayer insulating layers 120 at a height level corresponding to the first interlayer insulating layers 120, and the second insulating layers 180 may be formed of the same material as a material of the first sacrificial insulating layers 180' at a height level corresponding to the first sacrificial insulating layers 180', but the example embodiments are not limited thereto.

In the connection region CB of the second substrate 101, a photolithography process and an etching process on the first sacrificial insulating layers 180' may be repeatedly performed using a mask layer, such that upper first sacrificial insulating layers 180' extend shorter than lower first sacrificial insulating layers 180', but the example embodiments are not limited thereto. Accordingly, the first sacrificial insulating layers 180' may have a step shape and may provide pad regions.

In the peripheral region CT of the second substrate 101, a photolithography process and an etching process on the second insulating layers 180 may be repeatedly performed using a mask layer, such that upper second insulating layers 180 extend shorter than lower second insulating layers 180, but the example embodiments are not limited thereto. Accordingly, the second insulating layers 180 may have a step shape. The step shape of the first sacrificial insulating layers 180' and the step shape of the second insulating layers 180 may be formed in the same process operation, but are not limited thereto, and may be formed in different process operations, respectively.

The first vertical structure VS1 may be formed by performing an etching process, to penetrate through the first sacrificial insulating layers 180' and the first interlayer insulating layers 120 in the position corresponding to the first channel structures CH1 of FIG. 2A or 2B, but the example embodiments are not limited thereto. First, through-holes corresponding to the first channel structures CH1 of FIG. 2A may be formed. The through-holes may be formed to recess a portion of the second substrate 101. The first vertical structure VS1 may be formed in the through-holes. The first vertical structure VS1 may be formed of a semiconductor material such as polycrystalline silicon or single crystal silicon, but the example embodiments are not limited thereto.

The sacrificial vertical structure VS' may be formed on the outer region C3 of the first substrate 11. The sacrificial vertical structure VS' may be a configuration that forms part of an alignment key or overlay keys used for exposure processes in the outer region C3, but the example embodiments are not limited thereto. The outer region C3 of the first substrate 11 may be a region surrounding the guard ring region C2 outside of the guard ring region C2. The outer region C3 may be a scribe lane region. The scribe lane region corresponds to a region for performing a dicing process (e.g., a cutting process) in which a semiconductor wafer is separated into respective semiconductor chips after forming a semiconductor device on a semiconductor chip. The scribe lane region may be an region including an alignment key or overlay keys used in exposure processes performed to form the semiconductor device.

The mask layer 198 is formed on the central region C1 and the guard ring region C2 of the first substrate 110, and a wet etching process is performed to selectively remove a portion of the first capping insulating layer 190 with respect to the sacrificial vertical structure VS', on the outer region C3, but the example embodiments are not limited thereto. Accordingly, the sacrificial vertical structure VS' may protrude upwardly than the first capping insulating layer 190, on the outer region C3. Thereafter, the mask layer 198 may be removed.

Figure 15B:
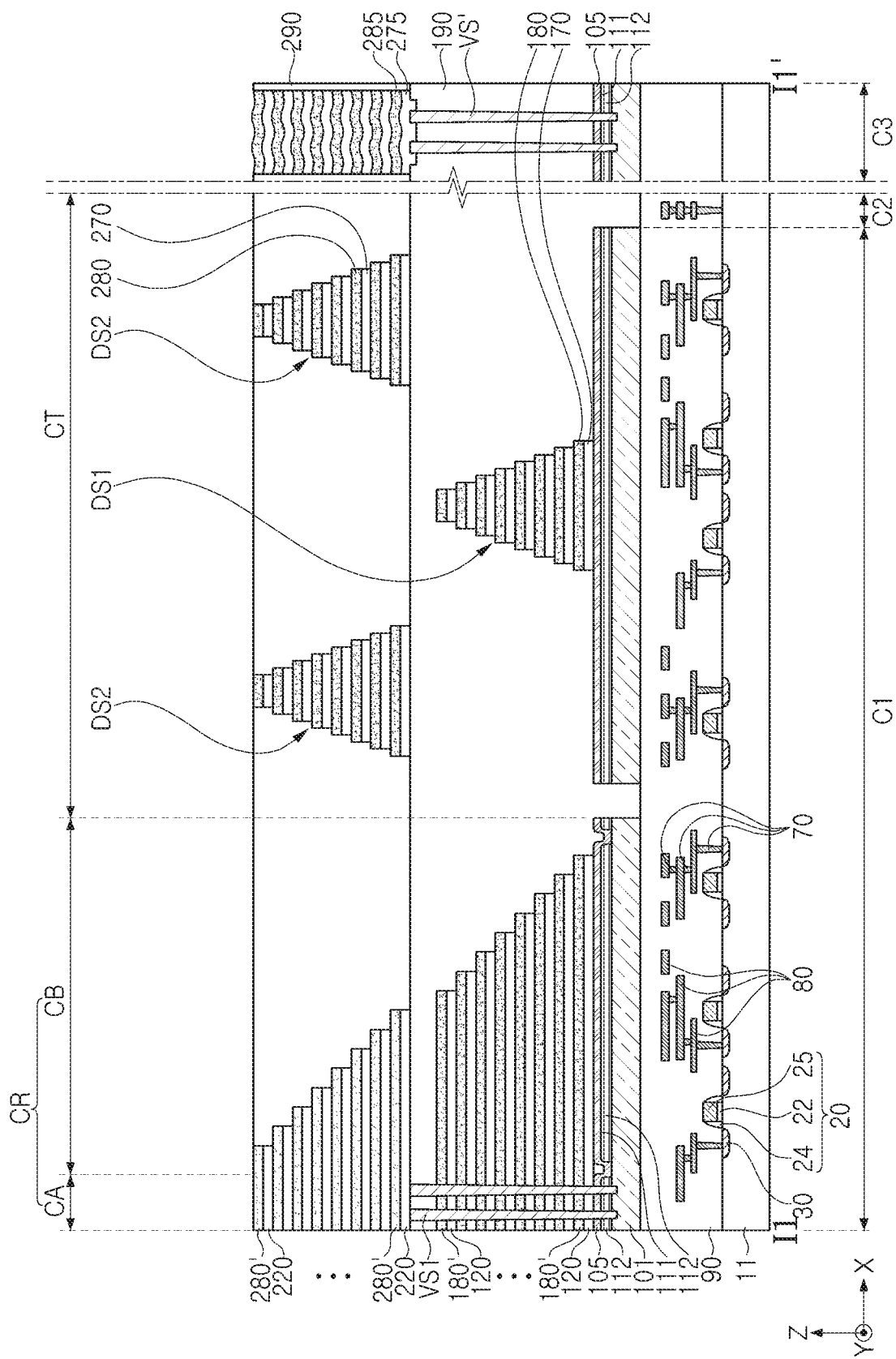

Referring to FIG. 15B, second sacrificial insulating layers 280' and second interlayer insulating layers 220 are alternately stacked, and third insulating layers 270 and fourth insulating layers 280 may be stacked alternately, but the example embodiments are not limited thereto. First outer insulating layers 275 and second outer insulating layers 285 may be alternately stacked on the sacrificial vertical structure VS' in the outer region C3 of the first substrate 11.

Second sacrificial insulating layers 280' may be layers that are partially replaced with second gate electrodes 230 (see FIG. 2A) through a subsequent process. The second sacrificial insulating layers 280' may be formed of a material different from the second interlayer insulating layers 220, and may be formed of a material that may be etched with etch selectivity for the second interlayer insulating layers 220 under specific etching conditions, but the example embodiments are not limited thereto. The second sacrificial insulating layers 280' may be formed of the same material as the first sacrificial insulating layers 180', and the second interlayer insulating layers 220 may be formed of the same material as the first interlayer insulating layers 120.

The third insulating layers 270 may be formed of the same material as the second interlayer insulating layers 220 at a height level corresponding to the second interlayer insulating layers 220 (e.g., on a same level), and the fourth insulating layers 280 may be formed of the same material as the second sacrificial insulating layers 280' at a height level corresponding to the second sacrificial insulating layers 280' (e.g., on a same level), but the example embodiments are not limited thereto.

In the connection region CB of the second substrate 101, a photolithography process and an etching process for the second sacrificial insulating layers 280' may be repeatedly performed using a mask layer, such that upper second sacrificial insulating layers 280' extend shorter than lower second sacrificial insulating layers 280', but the example embodiments are not limited thereto. Accordingly, the second sacrificial insulating layers 280' may have a step shape and pad regions may be provided.

In the peripheral region CT of the second substrate 101, the photolithography process and the etching process for the fourth insulating layers 280 may be repeatedly performed using a mask layer, such that upper fourth insulating layers 280 extend shorter than lower fourth insulating layers 280, but the example embodiments are not limited thereto. Therefore, the fourth insulating layers 280 may have a step shape. The step shape of the second sacrificial insulating layers 280' and the step shape of the fourth insulating layers 280 may be formed in the same process operation, but are not limited thereto, and may be respectively formed in different process operations.

The first outer insulating layers 275 may be formed of the same material as the third insulating layers 270 at a height level corresponding to the third insulating layers 270 (e.g., on a same level), and the second outer insulating layers 285 may be formed of the same material as the fourth insulating layers 280 at a height level corresponding to the fourth insulating layers 280 (e.g., on a same level).

The first outer insulating layers 275 and the second outer insulating layers 285 may be formed to have a curved shape on the sacrificial vertical structure VS' due to a structure in which the sacrificial vertical structure VS' protrudes further than the first capping insulating layer 190, but the example embodiments are not limited thereto. The first and second outer insulating layers 275 and 285 and the sacrificial vertical structure VS' may serve as an alignment key or an overlay key in the outer region C3.

In this operation, separate stopper layers may be formed on uppermost portions of the second sacrificial insulating layers 280' and the fourth insulating layers 280. The stopper layers stop the planarization process in a subsequent planarization process. The stopper layers may be removed after the planarization process.

Figure 15C:
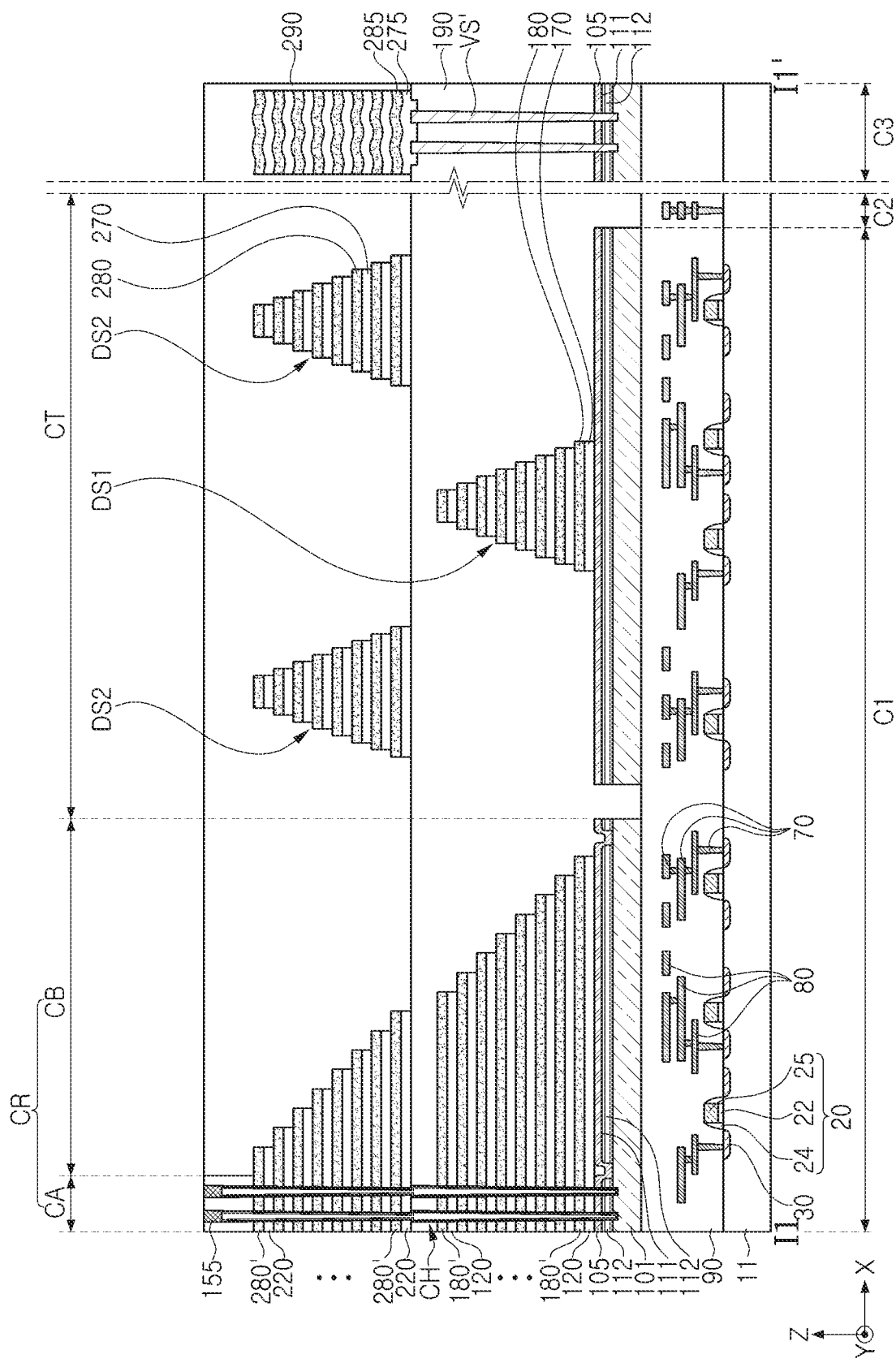

Referring to FIG. 15C, channel structures CH including first channel structures CH1 and second channel structures CH2 are formed, and a planarization process is performed to flatten the upper surface of the second capping insulating layer 290.

First, in a position corresponding to the channel structures CH of FIG. 2A, an etching process is performed in such a manner that a channel through-hole may be formed to penetrate through the upper stack structure, and then, the channel through-hole may be extended to a lower stack structure by removing the first vertical structure VS1, but the example embodiments are not limited thereto. Next, the channel structures CH may be formed by filling the channel through-holes. Sidewalls of the channel structures CH may not be perpendicular to the upper surface of the second substrate 101, but are not limited thereto. The channel structures CH may be formed to recess a portion of the second substrate 101. As illustrated in FIG. 2B, in the channel structures CH, a channel layer 140 and a channel insulating layer 150 may be formed. The channel layers 140 may be formed to have a uniform thickness using an ALD or CVD process, but the example embodiments are not limited thereto. The channel insulating layer 150 is formed to fill the inner spaces of the channel layers 140 and may be filled using an insulating material. However, according to at least one example embodiment, a space between the channel layers 140 may be filled with a conductive material other than the channel insulating layer 150.

The upper surface of the second capping insulating layer 290 may be flattened by performing a planarization process. During the planarization process, since the first and second dummy structures DS1 and DS2 are on the peripheral region CT of the second substrate 101, a dishing phenomenon in which the upper portion of the second capping insulating layer 290 is locally depressed downwardly toward the second substrate 101 may be significantly reduced.

Figure 15D:
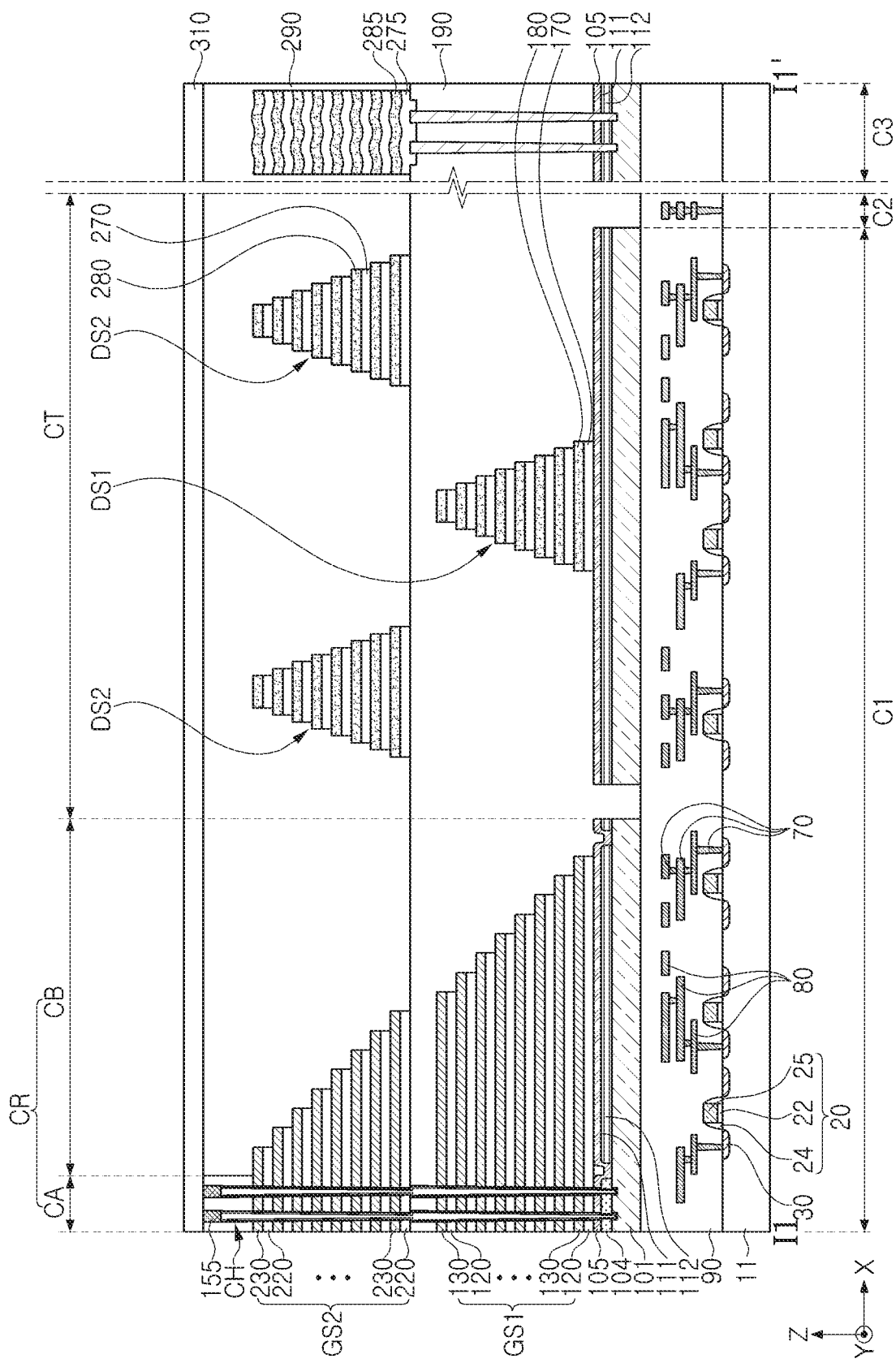

Referring to FIG. 15D, first and second gate electrodes 130 and 230 may be formed.

In regions corresponding to the separation structure MS (refer to FIG. 2B), openings penetrating through a stack structure of the first and second sacrificial insulating layers 180 and 280 and the first and second interlayer insulating layers 120 and 220 may be formed, and tunnel portions may be formed by partially removing the first and second sacrificial insulating layers 180 and 280 through the openings, but the example embodiments are not limited thereto. Before forming the separation structure MS, the first upper insulating layer 310 may be formed on the second capping insulating layer 290.

First, after separate sacrificial spacer layers are formed in the openings, the second source sacrificial layer 112 may be selectively removed, and then the first source sacrificial layers 111 may be removed. The first and second source sacrificial layers 111 and 112 may be removed by, for example, a wet etching process, but are not limited thereto. After forming the first conductive layer 104 by depositing a conductive material in the region from which the first and second source sacrificial layers 111 and 112 are removed, the sacrificial spacer layers may be removed from the openings. Next, the first and second gate electrodes 130 and 230 may be formed by filling the tunnel portions from which the first and second sacrificial insulating layers 110 and 120 are partially removed with a conductive material. The conductive material may include a metal, polycrystalline silicon, or metal silicide material, etc., but are not limited thereto. After the first and second gate electrodes 130 and 230 are formed, the conductive material deposited in the openings may be removed through an additional process, and then an insulating material may be filled.

Next, referring again to FIG. 2A, the second upper insulating layer 320 and the third upper insulating layer 330 are formed, and the gate contact plugs CP1, the channel contact plugs CP2, the through-contact plugs CV (refer to FIG. 7C), a guard ring structure GR, and upper wirings 355 may be formed, but the example embodiments are not limited thereto. The outer region C3 may be cut and removed.

The gate contact plugs CP1 may be formed to be electrically connected to the first and second gate electrodes 130 and 230 in the connection region CB, and the channel contact plugs CP2 may be formed to be electrically connected to the channel structures CH. Although not illustrated, a substrate contact plug that is electrically connected to the second substrate 101 may be formed, but the example embodiments are not limited thereto. The guard ring structure GR may penetrate through the first and second capping insulating layers 190 and 290, and the guard ring structure GR may be formed along the edge region 10eg of the semiconductor device 10, and may be formed to surround the internal structure. The guard ring structure GR may be formed by forming an opening penetrating through a portion of the peripheral insulating layer 90 and the first and second capping insulating layers 190 and 290 to expose the circuit wiring lines 80 and filling the opening with a conductive material, but the example embodiments are not limited thereto.

The gate contact plugs CP1, the channel contact plugs CP2, and the substrate contact plug are formed to have different depths, but may be formed contact holes at the same time using an etch stop layer and then filling the contact holes a conductive material, but the example embodiments are not limited thereto. However, in some example embodiments, some of the gate contact plugs CP1, the channel contact plugs CP2, and the substrate contact plug may also be formed in different process operations.

The upper contact plugs may be formed by forming the third upper insulating layer 330, removing a part through partial etching thereof, and filling the removed portion with a conductive material. The bit line 350 and the upper wirings 355 may be formed by depositing a conductive material and then patterning the conductive material, but the example embodiments are not limited thereto.

Next, the outer region C3 may be cut and removed in a process of separating the chip region.

Accordingly, the semiconductor device 10 of FIGS. 1 to 2B may be finally manufactured.

Figure 16A:
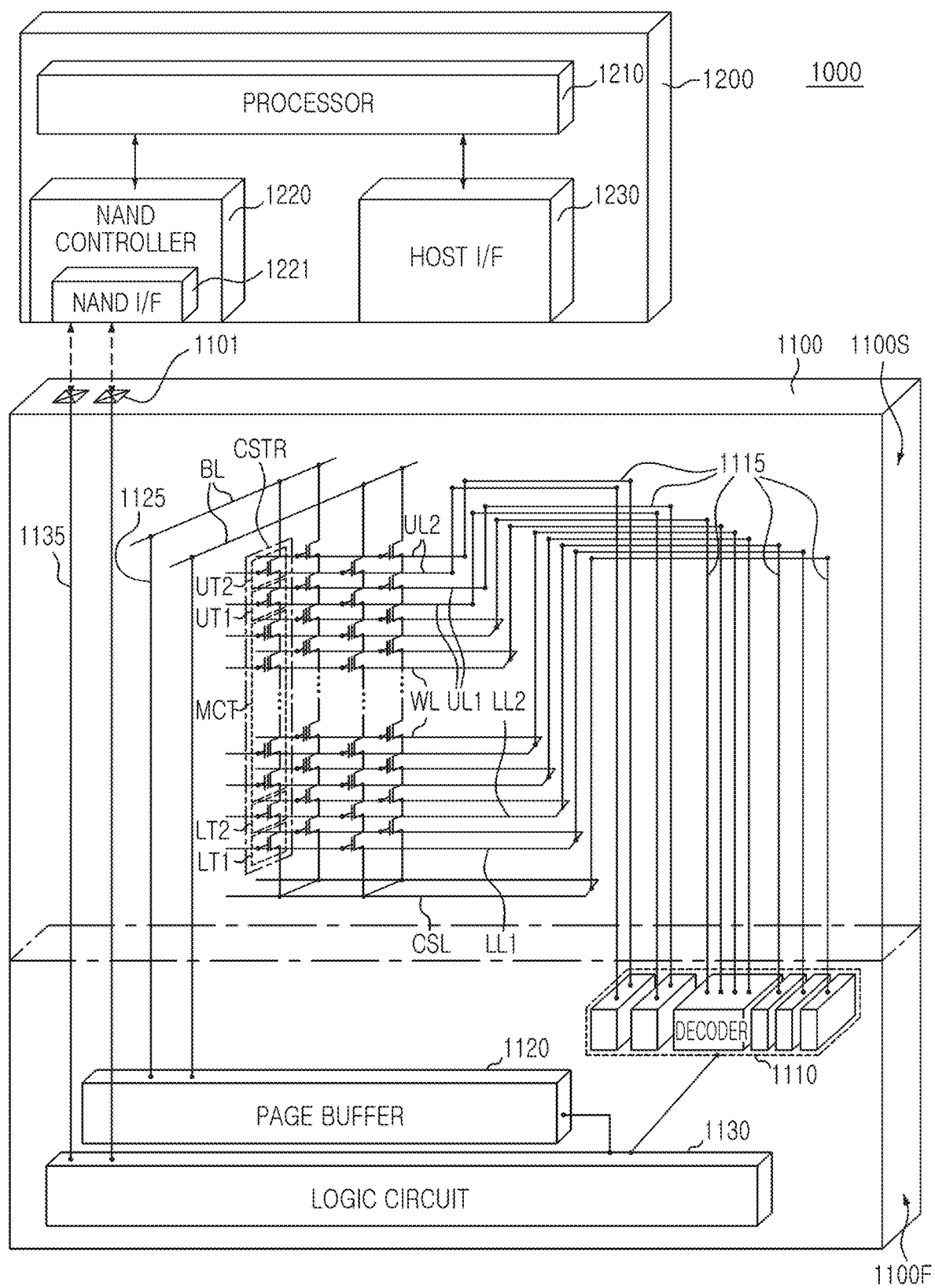
FIG. 16A is a schematic diagram of a data storage system including a semiconductor device according to at least one example embodiment.

FIG. 16A is a schematic diagram of a data storage system including a semiconductor device according to at least one example embodiment.

Referring to FIG. 16A, a data storage system 1000 according to at least one example embodiment may include a semiconductor device 1100 and a controller 1200 electrically connected to the semiconductor device 1100, but the example embodiments are not limited thereto. The data storage system 1000 may be a storage device including one or a plurality of semiconductor devices 1100 or may be an electronic device including a storage device, etc. For example, the data storage system 1000 may be a universal serial bus (USB) device, a computing system, a medical device, a communication device, and/or a solid state drive (SSD) device including one or a plurality of semiconductor devices 1100, etc., but the example embodiments are not limited thereto.

The semiconductor device 1100 may be a nonvolatile memory device, for example, a NAND flash memory device corresponding to one or more of the example embodiments of FIGS. 1 to 12, etc. The semiconductor device 1100 may include a first structure 110F and a second structure 1100S on the first structure 110F. In at least one example embodiment, the first structure 110F may also be next to the second structure 1100S. The first structure 110F may be a peripheral circuit structure including a decoder circuit 1110, a page buffer 1120, and/or a logic circuit 1130, but the example embodiments are not limited thereto. The second structure 1100S may be a memory cell structure including the bit line BL, the common source line CSL, the word lines WL, the first and second upper gate lines UL1 and UL2, the first and second lower gate lines s LL1 and LL2, and/or memory cell strings CSTR between the bit line BL and the common source line CSL, etc.

In the second structure 1100S, each of the memory cell strings CSTR may include lower transistors LT1 and LT2 adjacent to the common source line CSL, upper transistors UT1 and UT2 adjacent to the bit line BL, and/or a plurality of memory cell transistors MCT between the lower transistors LT1 and LT2 and the upper transistors UT1 and UT2, etc. The number of lower transistors LT1 and LT2 and the number of upper transistors UT1 and UT2 may be variously modified according to at least one example embodiment.

In at least one example embodiment, the upper transistors UT1 and UT2 may include a string selection transistor, and the lower transistors LT1 and LT2 may include a ground selection transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In at least one example embodiment, the lower transistors LT1 and LT2 may include a lower erase control transistor LT1 and a ground selection transistor LT2 connected in series, but are not limited thereto. The upper transistors UT1 and UT2 may include a string selection transistor UT1 and an upper erase control transistor UT2 connected in series, but are not limited thereto. At least one of the lower erase control transistor LT1 and the upper erase control transistor UT1 may be used for an erase operation of deleting data stored in the memory cell transistors MCT by using a gate induced leakage current (GIDL), but are not limited thereto.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the inside of the first structure 110F to the second structure 1100S, but the example embodiments are not limited thereto. The bit lines BL may be electrically connected to the page buffer 1120 through second connection wires 1125 extending from the first structure 110F to the second structure 1100S, but the example embodiments are not limited thereto.

In the first structure 110F, the decoder circuit 1110 and the page buffer 1120 may perform a control operation on at least one selected memory cell transistor among the plurality of memory cell transistors MCT, but the example embodiments are not limited thereto. The decoder circuit 1110 and the page buffer 1120 may be controlled by the logic circuit 1130, but are not limited thereto. The semiconductor device 1000 may communicate with the controller 1200 through an input/output pad 1101 electrically connected to the logic circuit 1130. The input/output pad 1101 may be electrically connected to the logic circuit 1130 through the input/output connection wiring 1135 extending from the inside of the first structure 110F to the second structure 1100S.

The controller 1200 may include a processor 1210, a NAND controller 1220, and a host interface 1230, etc. According to at least one example embodiment, the data storage system 1000 may include a plurality of semiconductor devices 1100, and in this case, the controller 1200 may control the plurality of semiconductor devices 1000.

The processor 1210 may control the overall operation of the data storage system 1000 including the controller 1200. The processor 1210 may operate according to a desired and/or predetermined firmware and/or desired and/or predetermined computer readable instructions stored on a non-transitory computer readable medium, and may access the semiconductor device 1100 by controlling the NAND controller 1220. The NAND controller 1220 may include a NAND interface 1221 that processes communication with the semiconductor device 1100. Through the NAND interface 1221, a control command for controlling the semiconductor device 1100, data to be written to the memory cell transistors MCT of the semiconductor device 1100, data to be read from memory cell transistors MCT of the semiconductor device 1100, and the like may be transmitted. The host interface 1230 may provide a communication function between the data storage system 1000 and at least one external host, etc. When a control command is received from an external host through the host interface 1230, the processor 1210 may control the semiconductor device 1100 in response to the control command.

Figure 16B:
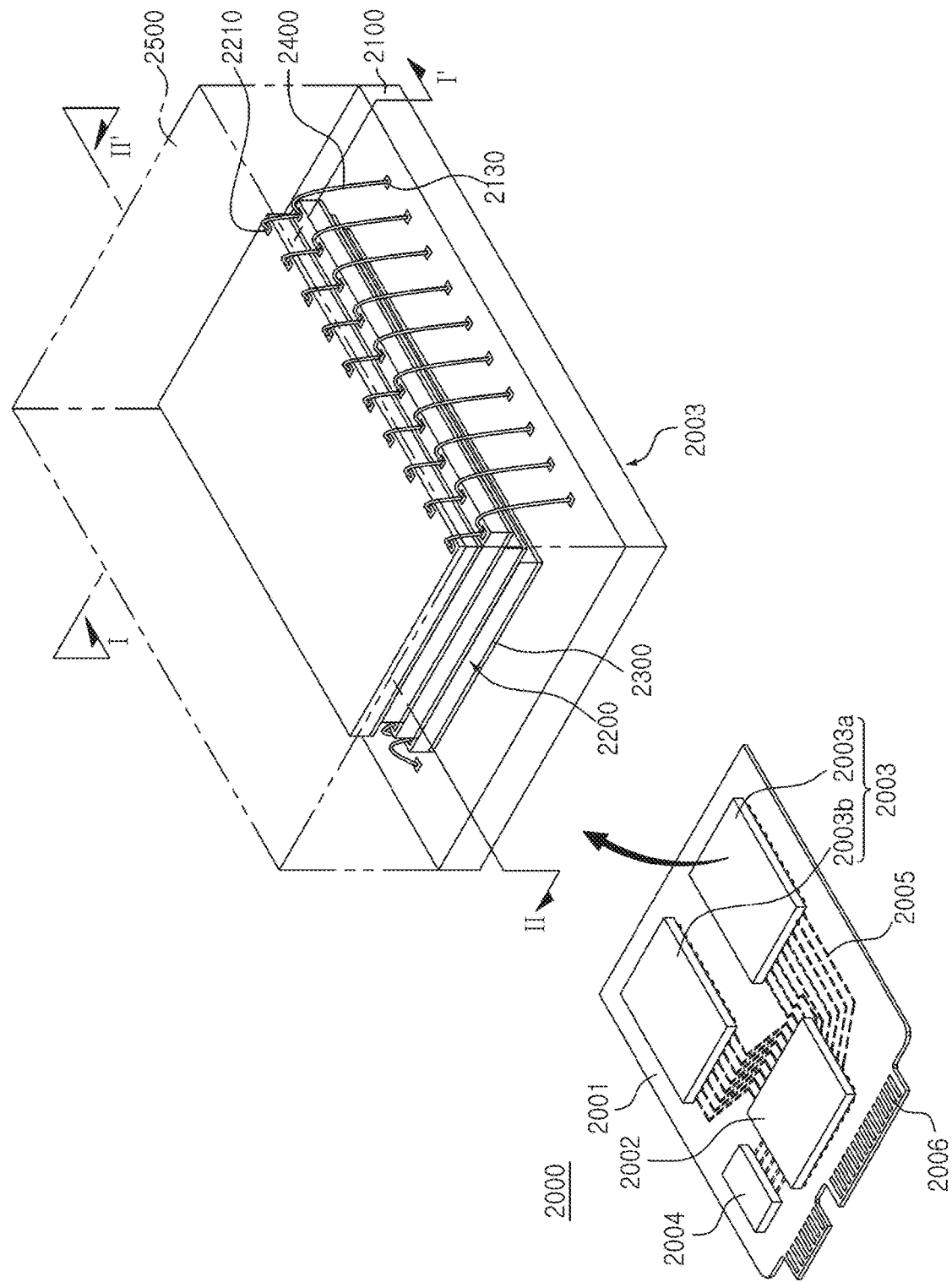
FIG. 16B is a schematic perspective view of a data storage system including a semiconductor device according to at least one example embodiment.

FIG. 16B is a schematic perspective view of a data storage system including semiconductor devices according to at least one example embodiment.

Referring to FIG. 16B, a data storage system 2000 according to at least one example embodiment may include a main substrate 2001, a controller 2002 mounted on the main substrate 2001, one or more semiconductor packages 2003, and/or a DRAM 2004, etc., but the example embodiments are not limited thereto. The semiconductor package 2003 and the DRAM 2004 may be connected to the controller 2002 by wiring patterns 2005 formed on the main substrate 2001.

The main substrate 2001 may include at least one connector 2006 including a plurality of pins coupled to at least one external host. The number and arrangement of the plurality of pins in the at least one connector 2006 may vary according to a communication interface between the data storage system 2000 and the at least one external host. In at least one example embodiment, the data storage system 2000 may communicate with the at least one external host according to any one of the interfaces, such as Universal Serial Bus (USB), Peripheral Component Interconnect Express (PCI-Express), Serial Advanced Technology Attachment (SATA), M-Phy for Universal Flash Storage (UFS), and the like, but are not limited thereto. In at least one example embodiment, the data storage system 2000 may be operated by power supplied from an external host through the connector 2006, etc. The data storage system 2000 may further include a Power Management Integrated Circuit (PMIC) that distributes power supplied from the external host, to the controller 2002 and the semiconductor package 2003, etc.

The controller 2002 may write data to the semiconductor package 2003 or read data from the semiconductor package 2003, and may improve the operating speed of the data storage system 2000.

The DRAM 2004 may be a buffer memory for reducing a speed difference between the semiconductor package 2003, which is a data storage space, and an external host, but the example embodiments are not limited thereto. The DRAM 2004 included in the data storage system 2000 may also operate as a type of cache memory, and may provide a space for temporarily storing data in a control operation on the semiconductor package 2003, etc. When the DRAM 2004 is included in the data storage system 2000, the controller 2002 may further include a DRAM controller for controlling the DRAM 2004 in addition to the NAND controller for controlling the semiconductor package 2003, but the example embodiments are not limited thereto.

The semiconductor package 2003 may include, for example, first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 on respective lower surfaces of the semiconductor chips 2200, a connection structure 2400 electrically connecting the semiconductor chips 2200 and the package substrate 2100, and a molding layer 2500 covering the semiconductor chips 2200 and the connection structure 2400, on the package substrate 2100, but the example embodiments are not limited thereto.

The package substrate 2100 may be a printed circuit board including package upper pads 2130. Each semiconductor chip 2200 may include an input/output pad 2210. The input/output pad 2210 may correspond to the input/output pad 1101 of FIG. 16A. Each of the semiconductor chips 2200 may include the semiconductor device described above with reference to at least one of FIGS. 1 to 12.

In at least one example embodiment, the connection structure 2400 may be a bonding wire electrically connecting the input/output pad 2210 and the package upper pads 2130, but the example embodiments are not limited thereto. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100, etc. According to at least one example embodiment, in each of the first and second semiconductor packages 2003a and 2003b, the semiconductor chips 2200 may also be electrically connected to each other by a connection structure including a through silicon via (TSV), instead of the bonding wire type connection structure 2400, etc.

In at least one example embodiment, the controller 2002 and the semiconductor chips 2200 may be included in one package. In at least one example embodiment, the controller 2002 and the semiconductor chips 2200 are mounted on a separate interposer substrate different from the main substrate 2001, and the controller 2002 and the semiconductor chips 2200 may be connected to each other by wiring formed on the interposer substrate.

FIG. 17 is a schematic cross-sectional view of semiconductor packages according to at least one example embodiment. FIG. 17 illustrates an example of the semiconductor package 2003 of FIG. 16B, and conceptually illustrates a region cut along the line I-I' of the semiconductor package 2003 of FIG. 16B.

Referring to FIG. 17, in the semiconductor package 2003, the package substrate 2100 may be a printed circuit board. The package substrate 2100 may include a package substrate 2100, a package substrate body portion 2120, package upper pads 2130 on the upper surface of the package substrate body portion 2120, lower pads 2125 on the lower surface of the package substrate body portion 2120 or exposed through the lower surface thereof, and internal wirings 2135 electrically connecting the upper pads 2130 and the lower pads 2125 inside the package substrate body portion 2120, but is not limited thereto. The upper pads 2130 may be electrically connected to the connection structures 2400. The lower pads 2125 may be connected to the wiring patterns 2005 of the main substrate 2010 of the data storage system 2000 as illustrated in FIG. 10B, through conductive connection portions 2800.

As illustrated in the enlarged view, each of the semiconductor chips 2200 may include a peripheral circuit region PERI including a first substrate 11 and circuit wiring lines, and a memory cell region CELL which includes a second substrate (or a common source line) 101, memory stacked structures GS1 and GS2 on the second substrate 101, channel structures CH and separation structures MS (see FIG. 2B) penetrating through the memory stacked structures GS1 and GS2, bit lines 350 electrically connected to the channel structures CH, and gate contact plugs CP1 and upper wirings 355 electrically connected to the word lines (e.g., WL of FIG. 16A) of the memory stacked structures GS1 and GS2, but the example embodiments are not limited thereto. Each of the semiconductor chips 2200 may further include a first dummy structure DS1 and a second dummy structure DS2 that do not overlap each other in a vertical direction, as illustrated in the enlarged view, but the example embodiments are not limited thereto.

Each of the semiconductor chips 2200 may further include an input/output (I/O) connection wiring electrically, connected to circuit elements (e.g., 20 in FIG. 2A) and circuit wiring lines (e.g., 80 in FIG. 2A) in the peripheral circuit region PERI, and extending into the peripheral circuit region PERI, and an input/output pad 2210 electrically connected to the I/O connection wiring. Each of the semiconductor chips 2200 may further include upper insulating layers 410 and 420. The input/output connection wiring penetrates through the upper insulating layers 310, 320, 330 and 410, capping insulating layers 190 and 290, and the second substrate 101, below the input/output pad 2210, to extend into the peripheral circuit region PERI, but the example embodiments are not limited thereto.

The semiconductor chips 2200 of FIG. 17 may be electrically connected to each other by connection structures 2400 in the form of bonding wires, but are not limited thereto. However, in at least one example embodiment, semiconductor chips in a single semiconductor package, such as the semiconductor chips 2200 of FIG. 17, may also be electrically connected to each other by a connection structure including a through silicon via (TSV), etc.

Figure 18:
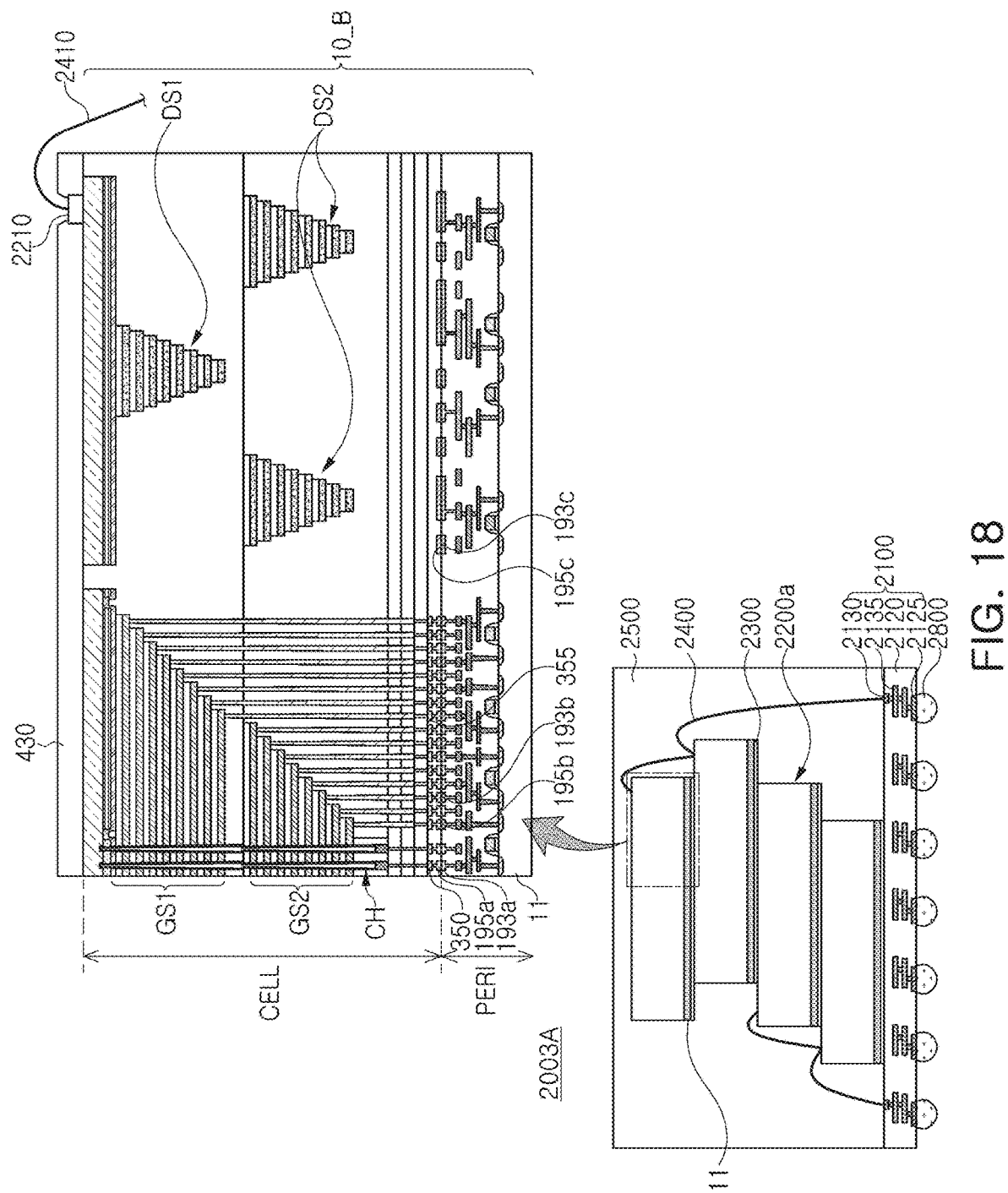
FIG. 18 is a schematic cross-sectional view illustrating semiconductor packages according to at least one example embodiment.

Referring to FIG. 18, in a semiconductor package 2003A, each of the semiconductor chips 2200a may include a peripheral circuit region PERI including a first substrate 11 and circuit wiring lines, and a memory cell region CELL that includes a second substrate 101, memory stack structures GS1 and GS2 on the second substrate 101, channel structures CH and separation structures MS (see FIG. 2B) penetrating through the memory stack structures GS1 and GS2, bit lines 350 electrically connected to the channel structures CH, and gate contact plugs CP and upper wirings 355 electrically connected to the word lines WL (see FIG. 16A) of the memory stack structures GS1 and GS2, but the example embodiments are not limited thereto. The peripheral circuit region PERI may further include lower bonding structures 193a, 193b and 193c, and the cell region CELL may further include upper bonding structures 195a, 195b and 195c, etc.

The upper bonding structures 195a and 195b may include the first upper bonding structure 195a electrically connected to the channel structures CH, and the second upper bonding structure 195b electrically connected to the word lines (e.g., WL in FIG. 16A) of the memory stack structures GS1 and GS2. The lower structures 193a and 193b may include the first lower bonding structure 193a bonded to the first upper bonding structure 195a and electrically connected to the circuit elements 20 of the peripheral circuit region PERI, and the second lower bonding structure 193b bonded to the second upper bonding structure 195b and electrically connected to the circuit elements 20 of the peripheral circuit region PERI, but the example embodiments are not limited thereto.

The lower bonding structures 193a and 193b of the peripheral circuit region PERI and the upper bonding structures 195a and 195b of the cell region CELL may be bonded while contacting each other. Bonded portions of the lower bonding structures 193a and 193b and the upper bonding structures 195a and 195b may be formed of, for example, copper (Cu), but are not limited thereto.

As illustrated in the enlarged view, the memory cell region CELL may further include a first dummy structure DS1 and a second dummy structure DS2 that do not overlap in the vertical direction Z, but is not limited thereto. Each of the semiconductor chips 2200a may further include an input/output pad 2210 formed in the upper insulating layer 430, and an input/output connection wiring below the input/output pad 2210. The input/output connection wiring may be electrically connected to a portion of the bonding structures 193c and 195c.

The semiconductor chips 2200 of FIG. 17 and the semiconductor chips 2200a of FIG. 18 may be electrically connected to each other by the connection structures 2400 in the form of bonding wires, but the example embodiments are not limited thereto. However, in at least one example embodiment, semiconductor chips in a single semiconductor package, such as the semiconductor chips 2200 of FIG. 17 and/or the semiconductor chips 2200a of FIG. 18, may also be electrically connected to each other by a connection structure including the through silicon via (TSV), etc.

As set forth above, in a semiconductor device according to at least one example embodiment, a dummy structure may be spaced apart from a stack structure included in a memory cell, and a lower first dummy structure and an upper second dummy structure may be arranged so as to not overlap in a vertical direction, thereby providing a semiconductor device having improved reliability and a data storage system having the same.

While various example embodiments have been illustrated and described above, it will be apparent to one of ordinary skill in the art that modifications and variations could be made without departing from the scope of the inventive concepts as defined by the appended claims.

What is claimed is:

1. A semiconductor device comprising:
a peripheral circuit region including a first substrate and a plurality of circuit elements on the first substrate; and
at least one memory cell region on the peripheral circuit region,
wherein the at least one memory cell region includes:
a second substrate on the peripheral circuit region;
a memory stack structure including a first stack structure and a second stack structure, the first stack structure including a plurality of first gate electrodes and a plurality of first interlayer insulating layers alternately stacked over the second substrate, and the second stack structure including a plurality of second gate electrodes and a plurality of second interlayer insulating layers alternately stacked above the first stack structure, so as to be farther away from the second substrate than the first stack structure in a vertical direction;
a plurality of channel structures vertically penetrating through the memory stack structure and connected to the second substrate, the plurality of channel structures each including a respective channel layer;
at least one first dummy structure over the second substrate, the at least one first dummy structure spaced apart from at least one side of the first stack structure, and the at least one first dummy structure including a plurality of first insulating layers and a plurality of second insulating layers alternately stacked;
at least one second dummy structure over the at least one first dummy structure, so as to be farther away from e second substrate than the first dummy structure in the vertical direction, the at least one second dummy structure spaced apart from at least one side of the second stack structure, the at least one second dummy structure including a plurality of third insulating layers and a plurality of fourth insulating layers alternately stacked;
at least a portion of the at least one first dummy structure does not overlap the at least one second dummy structure in the vertical direction; and
wherein
the plurality of second insulating layers are located at height levels corresponding to height levels of the plurality of first gate electrodes, respectively,
the plurality of second insulating layers are formed of a material different from a material of the plurality of first gate electrodes,
the plurality of fourth insulating layers are located at height levels corresponding to height levels of the plurality of second gate electrodes, respectively,
the plurality of fourth insulating layers are formed of a material different from a material of the plurality of second gate electrodes, and
wherein the second dummy structure shares no surface with the first stack structure and the second stack structure.

2. The semiconductor device of claim 1, wherein an uppermost second insulating layer among the plurality of second insulating layers of the at least one first dummy structure does not overlap the at least one second dummy structure in the vertical direction.

3. The semiconductor device of claim 1, wherein at least a portion of a surface of at least one side of the at least one first dummy structure does not overlap the at least one second dummy structure in the vertical direction.

4. The semiconductor device of claim 1, wherein the at least one first dummy structure and the at least one second dummy structure include a plurality of steps having a staircase shape, and
wherein an uppermost step of the plurality of steps of the at least one first dummy structure does not overlap a lowermost step of the plurality of steps of the at least one second dummy structure in the vertical direction.

5. The semiconductor device of claim 4, wherein a lowermost step of the plurality of steps of the at least one first dummy structure does not overlap the lowermost step of the plurality of steps of the at least one second dummy structure in the vertical direction.

6. The semiconductor device of claim 1, wherein side surfaces of the at least one first dummy structure and the at least one second dummy structure are inclined with respect to an upper surface of the second substrate.

7. The semiconductor device of claim 1, further comprising:
a plurality of through-contact plugs penetrating through the second substrate and at least one of the at least one first dummy structure and the at least one second dummy structure, and the plurality of through-contact plugs are electrically connected to the plurality of circuit elements of the peripheral circuit region; and
a guard ring structure adjacent to an edge region of the semiconductor device, the guard ring structure surrounding the first and second stack structures and the at least one first dummy structure and the at least one second dummy structure, the guard ring structure penetrating through first and second capping insulating layers, and the guard ring structure connected to the first substrate.

8. The semiconductor device of claim 1, wherein the at least one first dummy structure is a plurality of first dummy structures, and
wherein the at least one second dummy structure is a plurality of second dummy structures.

9. The semiconductor device of claim 8, wherein a number of the plurality of second dummy structures is greater than a number of the plurality of first dummy structures.

10. The semiconductor device of claim 8, wherein a number of the plurality of first dummy structures is greater than a number of the plurality of second dummy structures.

11. A semiconductor device comprising:
a peripheral circuit region including a first substrate and a plurality of circuit elements provided on the first substrate;
a second substrate on the peripheral circuit region;
a memory cell structure on the second substrate; and
a dummy structure on at least one side of the memory cell structure, the dummy structure on the second substrate,
wherein the memory cell structure includes:
a first stack structure including a plurality of first gate electrodes and a plurality of first interlayer insulating layers alternately stacked over the second substrate;
a second stack structure including a plurality of second gate electrodes and a plurality of second interlayer insulating layers alternately stacked above the first stack structure, so as to be farther away from the second substrate than the first stack structure in a vertical direction; and
a plurality of channel structures penetrating through the first stack structure and the second stack structure, the plurality of channel structures connected to the second substrate, and
wherein the dummy structure includes:
a first dummy structure over the second substrate, the first dummy structure spaced apart from the first stack structure, and the first dummy structure including a plurality of first insulating layers and a plurality of second insulating layers alternately stacked; and
a second dummy structure over the second substrate, so as to be farther way from the second substrate than the first dummy structure in the vertical direction, the second dummy structure spaced apart from the second stack structure and the first dummy structure, the second dummy structure including a plurality of third insulating layers and a plurality of fourth insulating layers alternately stacked,
wherein a central axis between side surfaces of the second dummy structure is shifted from a central axis between side surfaces of the first dummy structure in at least one direction parallel to an upper surface of the second substrate, and wherein
the plurality of second insulating layers are located at height levels corresponding to height levels of the plurality of first gate electrodes, respectively,
the plurality of fourth insulating layers are located at height levels corresponding to height levels of the plurality of second gate electrodes, and
the first dummy structure is spaced apart from the second stack structure, and the second dummy structure is spaced apart from the first stack structure.

12. The semiconductor device of claim 11, wherein an upper surface of the first dummy structure does not face a bottom surface of the second dummy structure.

13. The semiconductor device of claim 11, wherein the first dummy structure does not overlap the second dummy structure in the vertical direction.

14. The semiconductor device of claim 11, further comprising:
a first capping insulating layer covering the first stack structure and the first dummy structure; and
a second capping insulating layer covering the second stack structure and the second dummy structure, and
wherein an upper surface of the first dummy structure overlaps the second capping insulating layer in a vertical direction.

15. The semiconductor device of claim 11, wherein each of the first dummy structure and the second dummy structure includes a plurality of steps having a staircase shape, and
wherein an uppermost step of the first dummy structure does not overlap a lowermost step of the second dummy structure in a vertical direction.

16. The semiconductor device of claim 11, wherein the central axis of the first dummy structure and the central axis of the second dummy structure are spaced apart from a central axis between side surfaces of the memory cell structure at different distances.

17. The semiconductor device of claim 11, wherein the second insulating layers and the first gate electrodes have a same thickness at corresponding height levels, and
wherein the fourth insulating layers and the second gate electrodes have a same thickness at a same height level.

18. The semiconductor device of claim 11, wherein each of the plurality of first insulating layers and the plurality of second insulating layers includes a first portion and a second portion, the second portion extending from the first portion, and
wherein each of the second portions includes a downward portion bent towards the first substrate.

19. A data storage system comprising:
a semiconductor storage device including a peripheral circuit region including a first substrate and circuit elements provided on the first substrate, a second substrate on the peripheral circuit region, a memory cell structure on the second substrate, a dummy structure on at least one side of the memory cell structure and on the second substrate; and
a controller electrically connected to the semiconductor storage device through an input/output pad and controlling the semiconductor storage device,
wherein the memory cell structure includes:
a first stack structure including a plurality of first gate electrodes and a plurality of first interlayer insulating layers alternately stacked over the second substrate;

a second stack structure including a plurality of second gate electrodes and a plurality of second interlayer insulating layers alternately stacked over the first stack structure so as to be farther away from the second substrate than the first stack structure in a vertical direction; and a plurality of channel structures penetrating through the first stack structure and the second stack structure, the plurality of channel structures connected to the second substrate, wherein the dummy structure includes:
- a first dummy structure spaced apart from the first stack structure and over the second substrate, the first dummy structure including a plurality of first insulating layers and a plurality of second insulating layers alternately stacked; and
- a second dummy structure over the second substrate so as to be farther away from the second substrate than the first stack structure in the vertical direction, the second dummy structure spaced apart from the second stack structure and the first dummy structure, the second dummy structure including a plurality of third insulating layers and a plurality of fourth insulating layers alternately stacked, and wherein a central axis between side surfaces of the second dummy structure is shifted from a central axis between side surfaces of the first dummy structure in at least one direction parallel to an upper surface of the second substrate, the plurality of second insulating layers are located at height levels corresponding to height levels of the plurality of first gate electrodes, respectively, the plurality of second insulating layers are formed of a material different from a material of the plurality of first gate electrodes, the plurality of fourth insulating layers are located at height levels corresponding to height levels of the plurality of second gate electrodes, respectively, the plurality of fourth insulating layers are formed of a material different from a material of the plurality of second gate electrodes, and wherein the second dummy structure shares no surface with the first stack structure and the second stack structure.

20. The data storage system of claim 19, wherein the first dummy structure and the second dummy structure of the semiconductor storage device do not overlap in the vertical direction.

* * * * *